(12) United States Patent
Sahin et al.

(10) Patent No.: US 12,418,311 B2
(45) Date of Patent: Sep. 16, 2025

(54) METHODS, APPARATUS AND SYSTEMS FOR REDUCED COMPLEXITY POLAR CODES BASED ON MODIFIED CYCLIC-REDUNDANCY-CHECK (CRC) PROCEDURES

(71) Applicant: InterDigital Patent Holdings, Inc., Wilmington, DE (US)

(72) Inventors: Onur Sahin, London (GB); Ahmet Serdar Tan, London (GB); Sungkwon Hong, Dongjak-gu (KR)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 18/270,633

(22) PCT Filed: Jan. 10, 2022

(86) PCT No.: PCT/US2022/011794
§ 371 (c)(1),
(2) Date: Jun. 30, 2023

(87) PCT Pub. No.: WO2022/150692
PCT Pub. Date: Jul. 14, 2022

(65) Prior Publication Data
US 2024/0063815 A1 Feb. 22, 2024

Related U.S. Application Data

(60) Provisional application No. 63/135,854, filed on Jan. 11, 2021.

(51) Int. Cl.
*H03M 13/13* (2006.01)
*H03M 13/09* (2006.01)
*H03M 13/29* (2006.01)

(52) U.S. Cl.
CPC .................. *H03M 13/09* (2013.01)

(58) Field of Classification Search
CPC ...................................... H03M 13/09
See application file for complete search history.

(56) References Cited

U.S. PATENT DOCUMENTS 10,742,350 B2 * 8/2020 Jang ............... H04L 1/0013
2018/0287738 A1 * 10/2018 Xu ................. H04L 1/0064
(Continued)

FOREIGN PATENT DOCUMENTS

WO WO-2018175557 A1 * 9/2018 ............ H03M 13/05
WO WO 2020160172 A1 8/2020

OTHER PUBLICATIONS

Zhou, Huayi, et al., "Segmented CRC-Aided SC List Polar Decoding", 2016 IEEE 83rd Vehicular Technology Conference (VTC Spring), IEEE, May 16, 2016. 5 pages.
(Continued)

*Primary Examiner* — Albert Decady
*Assistant Examiner* — Grace V Braden
(74) *Attorney, Agent, or Firm* — Jamie T. Nguyen

(57) ABSTRACT

In certain representative embodiments, methods, apparatus and systems are provided for the selection of component codes for input as cyclic redundancy check (CRC) bits during polar encoding. The component polar codes and particular encoded bits in these component codes that will be used in CRC calculation can be selected. A CRC calculation may be performed based on the component codes and the selected encoded bits. The calculated CRC bits may be appended to a header part of the input bits of the polar encoder. Polar encoding may then be performed using the input bits which include the calculated CRC bits appended thereto. For example, the polar encoding may skip encoding levels used in accordance with the component code selec-
(Continued)

─1900

POLAR ENCODING A PLURALITY OF INFORMATION BITS AND ONE OR MORE CYCLIC REDUNDANCY CHECK (CRC) BITS ACCORDING TO A CODE CONSTRUCTION OF THE PLURALITY OF INFORMATION BITS AND THE ONE OR MORE CRC BITS, WHEREIN THE ONE OR MORE CRC BITS ARE DETERMINED USING A PLURALITY OF OUTPUT BITS OF ONE OR MORE COMPONENT POLAR CODES OF THE POLAR ENCODING
1902

SENDING A CHANNEL TRANSMISSION INCLUDING INFORMATION INDICATING THE POLAR ENCODED INFORMATION BITS AND CRC BITS
1904 tion. The polar encoding may have improved complexity and/or latency characteristics. In certain representative embodiments, methods, apparatus and systems are provided for polar decoding having improved complexity and/or latency characteristics.

20 Claims, 27 Drawing Sheets

(56) References Cited

U.S. PATENT DOCUMENTS

| | | | | |
|---|---|---|---|---|
| 2018/0367239 | A1* | 12/2018 | Jang | H04L 1/0013 |
| 2020/0021393 | A1* | 1/2020 | Noh | H04L 1/0045 |
| 2022/0116135 | A1* | 4/2022 | Jang | H03M 13/618 |
| 2022/0182271 | A1* | 6/2022 | Shin | H04L 27/2639 |

OTHER PUBLICATIONS

Zhou et al.; "Segmented Successive Cancellation List Polar Decoding with Tailored CRC", [1] arXiv:1803.00521 [eess.SP] Feb. 22, 2018, 14 pages.
Erdal Arikan, Systematic Polar Coding, IEEE Communications Letters, vol. 15, No. 8, Aug. 2011, 3 pages.
Niu, Kai, et al., "CRC-Aided Decoding of Polar Codes", IEEE Communications Letters, vol. 16, No. 10, Oct. 2012, pp. 1668-1671.
Third Generation Partnership Project (3GPP): "Technical Specification Group Radio Access Network; NR; Multiplexing and channel coding (Release 15)," 3GPP TS 38.212 V15.0.0 (Dec. 2017).
Sarkis, Gabi et al, "Fast Polar Decoders: Algorithm and Implementation", IEEE J. Sel. Areas Commun., vol. 32, No. 5, pp. 946-957, May 2014.
"A Comparative Study of Polar Code Constructions for the AWGN Channel," arXiv:1501.02473v1 [cs.IT] (Jan. 11, 2015).
Hashemi et al.; "Fast and Flexible Successive-Cancellation List Decoders for Polar Codes", IEEE Transactions on Signal Processing, vol. 65, No. 21, Nov. 1, 2017, 14 pages.
Tai, et. al. "List Decoding of Polar Codes", arXiv:1206.0050v1, May 31, 2012, pp. 1-11.
Chen et al.; "Distributing CRC Bits to Aid Polar Decoding", IEEE Global Communication Conference, Singapore, Dec. 2017, 6 pages.
"Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.
Hashemi et al.: "Decoder Partitioning: Towards practical List Decoding of Polar Codes", IEEE Transactions on Communications, vol. 66, No. 9, Sep. 2018, 11 pages.
"Resolving Polar Code Memory Complexity Issue", 3GPP Tdoc RI-1609338, 3GPP TSG RAN WG1 Meeting #86bis, Lisbon, Portugal, Oct. 10-14, 2016, 5 pages.
Vangala et al.; "Efficient Algorithms for Systematic Polar encoding", IEEE Communications Letters, vol. 20, No. 1, Jan. 2016, 4 pages.

* cited by examiner

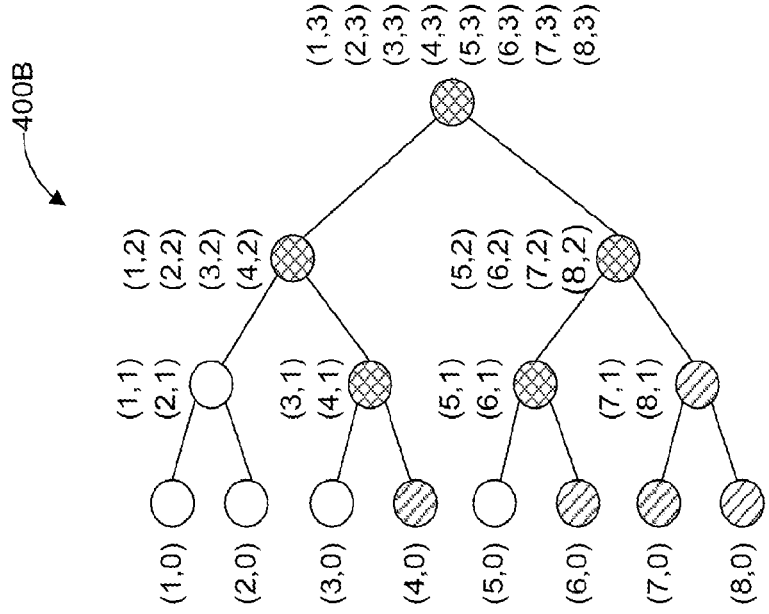
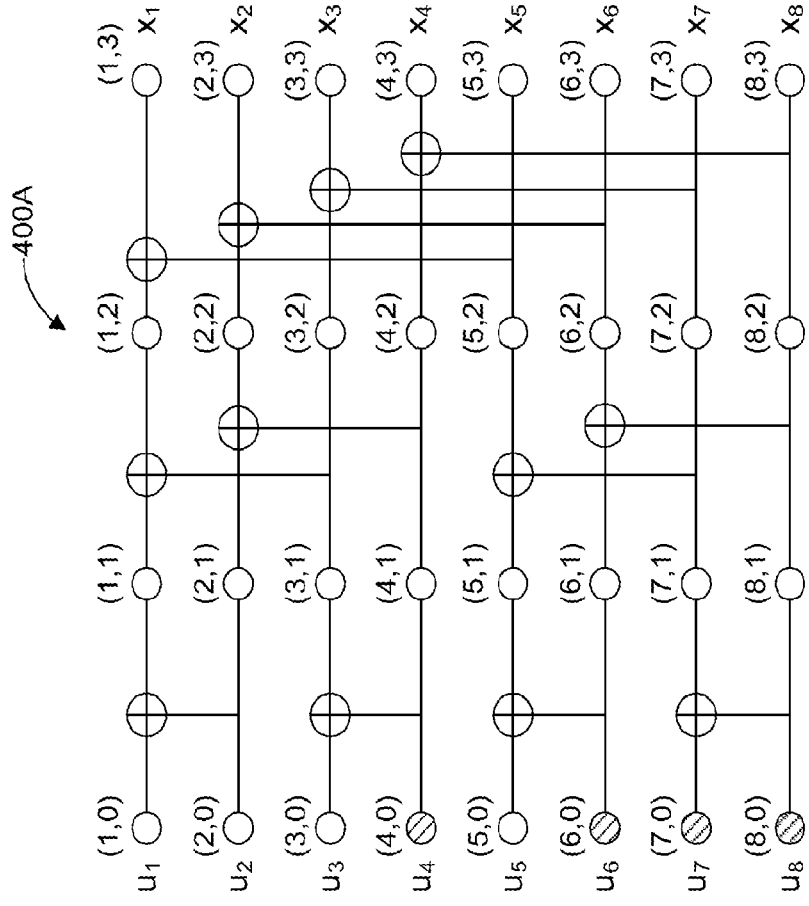
FIG. 4B (b) Decoder Tree
FIG. 4A (a) Graph

METHODS, APPARATUS AND SYSTEMS FOR REDUCED COMPLEXITY POLAR CODES BASED ON MODIFIED CYCLIC-REDUNDANCY-CHECK (CRC) PROCEDURES This application is a U.S. National Stage Application under 35 U.S.C. § 371 of International Patent Application No. PCT/US2022/011794, filed Jan. 10, 2022, which claims the benefit of U.S. Provisional Application No. 63/135,854, filed Jan. 11, 2021 which is incorporated herein by reference.

FIELD

Embodiments disclosed herein generally relate to wireless communications and, for example to methods, apparatus and systems for reduced complexity polar codes based on modified cyclic-redundancy-check procedures.

BRIEF DESCRIPTION OF THE DRAWINGS

A more detailed understanding may be had from the detailed description below, given by way of example in conjunction with drawings appended hereto. Figures in the description, are examples. As such, the Figures and the detailed description are not to be considered limiting, and other equally effective examples are possible and likely. Furthermore, like reference numerals in the figures indicate like elements, and wherein:

FIG. 4A is a diagram illustrating a representative graph of an (8,4) polar encoder;

FIG. 4B is a diagram illustrating a representative decoding tree of the (8,4) polar encoder of FIG. 4A;

DETAILED DESCRIPTION

Example Networks for Implementation of the Embodiments

Certain embodiments may be implemented in autonomous and/or semi-autonomous vehicles, robotic vehicles, cars, IoT gear, any device that moves, or a WTRU or other communication devices, which, in turn, may be used in a communication network. The following section provides a description of some exemplary WTRUs and/or other communication devices and networks in which they may be incorporated.

Figure 1A:
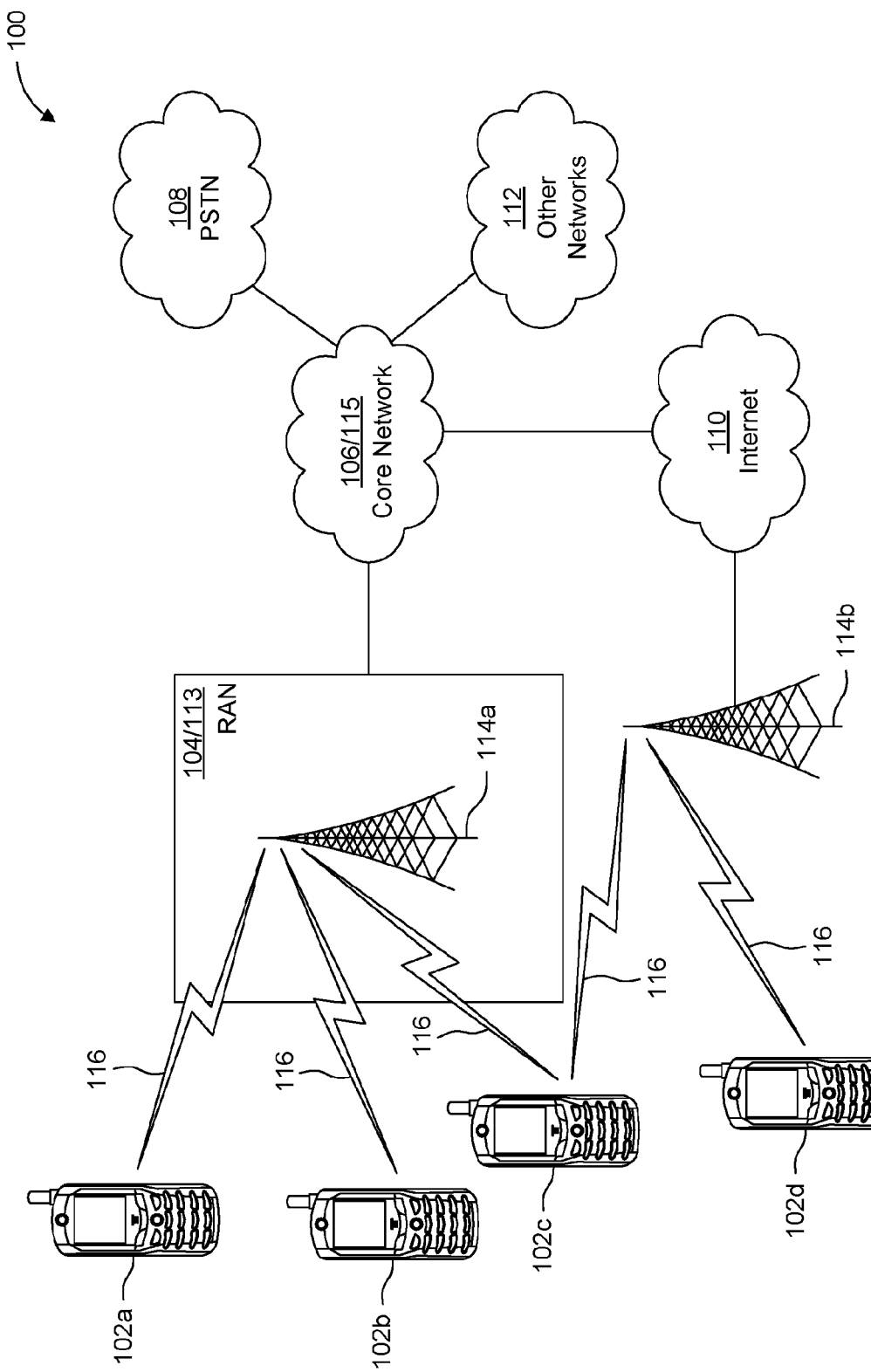
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c, 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B (end), a Home Node B (HNB), a Home eNode B (HeNB), a gNB, a NR Node B, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSU PA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an end and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
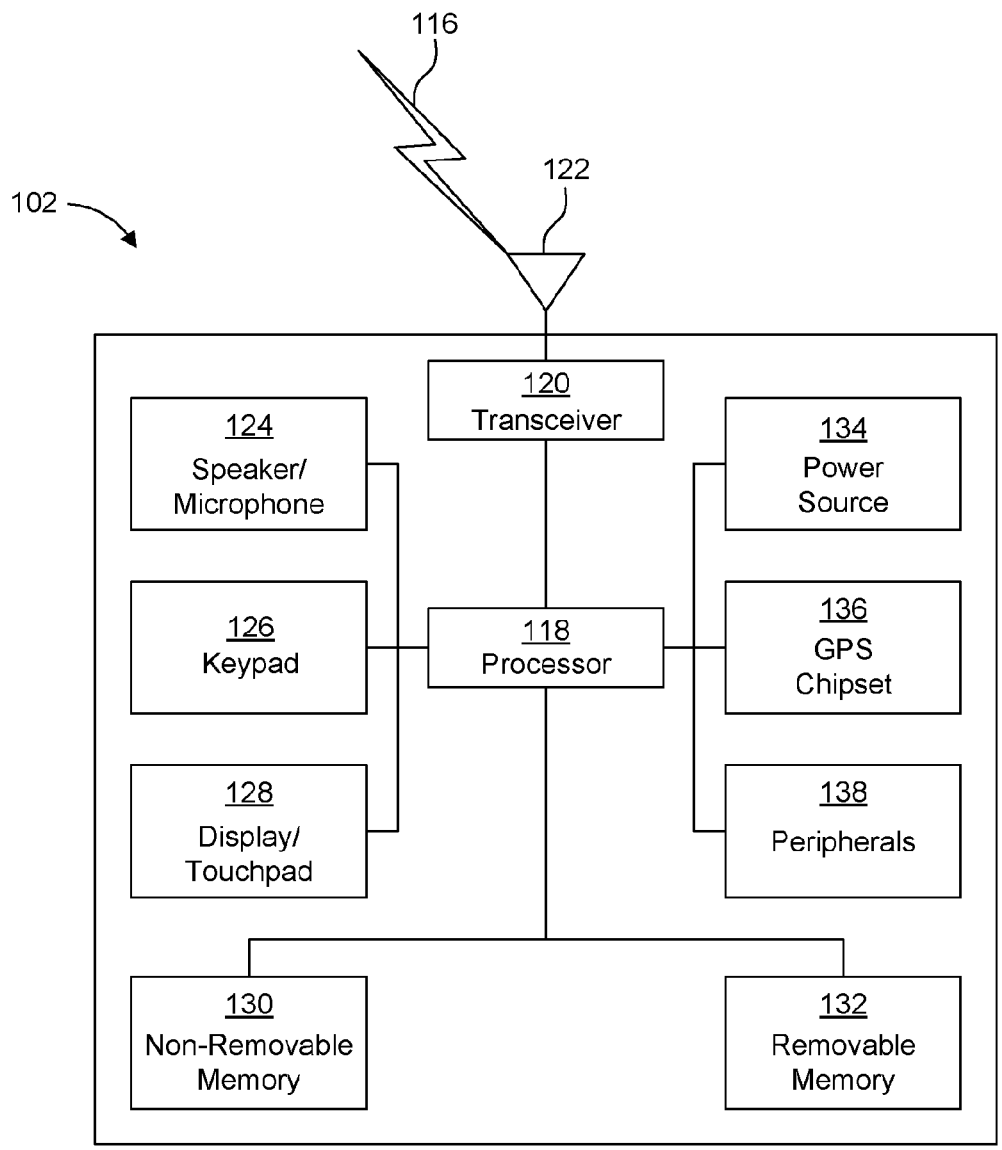
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The processor 118 of the WTRU 102 may operatively communicate with various peripherals 138 including, for example, any of: the one or more accelerometers, the one or more gyroscopes, the USB port, other communication interfaces/ports, the display and/or other visual/audio indicators to implement representative embodiments disclosed herein.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the downlink (e.g., for reception)).

Figure 1C:
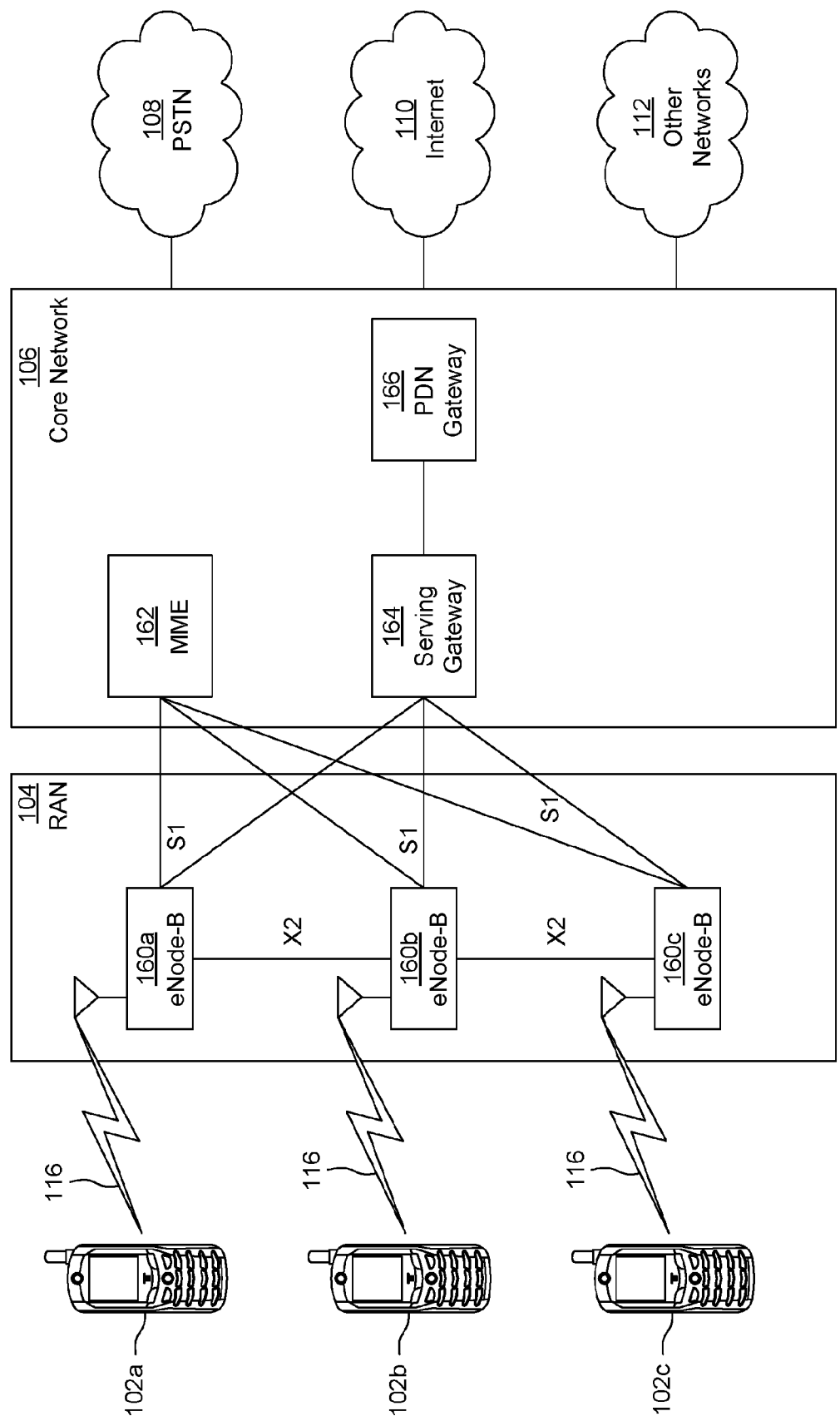
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode Bs 160a, 160b, 160c, though it will be appreciated that the RAN 104 may include any number of eNode Bs while remaining consistent with an embodiment. The eNode Bs 160a, 160b, 160c may each include one or more transceivers for communicating with the WTRUs 102a, 102b, 102c over the air interface 116. In one embodiment, the eNode Bs 160a, 160b, 160c may implement MIMO technology. Thus, the eNode B 160a, for example, may use multiple antennas to transmit wireless signals to, and/or receive wireless signals from, the WTRU 102a.

Each of the eNode Bs 160a, 160b, 160c may be associated with a particular cell (not shown) and may be configured to handle radio resource management decisions, handover decisions, scheduling of users in the UL and/or DL, and the like. As shown in FIG. 1C, the eNode Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode Bs 160a, 160b, 160c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
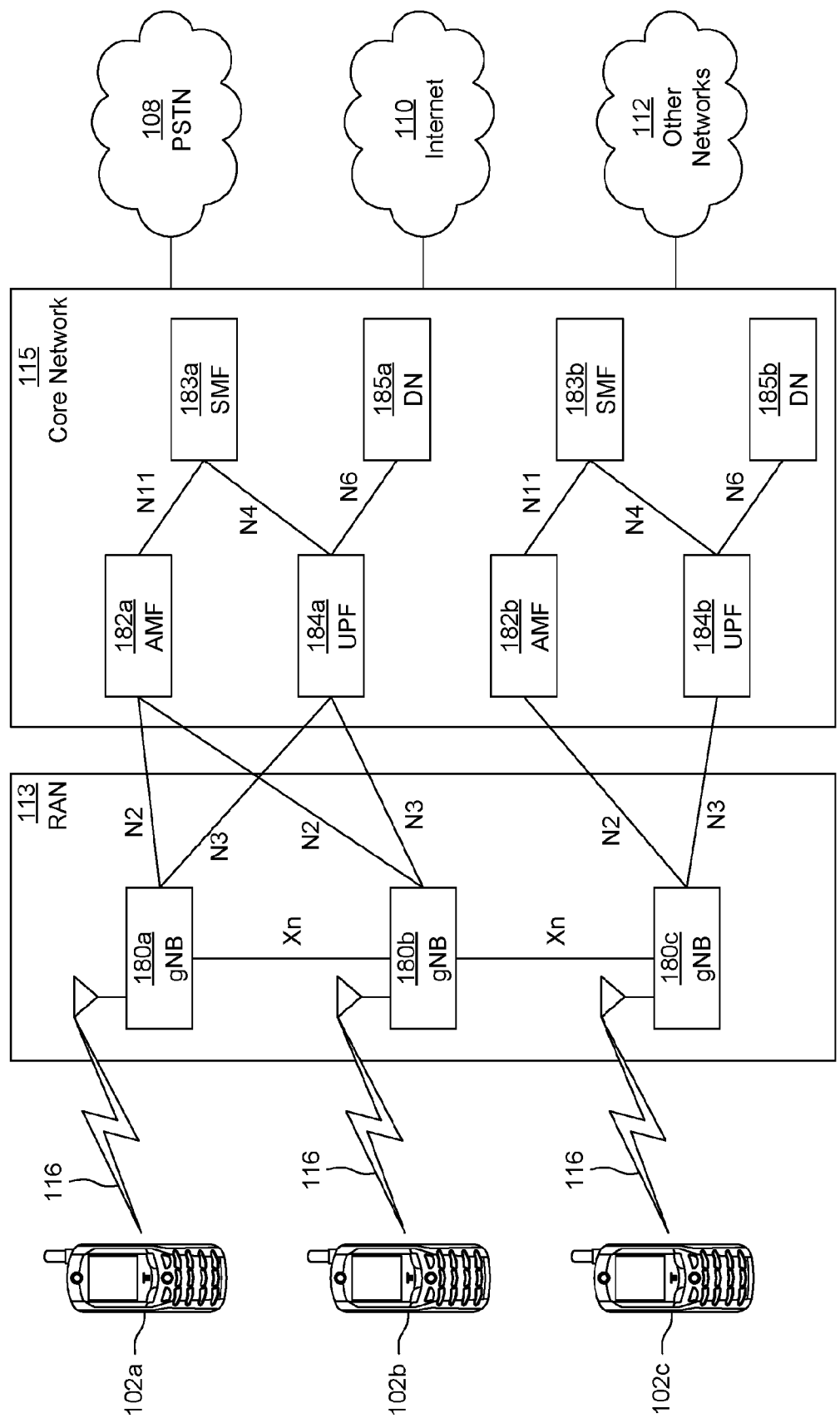
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 180b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode Bs 160a, 160b, 160c. For example, WTRUs 102a, 102b, 102c may implement DC principles to communicate with one or more gNBs 180a, 180b, 180c and one or more eNode Bs 160a, 160b, 160c substantially simultaneously. In the non-standalone configuration, eNode Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a, 184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different Protocol Data Unit (PDU) sessions with different requirements), selecting a particular SMF 183a, 183b, management of the registration area, termination of Non-Access Stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency communication (URLLC) access, services relying on enhanced mobile (e.g., massive mobile) broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating WTRU 102 IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description, one or more, or all, of the functions described herein with regard to one or more of: WTRU 102a-d, Base Station 114a-b, eNode B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

Although, a Network Access Point (NAP) is shown to be a base station, an eNB and/or a gNB, among others, in FIGS. 1A to 1D, it should be understood other network access points are contemplated including 5G and beyond NAPs. For example, a NAP may include a distributed stack (e.g., set of layers) virtualized over any number of devices (e.g., hardware modules) which, in operation, may act as a NAP. For simplicity, the following description NAP and BS may be used interchangeably.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

In certain representative embodiments, methods, apparatus and systems may be implemented for the selection of component code outputs for input as cyclic redundancy check (CRC) bits during polar encoding. The component polar codes and particular encoded bits in these component codes that will be used in CRC calculation can be selected based on any of: a number of CRC bits, such as determined according to a modulation coding scheme (MCS) level; a component code type and/or a code rate, such as full-rate, zero-rate, repetition-based, or arbitrary-rate component codes; a decoding method used at a decoding side, such as fast successive cancellation decoding; and/or component codes and/or encoding/decoding depth/level of the component codes, such as may be determined at an encoding side and/or the decoding side.

Polar Codes

Polar codes are the first channel code technique which has been analytically proven to be capacity achieving. Polar codes show comparable performance to conventional low-density parity check (LDPC) code or turbo code with low or no error floor when aided by embedded CRC particularly for small to medium block lengths. Polar codes with successive cancellation decoding may involve relatively low encoding and decoding complexities. However, the decoding complexity of successive cancellation decoding may increase in proportion to the list-size when CRC-aided list decoding is adopted and may also increase in proportion to the block-length of the codeword. The complexity increase may become significant particularly in medium to large block-lengths, and may limit the adoption of polar codes for high throughput regimes, such as 5G NR eMBB data rates (~20 Gbps) and above.

Due to the performance characteristics when used with small block lengths, polar code has been adopted as a channel coding scheme for the 3GPP NR standard to be used for control channel forward error correction (FEC) operations.

Polar code encoding can be defined as in the following:

$$c_1^N = u_1^N G_N \quad \text{(Equation 1)}$$

A codeword vector of polar code $c_1^N$ is generated by a product of an input vector $u_1^N$ and a generator matrix $G_N$. Here, $c_1^N$ and $u_1^N$ are binary vectors with a length $N=2^n$, where N denotes the codeword block-length. The generator matrix $G_N$ can be defined by the Kronecker power of $$F = \begin{bmatrix} 1 & 0 \\ 1 & 1 \end{bmatrix},$$

$$G_N = F^{\otimes n} \quad \text{(Equation 2)}$$

where $(\ )^{\otimes n}$ stands for n-th Kronecker power of $(\ )$. In Arikan's original paper describing polar codes, $G_N = B_N F^{\otimes n}$, where $B_N$ denotes a bit reversing matrix and $B_N$ changes the order of elements in $u_1^N = [u_1, u_2, \ldots, u_N]$. Without loss of generality, it may be assumed $G_N = F^{\otimes n}$ as described herein unless noted otherwise.

Some input bits for a polar code have fixed values (usually zero) and they may be referred to as "frozen bits". The input indexes for frozen bits can be represented by the set $A^c = \{a_1^c, a_2^c, a_3^c, \ldots, a_{N-K}^c\}$ and $a_i^c < a_j^c$ if $i<j$. The remaining part of input bits for a polar code may convey variable information bits and they may be referred to as "unfrozen bits". The input indexes for unfrozen bits can be represented by the set $A = \{a_1, a_2, a_3, \ldots, a_K\}$ and $a_i < a_j$ if $i<j$.

The number of information bits (or unfrozen bits) may be defined as K and the number of frozen bits follows as N−K.

The code rate R of a given polar code may be defined as $$\frac{K}{N}.$$

The process of determining the input bit indexes for frozen bits and unfrozen bits may be referred to as "code construction" for a polar code.

Figure 2:
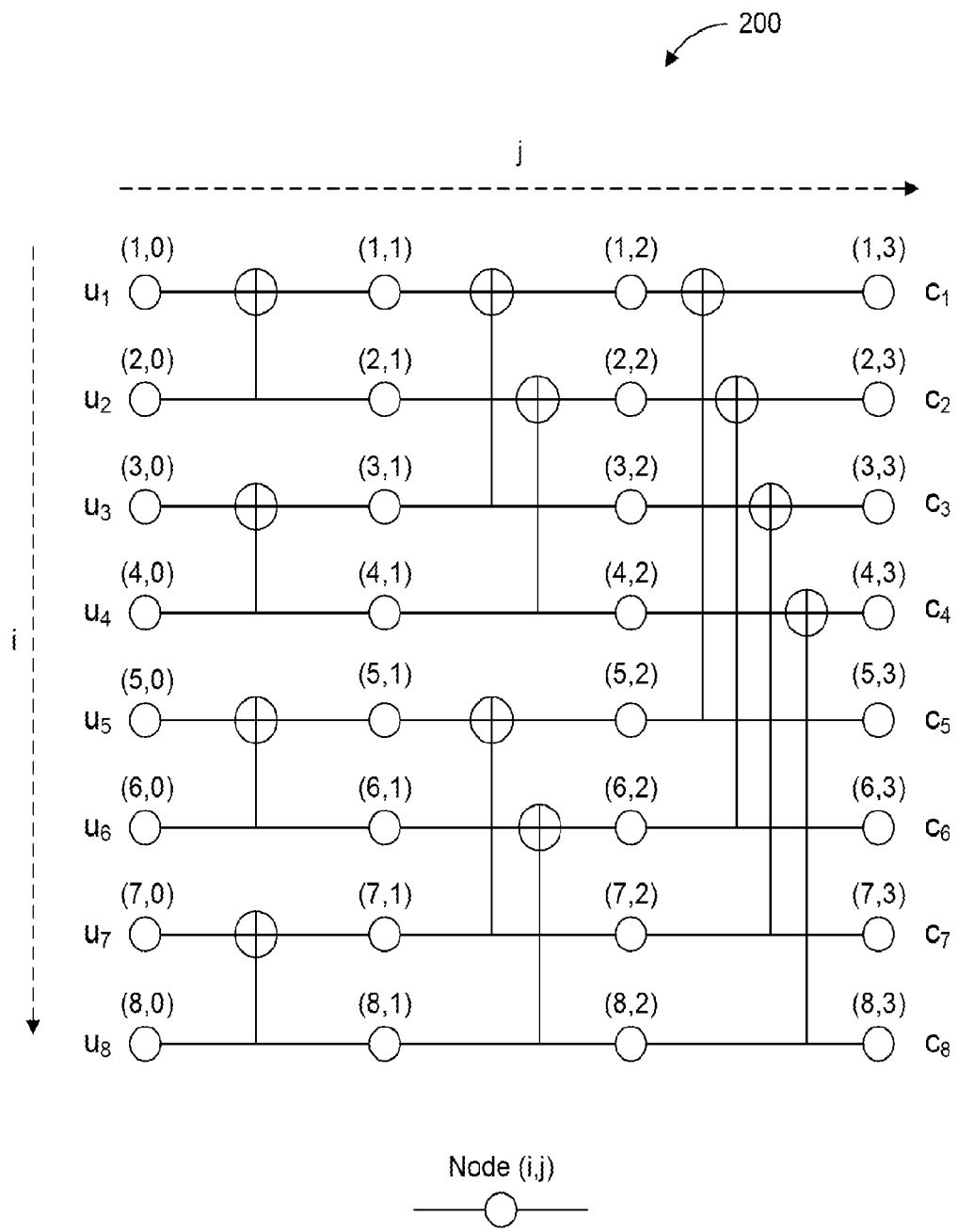
FIG. 2 is a diagram illustrating a representative polar encoder with an input vector of $u_1^8$.

There are several code construction methods developed for polar code as described in "A Comparative Study of Polar Code Constructions for the AWGN Channel," arXiv: 1501.02473v1, Jan. 11, 2015. In general, the code construction methods initially calculate the reliability of each input bit index, and may therefore have an order and/or ranking of the input bit index reliabilities before the encoding operation begins. From the obtained reliability order, the least reliable input bits may be assigned as frozen bits and the remaining bits may be assigned as unfrozen bits which carry information. The proportion of frozen and unfrozen bits may be determined according to the desired code rate. With the frozen and unfrozen bit locations determined, the encoding operation may proceed as in $c_1^N = u_1^N G_N$ (Equation 1). FIG. 2 is a diagram illustrating a representative polar encoder 200 with an input vector of $u_1^8$. When FIG. 2 is referred to herein, it may be considered as following the polar code description in 3GPP NR TS 38.212 V15.0.0. As shown in FIG. 2, the polar encoder can be represented by layers of nodes, where the nodes can be denoted by (i,j), i=1, ..., N and j=0, ..., n.

The decoding algorithms for polar code can be categorized into two types, Successive Cancellation (SC) based decoding and Belief Propagation (BP) based decoding. SC polar decoding is a sequential decoding method to calculate log-likelihood ratio (LLR) values of input bits in a serial manner. It may be based on the assumption that any previously decoded bits are correct and they are used for decoding a current bit. Successive Cancellation List (SCL) decoding adopts several lists of candidate paths with the aim to improve the performance of SC decoding. A best list may be selected according to an outcome of the LLR calculation. CA-SCL (CRC Aided Successive Cancellation List) decoding uses the embedded CRC as a tool to select the list. By performing CA-SCL decoding, polar codes can achieve error performance comparable or superior to conventional LDPC codes or turbo codes as described in "List decoding of polar codes," arXiv:1206.0050v1, May 2012 and "CRC-aided decoding of polar codes," IEEE Communications letters, October 2012.

In some applications of channel code, a "systematic" code type can be used. In systematic codes, input data is embedded in the encoded output. The systematic code has the information bits as part of its code bits. The systematic polar codes were first introduced in "Systematic Polar Coding," IEEE Communications Letters, vol. 15, no. 8, pp. 860-862, August 2011. A simple implementation of systematic polar code by cascading two encoders was described in "Fast polar decoders: Algorithm and implementation," IEEE J. Sel. Areas Commun.(JSAC), vol. 32, no. 5, pp. 946-957, May 2014.

Systematic polar codes have a few merits in comparison to non-systematic polar codes. For example, systematic polar codes may demonstrate better BER performance than non-systematic polar codes. For example, systematic polar codes may be compatible with fast SCL decoding algorithm. The fast SCL decoding algorithm is one of the main candidates for practical implementations of polar decoders. The fast SCL decoding of non-systematic polar codes may require additional encoding process to obtain final decoded information bits, however this additional encoding process is not required in systematic polar codes.

Figure 3:
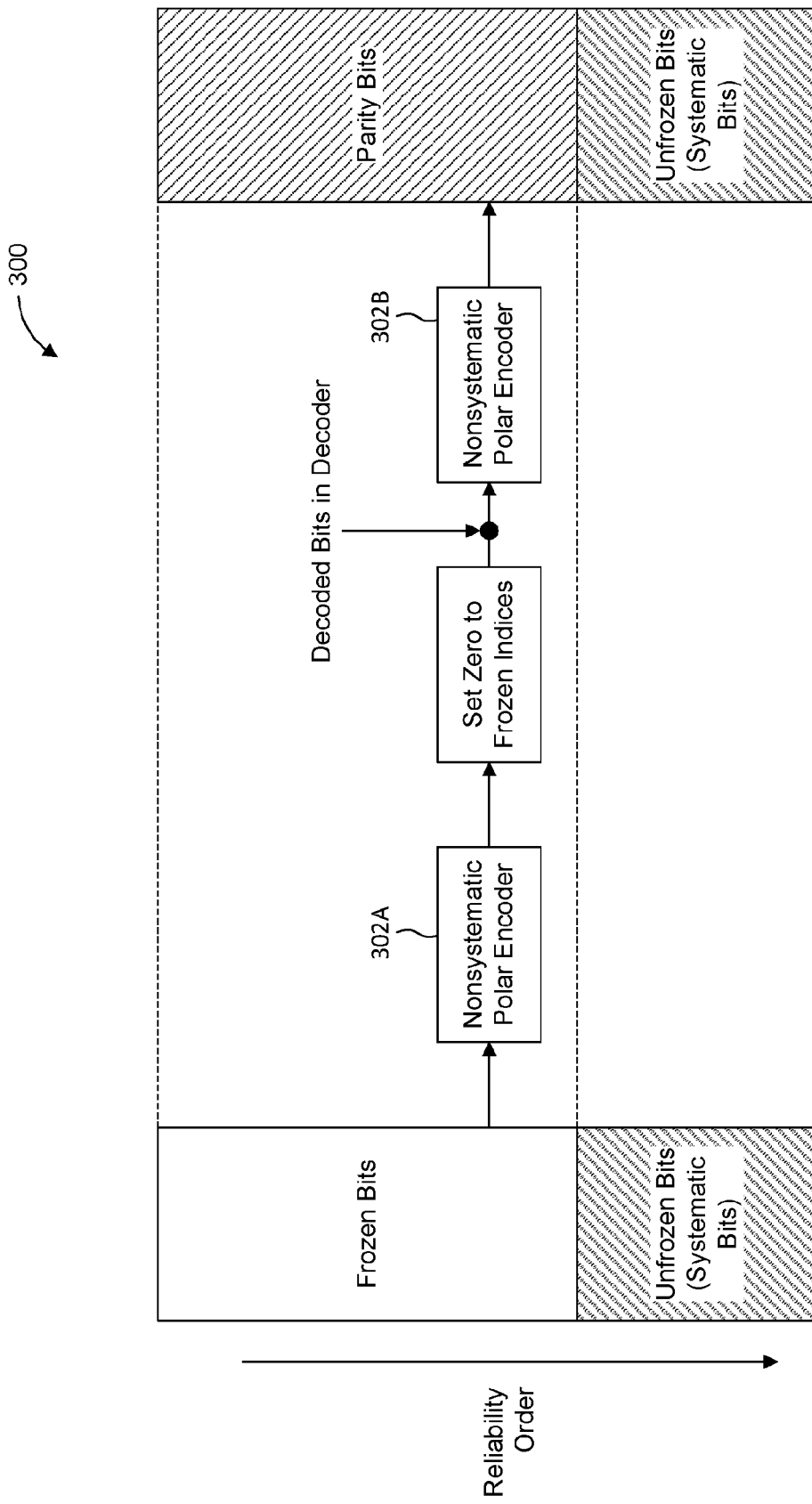
FIG. 3 is a diagram illustrating a representative systematic polar encoder by cascading nonsystematic polar encoders.

FIG. 3 is a diagram illustrating a representative systematic polar encoder 300 by cascading nonsystematic polar encoders. In the implementation of systematic polar codes as described in "Fast polar decoders: Algorithm and implementation," IEEE J. Sel. Areas Commun.(JSAC), vol. 32, no. 5, pp. 946-957, May 2014, the information bits are encoded in two separate stages by the non-systematic encoders 302A, 302B that use the same code construction (e.g., same frozen and unfrozen bit indices) as shown in FIG. 3. The encoded bits from the first non-systematic encoder 302A may be partially input to the second non-systematic encoder 302B. In cases where a same encoder structure is used (e.g., as in FIG. 2) with i representing the index of unfrozen bits ($\in A$), a coded bit with index i at the output of the first non-systematic encoder 302A corresponds to an input bit with index i in the second non-systematic encoder 302B. If i corresponds to an index of a frozen bit ($\in A^c$), a predefined value (usually zero) may be given as the input to the second non-systematic encoder 302B. For an example in FIG. 2, $d_4 = u_4$, $d_6 = u_6$, $d_7 = u_7$, $d_8 = u_8$ where $d_i$ denotes output coded bits after the second non-systematic encoder 302B and $u_4$, $u_6$, $u_7$, $u_8$ are unfrozen bits (A={4,6,7,8}).

Another implementation to configure systematic polar encoding is described in "Efficient algorithms for systematic polar encoding," IEEE Comm. Let., vol. 20, no. 1, January 2016 where "EncoderA" does not require cascading two non-systematic polar encoder to generate systematic code bits.

The decoding algorithms used for non-systematic polar codes, such as SCL, can be applied for systematic polar codes where the final decoded information bits may be identified from the estimated code bits which include the systematic part.

The final decoded information (unfrozen) bits in systematic polar decoding may not be identified before the end of the overall decoding process when SC-based decoding is applied. In other words, intermediate code bit values corresponding to the systematic part before a last stage of the overall decoding may be different from the original information bits. In non-systematic polar decoding, an information bit value can be obtained in the middle of total decoding process when SC-based decoding is assumed. After decoding (e.g., obtaining) an information bit with index i, the decoding procedure after the index i (e.g.,>i) may not affect the decoding result already done for index i.

Fast CA-SCL Decoding

To reduce the complexity and/or latency of polar decoding, a fast successive cancellation list (CA-SCL) decoding algorithm for polar codes and list decoding is described in "Fast and flexible successive cancellation list decoders for polar codes," IEEE Trans. Signal Process., vol. 65, no. 21, pp. 5756-5769, November 2017. In fast CA-SCL decoding of polar codes, decoding operations for some of the selected component polar codes may be processed in a block by block manner. The decoded (e.g., information) bits from the corresponding component polar codes cannot be directly acquired and an additional re-encoding procedure is required to obtain the decoded (e.g., information) bits.

FIG. 4A is a diagram illustrating a representative graph 400A of a (8,4) polar encoder. FIG. 4B is a diagram illustrating a representative SC decoding tree 400B of the (8,4) polar encoder of FIG. 4A. In FIG. 4A, $u_1$, $u_2$, $u_3$, $u_5$ are shown as frozen bits and $u_4$, $u_6$, $u_7$, $u_8$ are shown as unfrozen bits. The corresponding decoder tree 400B to the (8,4) polar encoder graph 400A of FIG. 4A is shown in FIG. 4B. In FIG. 4B, the black nodes in the leftmost side correspond to the unfrozen nodes of FIG. 4A and the white nodes in the leftmost side correspond to the frozen nodes of FIG. 4A.

A rightmost grey node in FIG. 4B is a parent node of the overall decoder tree structure. Connected nodes diverging from any parent nodes are corresponding child nodes. When all child nodes of a given node are unfrozen nodes, the node may also be considered a rate-1 node. When all child nodes of a given node are rate-1 nodes, the node also be considered a full rate node. When all child nodes of a given node are frozen nodes, the node also be considered a rate-0 node. When all child nodes of a given node are rate-0 nodes, the node also be considered a zero rate node. When a given node is neither a rate-1 node nor a rate-0 node, the node may be considered a rate-R node, where R may have a code rate larger than 0 and less than 1. Each rate-R node is depicted as a grey color in FIG. 4B. As for rate-R nodes, there exist some special nodes which can be dealt by special decoding method. They may be referred to as single parity check (SPC) nodes and/or repetition nodes as described in "Fast polar decoders: Algorithm and implementation," IEEE J. Sel. Areas Commun., vol. 32, no. 5, pp. 946-957, May 2014 and "Fast and flexible successive cancellation list decoders for polar codes," IEEE Trans. Signal Process., vol. 65, no. 21, pp. 5756-5769, November 2017. SPC nodes may correspond to component polar codes with a code rate of $$\frac{N_v - 1}{N_v}.$$

Repetition nodes may correspond to component polar code rate of $$\frac{1}{N_v}.$$

In the foregoing, $N_v$ denotes the length of the component polar code. For example, SPC nodes may be the same as repetition nodes when $N_v=2$. Rate-0 nodes and rate-1 nodes can also be included in a group of special nodes.

In SC, SCL and/or CA-SCL decoding algorithms, all nodes of the decoder tree shown in FIG. 4B may be traversed and LLR values for all $u_1, \ldots, u_8$ are calculated in order to be used in the final decision to obtain the information bits. In the fast CA-SCL decoding algorithm, LLR values of $u_1, \ldots, u_8$ are not directly calculated and LLR values of component polar codes are utilized with the aim of improving decoding complexity and latency reduction.

Figure 5:
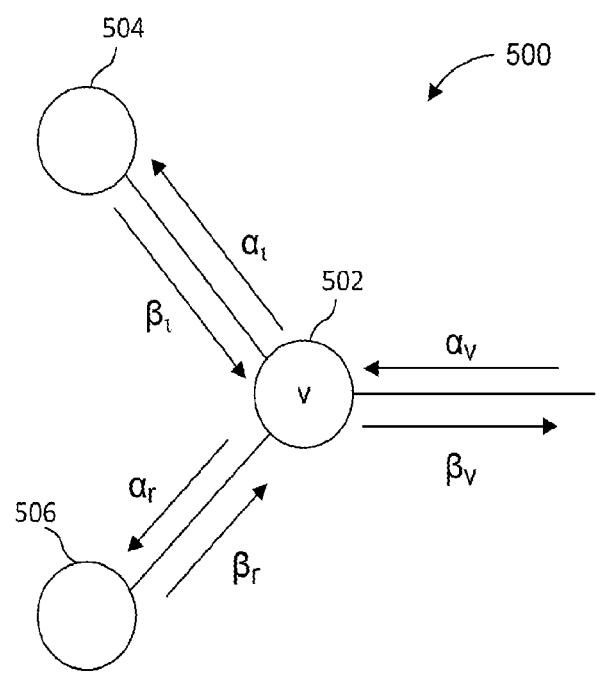
FIG. 5 is a diagram illustrating a representative procedure for passing values between nodes of a polar decoder.

FIG. 5 is a diagram illustrating a representative procedure 500 for passing message values between nodes 502, 504 and 506 of a polar decoder. A parent node 502 of the overall tree may be initialized by the LLR values of channel symbols. In FIG. 5, $\alpha_l$ is calculated by the F operation:

$$a_l[i]F\left(\alpha_v[i], \alpha_v\left[i+\frac{N_v}{2}\right]\right) = 2\operatorname{atanh}\left(\tanh\left(\frac{\alpha_v[i]}{2}\right)\tanh\left(\frac{\alpha_v[i+N_v/2]}{2}\right)\right) \approx$$
$$\operatorname{sgn}(\alpha_v[i])\operatorname{sgn}\left(\alpha_v\left[i+\frac{N_v}{2}\right]\right)\min\left(|\alpha_v[i]|, \left|\alpha_v\left[i+\frac{N_v}{2}\right]\right|\right)$$

where tanh(x) is the hyperbolic tangent function and atanh (x) is its inverse function. $N_v$ is the length of a component polar code corresponding to node v. i=1, ..., $N_v$. Further, sgn(x) is a sign value of x (e.g., when x≥0, sgn(x)=1 and when x<0, sgn(x)=−1), |x| is the absolute value of x, and min (x,y) is the minimum between x and y.

In FIG. 5, $\alpha_r$ is calculated by the G operation:

$$a_r[i] = G\left(\alpha_v[i], \alpha_v\left[i+\frac{v}{2}\right], \beta_l[i]\right) = \alpha_v\left[i+\frac{v}{2}\right] + (2\beta_l[i] - 1)\alpha_v[i]$$

where $\beta_l$ and $\beta_r$ are the hard decision values of $\alpha_l$ and $\alpha_r$. For example, $\beta_l[i]$ can be calculated by the hard decision of $\alpha_l[i]$.

$$\beta_l[i] = \begin{cases} 1, & \alpha_l[i] \geq 0 \\ 0, & \text{otherwise} \end{cases}$$

In FIG. 5, $\beta_v$ as a node output can be calculated as follows:

$$\beta_v[i] = \begin{cases} \beta_l[i] \oplus \beta_r[i], & i < N_v/2 \\ \beta_r[i - N_v/2], & \text{otherwise} \end{cases}$$

In FIG. 5, $\beta_v$ of a frozen node may always be set as zero and $\beta_v$ of an unfrozen node is a hard decision of $\alpha_v$.

In SC, SCL, and/or CA-SCL decoding, where all nodes need to be traversed during decoding operation, all $\alpha$, $\beta$ values need to be calculated. In fast CA-SCL decoding, some of the $\alpha$, $\beta$ values may be skipped, therefore providing a complexity reduction in the decoding procedure.

For SCL decoding, a path metric $PM_l^i$ for paths (or lists) are calculated to select the best path (or list) for final decoding and may be calculated as follows:

$$PM_l^i = \begin{cases} PM_l^{i-1}, & \hat{u}_i = h(\alpha_v) \\ PM_l^{i-1} + \alpha_v, & \text{otherwise} \end{cases}$$

In the foregoing path metric calculation, i is the index of a bit, and l is the index of a path (or list) where l=1, ..., L. Further, $\hat{u}_i$ is the estimated bit value input bit, and h(x) is a hard decision value of x (e.g., h(x) set to 1 when x>0 and h(x) set to 0 when x≤0). In estimating the unfrozen bits, all possible bit values (e.g., 0 or 1) can be assumed by increasing the path by double size (=2L) and the least reliable L paths are pruned (e.g., L paths survived after path pruning). The path pruning (e.g., splitting) process is one of the main parameters to decide decoding latency in SCL-based decoding. For example, "Fast and flexible successive cancellation list decoders for polar codes," IEEE Trans. Signal Process., vol. 65, no. 21, pp. 5756-5769, November 2017 proposes an approach to reduce the number of path pruning trials.

Figure 6B:
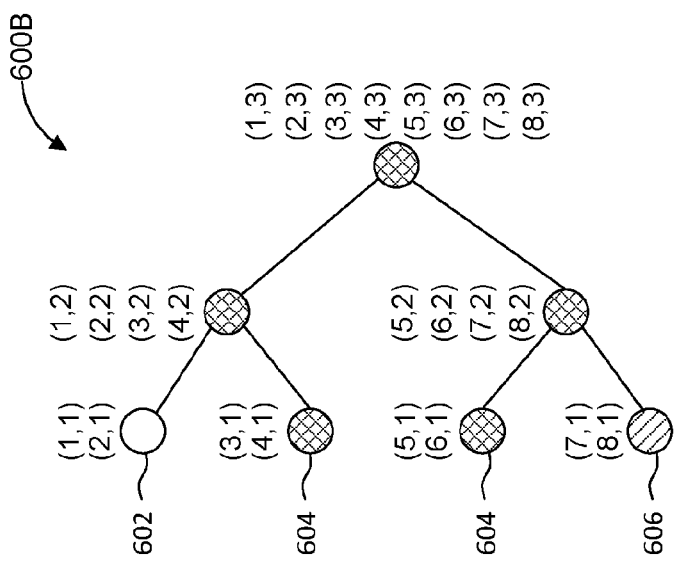
FIG. 6B is a diagram illustrating a representative polar encoder having the rate-0, single parity check (SPC), and rate-1 nodes and child nodes of FIG. 6A merged together.
Figure 6A:
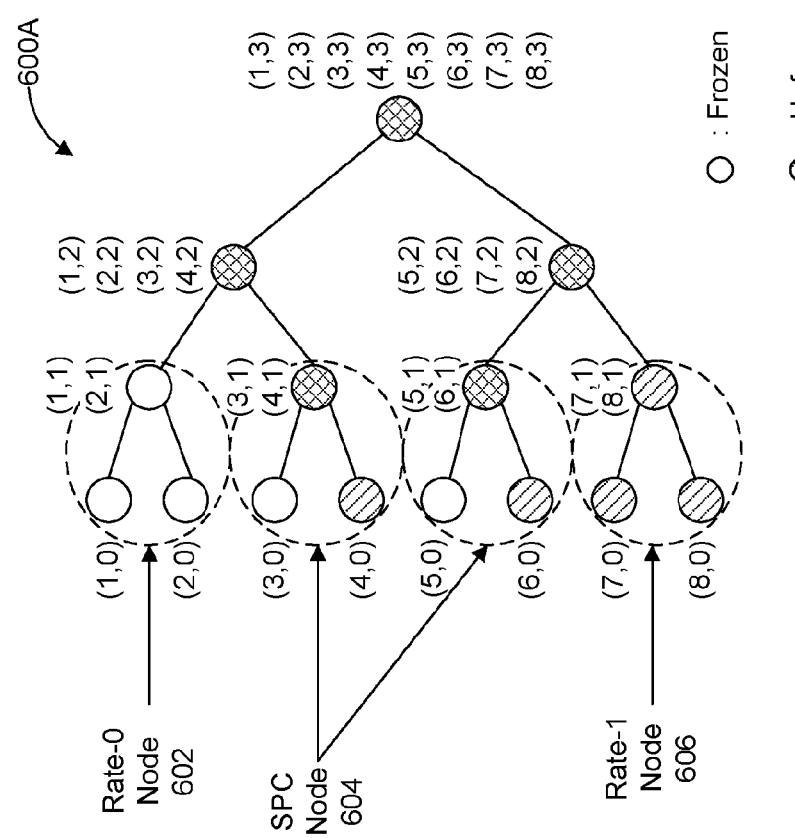
FIG. 6A is a diagram illustrating a representative polar encoder having rate-0, single parity check (SPC) and rate-1 nodes.

FIG. 6A is a diagram illustrating a representative polar decoder 600A having rate-0, single parity check (SPC) and rate-1 nodes. FIG. 6B is a diagram illustrating a representative polar decoder 600B having the rate-0, single parity check (SPC), and rate-1 nodes and child nodes of FIG. 6A merged together. While repetition codes are not shown in FIGS. 6A and 6B those skilled in the art will understand that the following description is equally applicable to repetition nodes.

In the FIG. 6A, rate-0 nodes 602, rate-1 nodes 606, and SPC nodes 604 and their respective child nodes are shown. The decoding of these component polar codes may be performed by corresponding decoding algorithms which execute a block-wise decoding for complexity reduction and latency when a fast decoding is assumed. There also exists corresponding decoding algorithms for repetition nodes.

For simplicity, the rate-0, rate-1 and SPC nodes and their child nodes can be merged into single nodes 602,604, and 606 as shown in FIG. 6B. In decoding procedures, such as SC, SCL and/or CA-SCL decoding, there is an order to visit all nodes to employ the F and G operations and path metric updates. In fast CA-SCL decoders, by introducing decoding processes for special (e.g., rate-0, rate-1, repetition and/or SPC nodes) nodes, the decoding process may not need to visit all the nodes (e.g., level 0) and may thus reduce decoding complexity and latency on a block-by-block basis corresponding to the special nodes.

With systematic polar code, an additional reencoding process may not be required to acquire the final decoded unfrozen bits after finishing all node processing. For example, $u_4$, $u_5$, $u_6$, $u_7$ may be identified from $x_1, \ldots, x_8$ in FIGS. 6A and 6B. For example, the final decoded bits corresponding to $u_4$, $u_5$, $u_6$, $u_7$ may be acquired by the following reencoding procedure for non-systematic polar code for fast SC decoding. Each special node (e.g., rate-0, rate-1, repetition and/or SPC nodes) may be considered as an independent component polar code and $u_4$, $u_5$, $u_6$, $u_7$ may be acquired by reencoding each component polar code. The reencoding may be analogous to systematic polar encoder using cascaded encoders. For example, the first repetition node with $N_v=2$ (e.g., the first green circle from the top in FIG. 6A) may be considered as a half code rate polar code. By reencoding the hard decisioned node bit values of this repetition node, one unfrozen bit (e.g., $u_4$) may be identified. Before reencoding, the first hard decision bit should be frozen. After, for the bit values from $x_1, \ldots, x_8$, the final decoded bits $u_4$, $u_5$, $u_6$, $u_7$ can be obtained by using similar operations, such as zero bit insertion for frozen bits, followed by the additional nonsystematic reencoding operation.

In fast SCL decoding, the possible candidate lists may be derived based on the above approach. The list with best metric value may be selected for final decoding from among the candidate lists, and an additional reencoding process may then be performed for the selected list to obtain the final decoded binary values.

In fast CA-SCL decoding, a maximum of L re-encoding processes may be performed in order to detect a CRC passed list. After decoding, there may be an identified order of lists determined based on their order of metric values, whereas the CRC check can be performed starting from a first list of the ordered lists. Once the first CRC pass is executed, the first CRC passed list is used for the remaining re-encoding process in order to obtain the final decoded binary values. On condition that none of the lists passes the CRC check, the list with a maximum metric value may be used for the remaining re-encoding process, or in another option, a decoding failure can be announced which may trigger a HARQ process. For fast CA-SCL decoding, a maximum of L re-encoding processes may be performed until finalizing the decoding of the final binary values.

Distributed CRC for Polar Codes

The attachment procedure for CRC bits as applied within polar encoding, may improve the error-correcting performance of polar codes, such as when using CA-SCL decoding. Concatenation of an encoded bit block with a CRC block may significantly improve the error performance of polar codes having a medium code block length, typically in the range between 256 to 1000 bits as considered in 3GPP 5G NR, by increasing the Hamming distance of the overall concatenated code.

For example, single CRC bits may be attached to information bits and positions of the CRC bits may correspond to a tail of the information bits as described in TS 38.212 V15.0.0. In the foregoing, "single CRC bits" implies that all information bits are encoded by a single CRC encoder. The CRC bits, along with the information bits, are the unfrozen bits and are used in selecting a final list or path in CA-SCL decoding. Once all node processing in SCL decoding is completed, a list that satisfies a CRC check with a minimum path metric is selected as the final decoded list, and the corresponding information bits of the list may determine the final decoded bits.

The CRC check may be employed during the decoding process in a distributed manner instead of once the decoding process is completed. This approach may be referred to as a distributed CRC check. There are two main categories of distributive CRC operation—multiple CRC attachment and distributed CRC operation by a single CRC attachment.

In multiple CRC attachment, the bits (e.g., information bits) are divided into multiple parts and each part may be encoded by a respective (e.g., independent) CRC encoder. Information bits may be equally divided as described in "Segmented CRC-Aided SC list polar decoding," in Proc. IEEE Vehicular Technology Conference (VTC), pp. 1-5, 2016. Information bits may be unequally divided in terms of block sizes as described in "Decoder Partitioning: Towards Practical List Decoding of Polar Codes," IEEE Trans. Commun., vol. 66, no. 9, pp. 3749-3759, September 2018 and "Zhang Segmented Successive Cancellation List Polar Decoding with Tailored CRC," arXiv:1803.00521 [eess.SP], 22 Feb. 2018. For example, the dividing may be segment-based division as described in "Segmented CRC-Aided SC list polar decoding," in Proc. IEEE Vehicular Technology Conference (VTC), pp. 1-5, 2016 and "Zhang Segmented Successive Cancellation List Polar Decoding with Tailored CRC," arXiv:1803.00521 [eess.SP] 22 Feb. 2018.

In segment-based division, all unfrozen bits may be divided into equal or unequal parts and each part (e.g., a group of unfrozen bits) is denoted as a "segment." Each segment may be separately (e.g., independently) CRC encoded. CRC bits (or positions) may need to be reserved within each segment before CRC encoding and the CRC bits may not be included in the input to the CRC encoder. Unequal segment part sizes may show better error performance as compared to equal segment part size.

In partition-based division, the input bits (e.g., frozen and unfrozen bits) may be equally or unequally divided and the information bits of one divided part (e.g., a group of unfrozen bits within the divided part) may form a "partition". The information bits (e.g., group of unfrozen bits) within each partition may be separately e.g., independently) encoded by a CRC encoder. CRC bits (e.g., positions) may need to be reserved within the unfrozen bits of each partition before CRC encoding and they may not be included in the input to the CRC encoder.

In distributed CRC operation by single CRC attachment, the position of each CRC bit is not limited to the tail of the information bits. Each CRC bit is generated by an XOR addition of the preceding information bits. Distributed CRC operation by single CRC attachment is implemented by the addition of an interleaver to the CRC attachment before being input to the polar encoder (e.g., after CRC attachment to the tail of information bits) as described in "Distributing CRC bits to aid polar decoding," in IEEE Global Communications Conference (GLOBECOM), Singapore, December 2017. Further, the distributed CRC operation by single CRC attachment is the CRC attachment method used in 3GPP TS 38.212 V15.0.0 for the physical downlink control channel (PDCCH) in 5G NR.

Distributed CRC operation may have the benefits of reducing complexity and memory requirements for SCL decoding. In multiple CRC attachment, a single list can be selected in the decoding process for each segment or partition and can be used as an initial list in the decoding process of the next segment or partition. The hardware implementation and memory for single segment or partition can be reused and it can provide reduction in complexity and memory requirement. Distributed CRC operation may also beneficially provide early stopping functionality when decoding. In 5G NR, a PDCCH which is allocated to a specific UE may be identified by several trials of blind decoding. When there is no list or path with a satisfactory (e.g., successful) CRC check in the positions of distributed CRC before the end of total decoding process, the decoding process can be stopped early. Early stopping may save battery power of the UE caused by blind decoding.

In view of the foregoing, CRC operation in polar coding is proven to improve the error performance of polar codes significantly in certain cases. In addition, polar decoders that use intermediate nodes in the decoding process, such as fast CA-SCL decoders, may provide lower complexity and latency. However, in the state-of-the-art decoders that use intermediate nodes in the decoding process, some of the component codes are not decoded until the level (e.g., layer) of the input bits is reached and after (e.g., only after) an additional reencoding process CRC check is applied to each list. This may create additional complexity and latency at the decoder.

Moreover, systematic polar coding has potential to be a leading candidate for the future wireless communication considering the performance advantages systematic polar codes have with respect to non-systematic polar codes. In addition, distributed CRC operations for polar codes demonstrate substantial advantages owing to the beneficial complexity and memory reduction characteristics of distributed CRC operations. However, direct application of conventional distributed CRC operation to systematic polar code procedures does not work as the CRC bits and information bits are mode available only in the final stage of decoders that use intermediate nodes, such as fast CA-SCL decoding.

As will be described below, certain representative embodiments, methods, apparatus and systems may be implemented for polar encoding and/or polar decoding which may further improve the latency and complexity caused by reencoding procedure in decoders that use intermediate nodes in the decoding process, such as fast CA-SCL decoder. certain representative embodiments, methods, apparatus and systems may be implemented distributed CRC operation with systematic polar codes.

Component Polar Code-Based CRC Procedures

In certain representative embodiments, methods, apparatus and systems are provided for the selection of component codes for input as cyclic redundancy check (CRC) bits during a polar encoding operation. The component polar codes and particular encoded bits in these component codes that will be used in CRC calculation can be selected based on any of: (1) a number of CRC bits, such as determined according to a modulation coding scheme (MCS) level; (2) a component code type and/or a code rate, such as full-rate, zero-rate, repetition-based, or arbitrary-rate component codes; (3) a decoding method chosen and/or used at a decoding side, such as fast successive cancellation decoding; (4) component codes and/or encoding/decoding depth/level of the component codes, such as may be determined at an encoding side and/or the decoding side; and/or (5) a target latency reduction, such as the selected component codes may depend on a target latency reduction value. For example, a larger latency reduction value may indicate a larger component code size and a smaller latency reduction value may indicate smaller component code size.

After the component codes to be used are selected, the outputs (e.g., information bits) of these component codes may be grouped based on an encoding depth and/or level (e.g., encoding timing index). A CRC operation may then be performed to calculate CRC information (e.g., a CRC bit) based on the grouped component codes and the encoded bits (e.g., of the grouped component codes). For example, the indices of the input bits and depth and/or level of component codes that participate in the CRC operation may be signaled to the decoder (e.g., indicated to the receiver-side) for adaptive implementation. After CRC bits for the information bits to be encoded have been calculated, a polar encoding operation including the calculated CRC bits is performed. In certain representative embodiments, the encoding operation may skip encoding levels in accordance with the component code selection. For example, as the encoded bits of the selected component codes are used to calculate the CRC bit(s), these encoded bits of the selected component codes may already be available when the encoding operation begins and the encoding up to the level(s) of the selected component codes may be skipped.

In certain representative embodiments, methods, apparatus and systems are provided for a polar decoding operation. A list decoder (e.g., a fast list decoder) may generate (e.g., populate) L lists of decoded sequences with L metric values are populated. A CRC process with and/or using the component code outputs of a list is performed to identify whether the decoded sequence of the list may be erroneous (e.g., whether the respective list has an error or not). Once a list among the L lists of decoded sequences is the first to have passed the CRC process, the CRC procedure may stop with respect to the remaining lists of the L lists. The CRC process may be sorted and/or sequentially or performed for the L lists based on the L metric values. For example, the CRC process may be performed sequentially based on ordering the L lists based on the reliability of each list (e.g., processing the lists with the L metric values from lowest path metric to greatest path metric). To obtain the input bits (e.g., information bits), a reencoding operation is performed (e.g., only once) for the first CRC passed list. This may reduce decoding complexity and latency as opposed to performing a CRC check of every candidate list as in conventional fast list decoding.

Component Code-Based CRC and Polar Encoding Procedure

Figure 7:
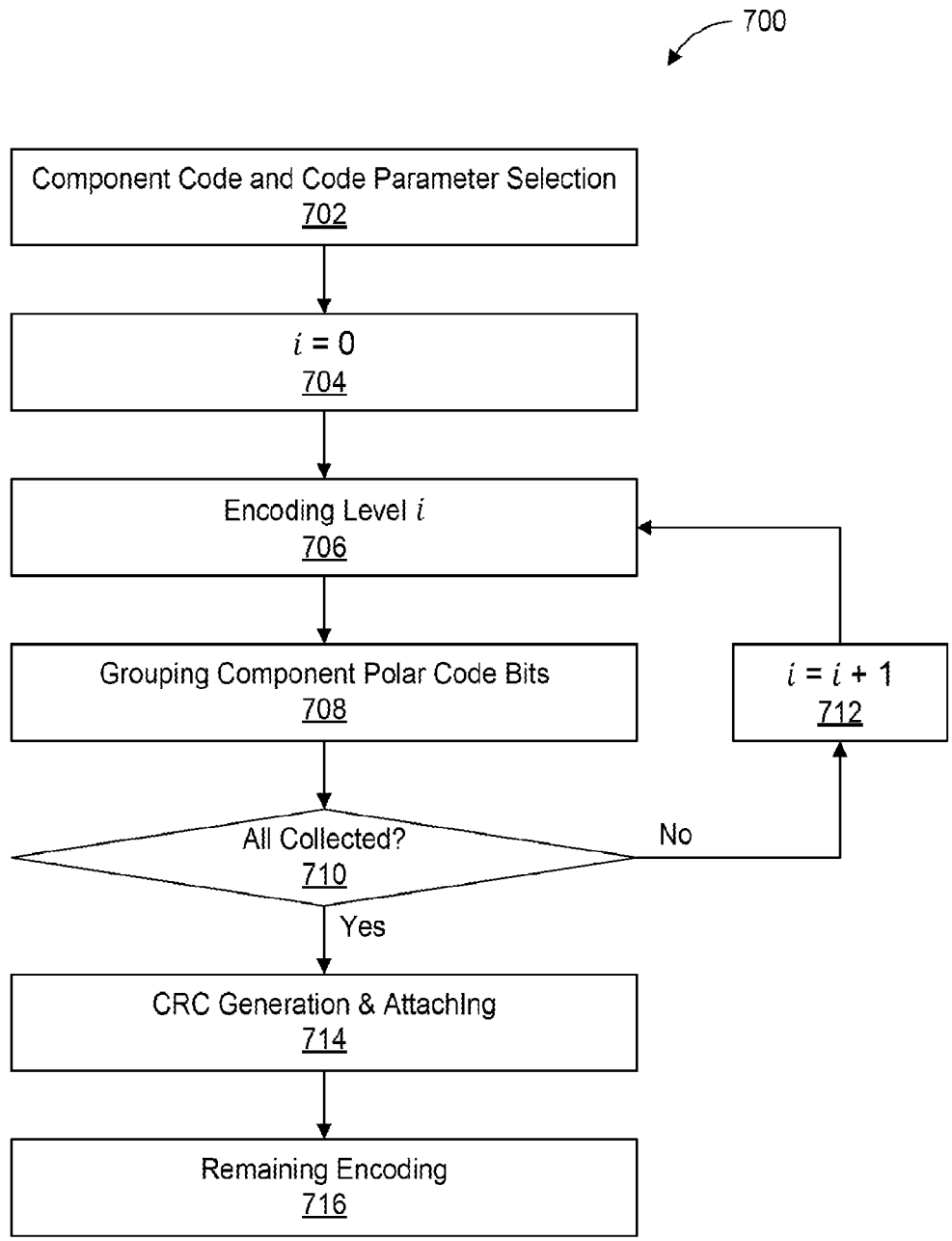
FIG. 7 is a diagram illustrating a representative procedure for component polar code-based CRC and polar encoding.

FIG. 7 is a diagram illustrating a representative procedure for component polar code-based CRC and polar encoding. In FIG. 7, the procedure starts with component code and/or code parameter selection at 702. For example, before starting the CRC encoding operation, particular component codes in a given polar code (e.g., a (N,K) polar code with a given code-construction), along with selected encoded bits of these component codes are determined and/or selected. These component codes and their encoded bits are used as input to the CRC encoding function.

Component Polar Code and Code Parameter Setup and Selection

In certain representative embodiments, the selection of component polar codes at 702 may be based on (e.g., depend on) multiple factors which can include any of: (1) a number of CRC input bits ($C_{in}$), (2) a type of component code, (3) a decoder implementation, (4) a decoding operation type, and/or (5) a target latency reduction.

For example, the selection of component polar codes may be based at least in part on the number of CRC input bits ($C_{in}$) may be a function of a selected MCS level and/or a selected CRC function. Here, C represents a number of output bits at the CRC encoder, and these C bits may be assumed to be included in the total number of information bits, K, to be encoded. In certain representative embodiments, the first C unfrozen bits (e.g., least reliable unfrozen bits) are positions which may be reserved for the CRC output bits to be encoded.

For example, the selection of component polar codes may be based at least in part on the types of component code that may be included or omitted in a given encoding and/or decoding operation may include any of full-rate component polar code, zero-rate component polar code, repetition component polar code, SPC component polar code, and/or other code rate component polar code. A full-rate component polar code may be included (e.g. selected) when the code rate is one. A zero-rate component polar code may be included (e.g., selected) when the code rate is zero. A repetition component polar code may be included (e.g., selected) when the component code has only one information bit and the code rate is $$\frac{1}{N_v},$$

where $N_v$ denotes the length of the component polar code. A SPC component polar code may be included (e.g., selected) when the component code has only one parity check bits and code rate is $$\frac{N_v-1}{N_v}.$$

An arbitrary (e.g., other) code rate component polar code may be selected in other cases such as for other code rates greater than zero and less than one.

For example, the selection of component polar codes may be based at least in part on a chosen decoder implementation such as the implementation being indicated to be a fast successive-cancellation decoder or using a fast successive-cancellation algorithm.

For example, the selection of component polar codes may be based at least in part on a selected polar decoding procedure used to obtain input bit estimation. In some polar decoder procedures, one or more of the component codes may be omitted during the decoding process. Selection of component polar codes at the encoder may follow the same or similar component code skipping rules at the decoder. This selection of component polar codes may be adaptive, such as being made dynamically based on various parameters such as any of decoding complexity, latency and/or bit-error-rate (BER) performance, or in another option, the selection of component polar codes maybe predetermined. In the adaptive selection, information indicating a respective decoding procedure to be used or applied may be fed back to the encoder and may be used in selecting the component codes and their encoded bits that will participate in the CRC operation.

For example, the selection of component polar codes may be based at least in part on a target latency reduction, such that the selected component code may depend on received information indicating a target latency reduction value where a larger latency reduction value could indicate larger component code size and a smaller latency reduction value could indicate smaller component code size.

In some representative embodiments, the largest full-rate component codes may be selected first, such as where a number of the component codes to be selected are determined according to a number of CRC input bits (e.g., indicated and/or required CRC input bits). Selecting the largest full-rate component codes may maximize the depth/level in the encoding/decoding process that decreases complexity and latency. In some representative embodiments, if all full-rate component codes are used and there are remaining CRC bits to generate, then other types of component codes may be selected for the generation of the remaining CRC bits.

In certain representative embodiments, a full rate component polar code may be selected according to the following process:

---

For b = n to c with decrement 1, where c is an integer larger than zero
  For a =1 to N with increment $2^b$
    If all input bits are unfrozen from i = a to a +
    $2^b$ − 1, full code rate component
  polar code starting the first level from i = a to a +
  $2^b$ − 1 and extending to b level are
  selected.
    Endif
   Endfor(a)
Endfor(b)

---

In the example above, the output code bits of a selected full rate component code are grouped together. Any remaining input unfrozen bit indices that have not been selected in the full rate component code bits may be considered for selection in other CRC bit calculations. In the foregoing process, only full rate component polar codes are selected. However, those skilled in the art will understand that the foregoing process may be extended to the selection of non-full code rate component polar codes.

In certain representative embodiments, selection of the component polar codes whose encoded bits will be considered for CRC inputs may be based on an order (e.g., selection prioritized based on code type). For example, any full rate component polar code may be selected before any single parity check component polar code, or vice versa.

As shown in FIG. 7, after selection of the component polar codes that will participate in CRC operation, the position of the encoded bit indices and their timing steps to obtain the output code bits are identified. Here, (i,j) may denote the respective index and timing step level of an encoded bit in a selected component code. The polar code parameter to be selected in FIG. 7 may include the positions of the encoded bit indices and their timing steps. For example, (i,j) may be defined as i=log $2N_v$, and j=indices that correspond to the input indices of the component codes for full-rate component codes. In other types of component codes, such as SPC, (i,j) may be defined as i=log 2 $N_v$ or another level that the decoder can use for decoding, and j=indices that correspond to the input indices of the component codes.

In certain representative embodiments, once the indices of the input bits and timing step levels of the component codes that participate in the CRC operation are identified, the (i,j) pairs may be signaled and/or otherwise indicated to the decoder. A flexible decoder implementation may be provided by signaling and/or indicating the indices of the input bits and timing step levels of component codes and the decoder may adapt the decoding operation to the indices of input bits and timing step levels of the component code outputs used in the encoder for CRC operation.

Grouping of Component Polar Code Encoded Bits as CRC Inputs

As shown in FIG. 7, after the component codes and their respective encoded bits that will participate in the CRC generation (e.g., CRC operation) are identified (e.g., bits corresponding to the (i,j) index sequence), the bits may be grouped at 704, 706, 708, 710 and 712 under different, disjointed, jointed, and/or partially jointed sets. These sets may be used as the input sequence for a CRC operation to calculate CRC bits. The sets used as the input sequences to generate the CRC bits may depend on the CRC function selection, such as being based on a single or multiple CRC function selection which will be described later. In certain representative embodiments, the grouping operation of the encoded bits may follow the sequential timing steps as in a polar encoding operation such that, at any given time step j, a polar encoding operation may be performed at the time step and the selected component code encoded bits may be grouped (e.g., collected) into corresponding sets. For example, an order of grouping of these encoded bits may follow any of a natural indexing order, an order of output code bit generation and/or interleaving.

CRC Generation

After grouping the component polar code bits at 710, CRC bits may be generated (e.g., calculated) at 714 based on the grouped component polar code bits. In certain representative embodiments, the CRC bit positions before the grouping operation may be set to arbitrary and/or predefined values. After the CRC are generated based on the collected bits, the C bits (e.g., C CRC bits) are inserted into the first C unfrozen bit positions in the polar encoder (e.g., attached to the information bits for polar encoding).

Polar Encoding with Component Code-Based CRC Inputs

After the CRC bits are generated at 714, polar encoding may be performed using the CRC bits which are attached with the information bits as inputs to the polar encoder. For example, the CRC bits and the initial unfrozen bits can be encoded starting from the first level of the polar encoding operation. In another example, the encoding operation of the CRC bits and the grouped component polar code bits may start (e.g., continue) from the output levels or timing steps where the component code grouping operation was completed (e.g., the level or timing step at which the component code output bits were collected). In the latter example, the encoding operation may start (e.g., resume) at the output level or timing step where the component coded bits are grouped.

Figure 8:
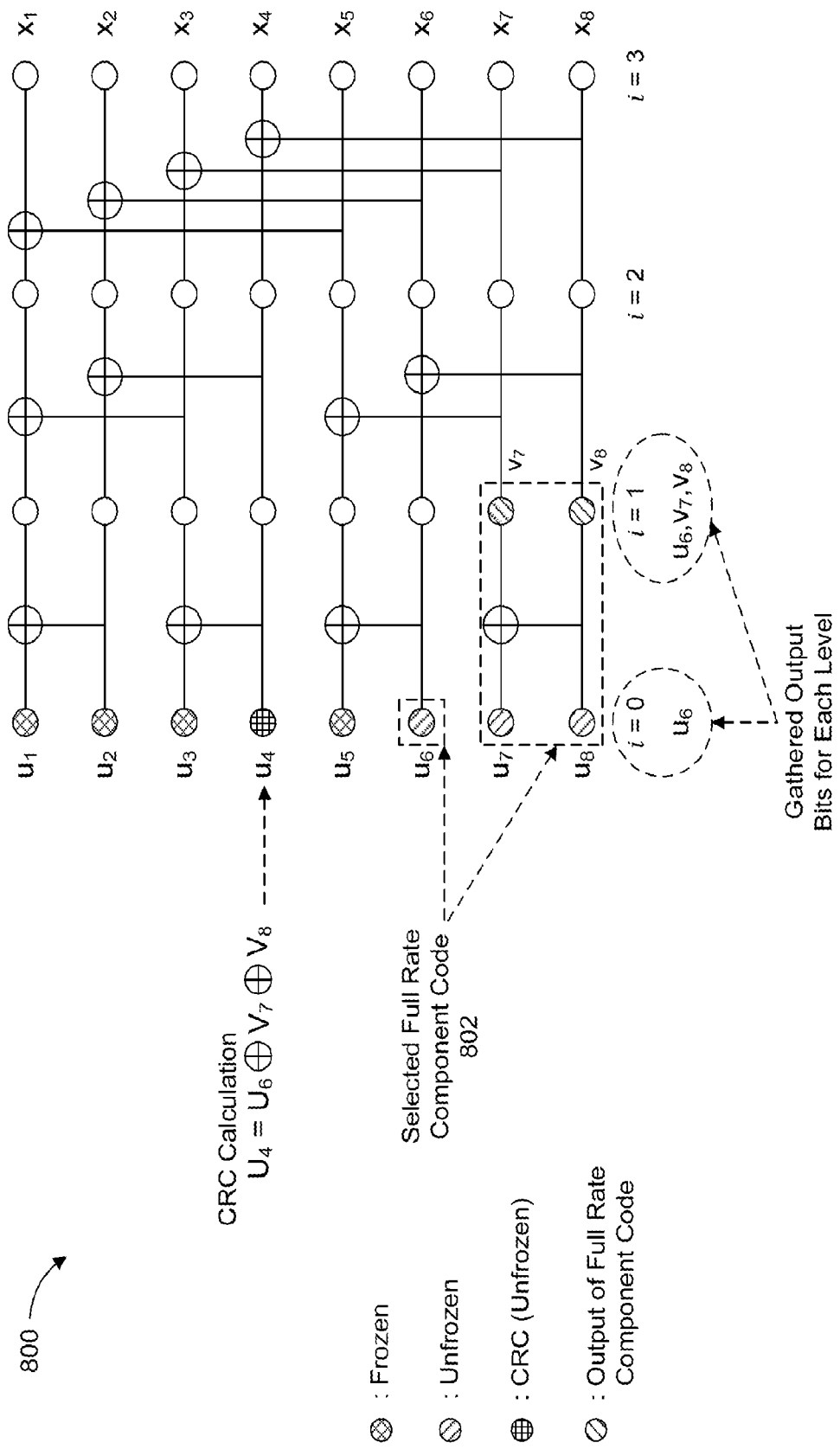
FIG. 8 is a diagram illustrating a representative polar encoder for (N, K, C):(8, 4, 1) and with full-rate component code-based CRC operation.
Figure 9:
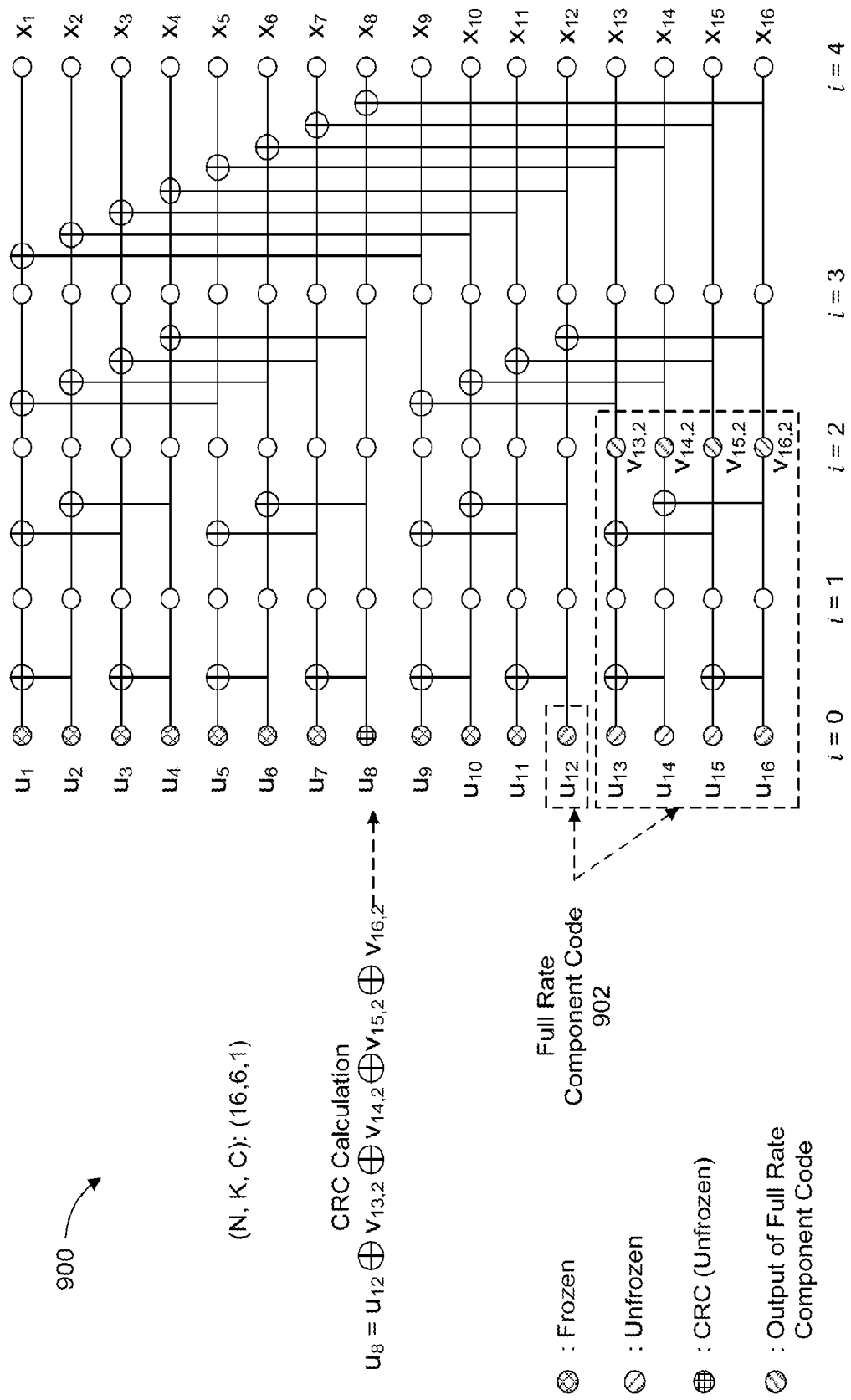
FIG. 9 is a diagram illustrating a representative polar encoder for (N, K, C):(16, 6, 1) and with full-rate component code-based CRC operation.

FIG. 8 is a diagram illustrating a representative polar encoder 800 for (N, K, C):(8, 4, 1) and with full-rate component code-based CRC operation. In FIG. 8, the encoding operation may continue from $v_7$, $v_8$ in the second level and may start at the first level in the other indices (e.g., $u_1$ to $u_6$). FIG. 9 is a diagram illustrating a representative polar encoder 900 for (N, K, C):(16, 6, 1) and with full-rate component code-based CRC operation. In FIG. 9, the encoding operation may continue from $v_{13,2}$, $v_{14,2}$, $v_{15,2}$, $v_{16,2}$ in the third level and may start at the first level in the other indices (e.g., $u_1$ to $u_{12}$). By continuing the encoding operation from the output levels or timing steps where the component coded bits are grouped, the encoding operation may achieve the benefit of having complexity and latency similar to conventional polar encoding operations while providing latency and complexity reduction benefits at the decoder.

The encoding operation may be performed to generated output coded bits (e.g., $x_1, \ldots, x_8$ in FIG. 8 and $x_1, \ldots, x_{16}$ in FIG. 9) may be obtained. In certain representative embodiments for systematic polar encoding, an additional re-encoding step may be necessary in order to generate the final coded bits. In systematic polar encoding, the input bits for the frozen positions of the second polar encoder may be set to a fixed value (e.g., zero). In certain representative embodiments for non-systematic polar encoding, additional re-encoding may not be required.

POLAR ENCODING EXAMPLES

In the representative (8, 4, 1) polar encoder (e.g., N=8, K=4, C=1) of FIG. 8, frozen bit positions, unfrozen bit positions (e.g., information bit and CRC bit positions), full-rate component codes 802 and coded bit selection for CRC operation are shown, as well as the end to end polar encoding configuration. In FIG. 8, input bit positions $u_1$, $u_2$, $u_3$, and $u_5$ are frozen. Input bit positions $u_6$, $u_7$ and $u_8$ are unfrozen information bit positions. Input bit position $u_4$ is an unfrozen bit position reserved for a CRC bit. As seen in in FIG. 8, the input bit position $u_4$ which is reserved for CRC is the least reliable bit position which is not frozen.

The code is composed of frozen input bits, $u_1$, $u_2$, $u_3$, $u_5$ and unfrozen input bits $u_4$, $u_6$, $u_7$, $u_8$ which may be determined prior to the CRC operation and polar encoding. Also, $u_4$ is a CRC bit which may be obtained by an XOR summation of all other unfrozen bits. It should be noted that any CRC encoding function, including single or multiple CRCs, may also be employed.

The particular component codes for CRC operation may be selected, such as the selection criteria and procedures described herein. For example, one full-rate (e.g., a code rate=1 node) component polar code may be selected according to the available parameters. In FIG. 7, this corresponds to the component polar code starting at $u_7$ and $u_8$. Then, for example, the output code bits of the full rate component code, $v_7$, $v_8$, may be grouped with the other remaining unfrozen or coded bits, such as $u_6$ which is another full-rate component code. In FIG. 8, $u_6$ may also be selected as a full-rate component code. With the selected coded bits grouped accordingly, a single CRC bit may be calculated. As shown in FIG. 8, the CRC bit may be calculated as $u_6 \oplus v_7 \oplus v_8$ and inserted at bit position $u_4$. As described above, the calculated CRC bit $u_4$, first level unfrozen bit $u_6$, and the last level of the selected component code bits, $v_7$, $v_8$, may be input to the polar encoding operation (e.g., continue) in order to obtain the final output code bits $x_1, x_2, \ldots, x_8$. As another example, the polar encoding operation may start from the first level using the information bits (e.g., $u_6$, $u_7$ and $u_8$) and the CRC bit (e.g., $u_4$).

In the representative (16, 6, 1) polar encoder (e.g., N=16, K=6, C=1) of FIG. 9, frozen bit positions, unfrozen bit positions (e.g., information bit and CRC bit positions), full-rate component codes and coded bit selection for CRC operation are shown, as well as the end-to-end polar encoding configuration. In FIG. 9, input bit positions $u_1$ to $u_7$ and $u_9$ to $u_{11}$ are frozen. Input bit positions $u_{12}$ to $u_{12}$ are unfrozen information bit positions. Input bit position $u_8$ is an unfrozen bit position reserved for a CRC bit.

In FIG. 9, a full-rate component code 902 starting from $u_{13}$, $u_{14}$, $u_{15}$, $u_{16}$ may be selected and component code outputs $v_{13,2}$, $v_{14,2}$, $v_{15,2}$, $v_{16,2}$ at level i=2 are grouped with the remaining unfrozen or coded bits, such as $u_{12}$ which is another full-rate component code. In FIG. 9, $u_{12}$ may also be selected as a full-rate component code. With the selected coded bits grouped accordingly, a single CRC bit may be calculated. As shown in FIG. 9, the CRC bit may be calculated as $u_{12} \oplus v_{13,2} \oplus v_{14,2} \oplus v_{15,2} \oplus v_{16,2}$ and inserted into the first unfrozen bit position $u_8$. The representative polar encoder of FIG. 9 demonstrates that other code sizes and codes and deeper node levels, such as i=2, may be used for CRC computation as compared to the code sizes and node levels in FIG. 8. After the CRC has been attached in any (e.g., each) reserved position, encoding may be performed similarly as described above with respect to FIG. 8.

Figure 10:
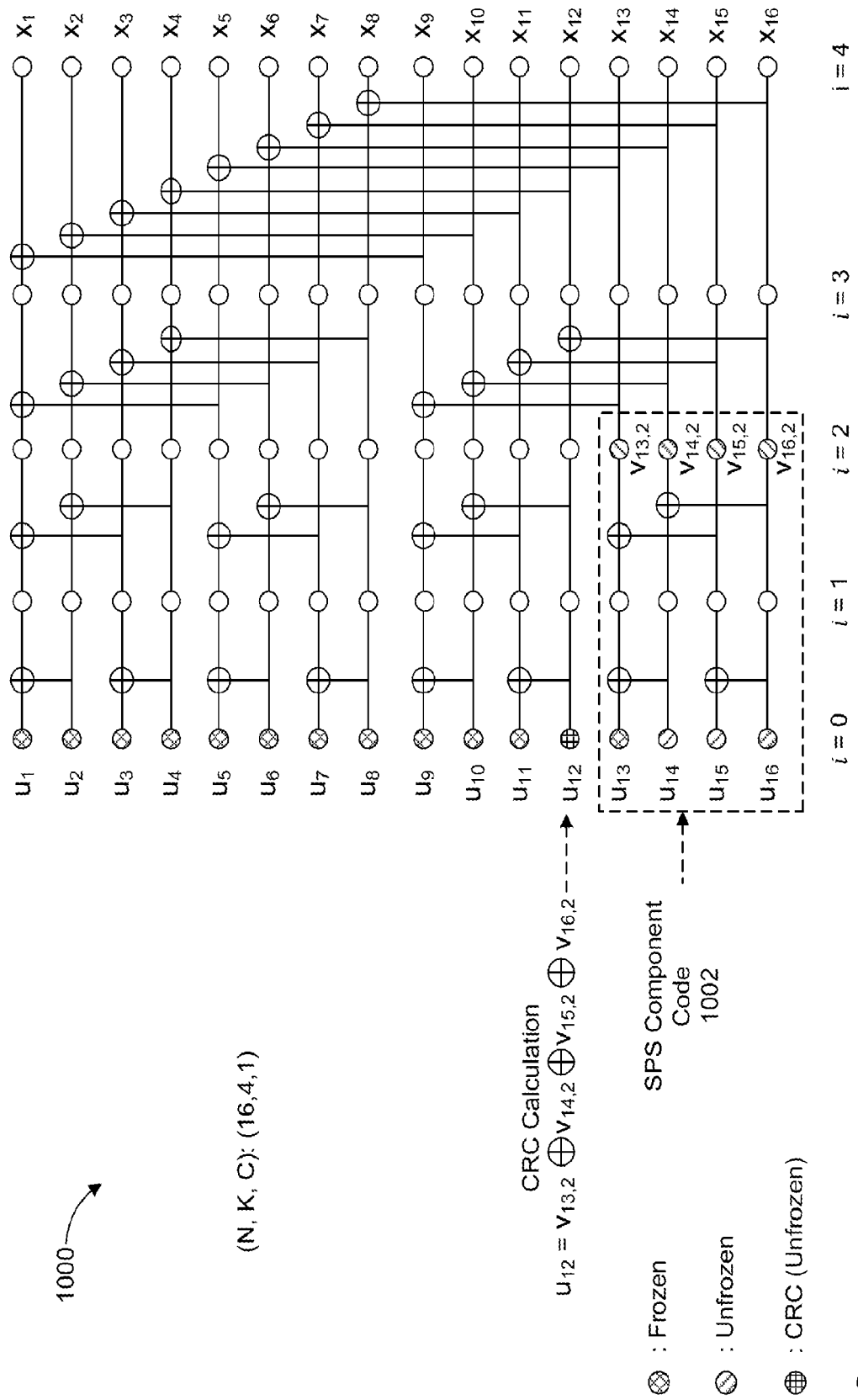
FIG. 10 is a diagram illustrating a representative polar encoder for (N, K, C):(16, 4, 1) and with SPC component code-based CRC operation.

FIG. 10 is a diagram illustrating a representative (16,4,1) polar encoder 1000 (e.g., N=16, K=4, C=1) and with SPC component code-based CRC operation. In FIG. 10, frozen bit positions, unfrozen bit positions (e.g., information bit and CRC bit positions), a SPC component code and coded bit selection for CRC operation are shown, as well as the end-to-end polar encoding configuration. In FIG. 10, input bit positions $u_1$ to $u_{11}$ and $u_{13}$ are frozen. Input bit positions $u_{14}$ to $u_{16}$ are unfrozen information bit positions. Input bit position $u_{12}$ is an unfrozen bit position reserved for a CRC bit.

In FIG. 10, a SPC component code 1002 starting from the frozen bit $u_{13}$ and the unfrozen bits $u_{14},u_{15},u_{16}$ may be selected and component code outputs $v_{13,2}, v_{14,2}, v_{15,2}, v_{16,2}$ (e.g., at level i=2) are grouped. With the selected coded bits grouped accordingly, a single CRC bit may be calculated. As shown in FIG. 10, the CRC bit may be calculated as $v_{13,2} \oplus v_{14,2} \oplus v_{15,2} \oplus v_{16,2}$ and inserted into the first unfrozen bit position $u_{12}$. After the CRC has been attached in any (e.g., each) reserved position, encoding may be performed similarly as described above with respect to FIG. 8.

Figure 11:
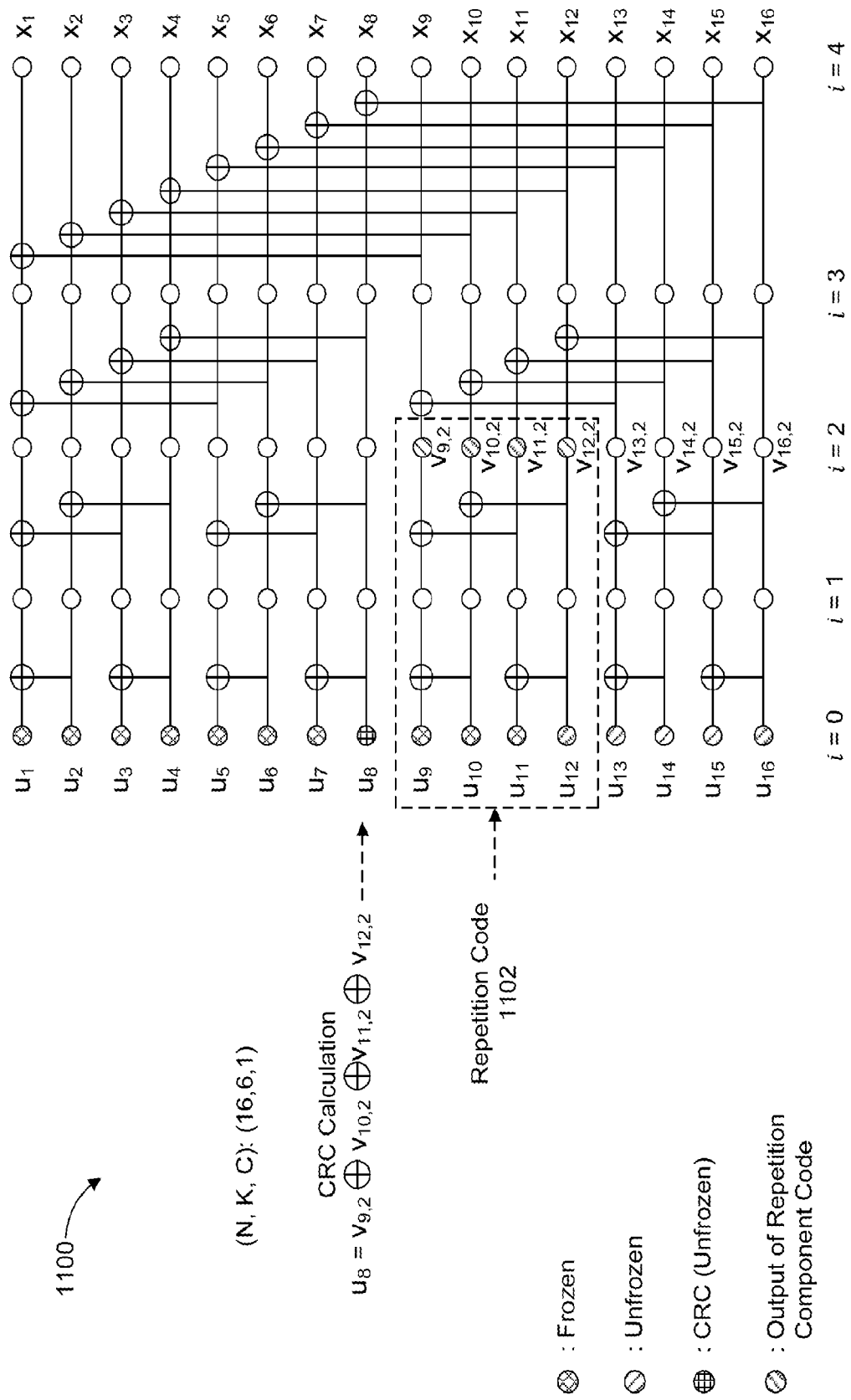
FIG. 11 is a diagram illustrating a representative polar encoder for (N, K, C):(16, 6, 1) and with repetition component code-based CRC operation.

FIG. 11 is a diagram illustrating a representative (16,6,1) polar encoder 1100 (e.g., N=16, K=6, C=1) and with repetition component code-based CRC operation. In FIG. 11, frozen bit positions, unfrozen bit positions (e.g., information bit and CRC bit positions), a repetition component code and coded bit selection for CRC operation are shown, as well as the end-to-end polar encoding configuration. In FIG. 11, input bit positions $u_1$ to $u_7$ and $u_9$ to $u_{11}$ are frozen. Input bit positions $u_{12}$ to $u_{16}$ are unfrozen information bit positions. Input bit position $u_8$ is an unfrozen bit position reserved for a CRC bit.

In FIG. 11, a repetition component code 1102 starting from the frozen bit $u_9,u_{10},u_{11}$ and the unfrozen bits $u_{12}$ may be selected and component code outputs $v_{9,2}, v_{10,2}, v_{11,2}, v_{12,2}$ (e.g., at level i=2) are grouped. With the selected coded bits grouped accordingly, a single CRC bit may be calculated. As shown in FIG. 11, the CRC bit may be calculated as $v_{9,2} \oplus v_{10,2} \oplus v_{11,2} \oplus v_{12,2}$ and inserted into the first unfrozen bit position $u_8$. After the CRC has been attached in any (e.g., each) reserved position, encoding may be performed similarly as described above with respect to FIG. 8.

In view of FIGS. 8, 9, 10 and 11, it should be understood by those of skill in the art that the encoder configurations and procedures can be extended to accommodate various other configurations and parameters in a straightforward manner.

Component Code-Based CRC and Polar Decoding Operation

Figure 12:
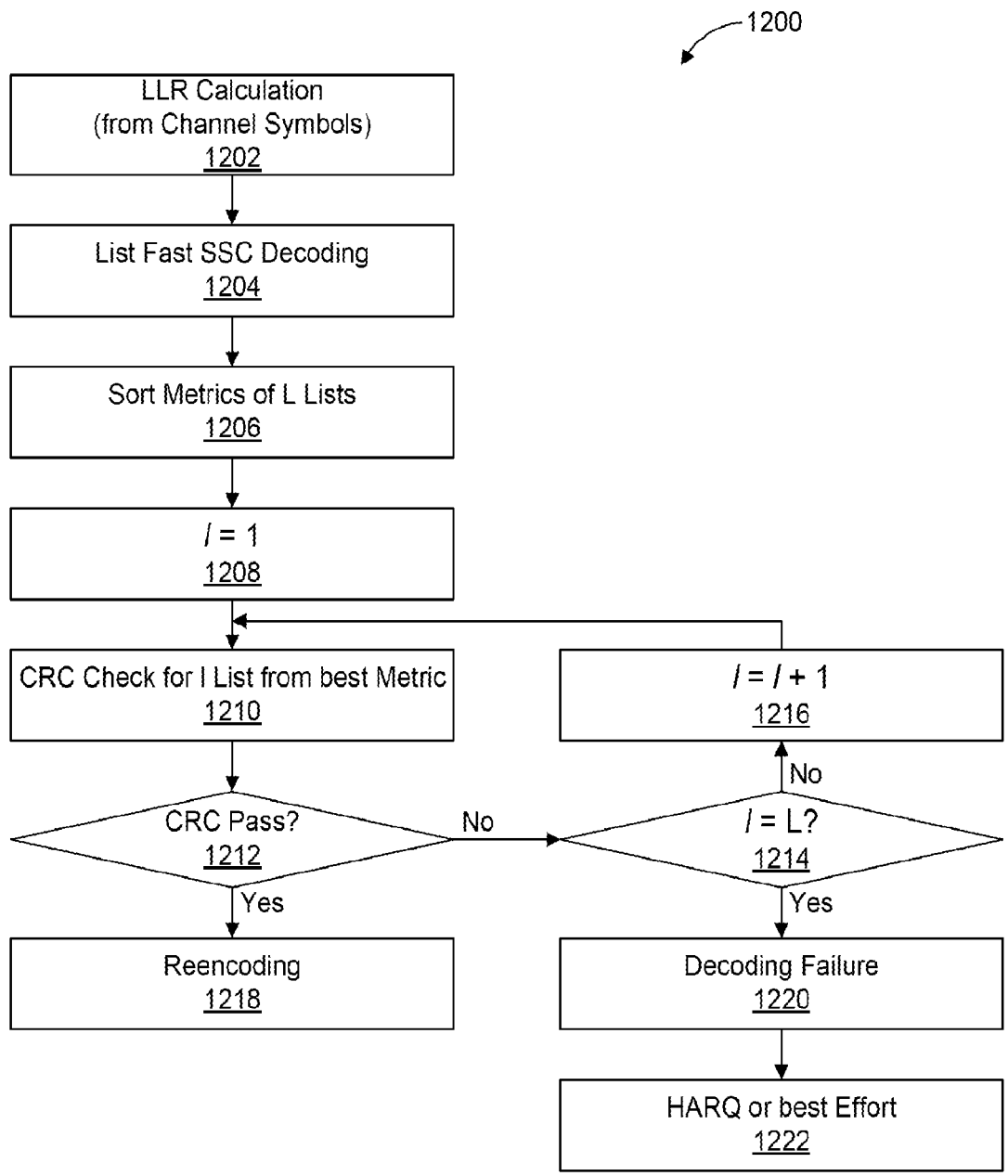
FIG. 12 is a diagram illustrating a representative procedure for component polar code-based CRC and polar decoding.

FIG. 12 is a diagram illustrating a representative procedure 1200 for component polar code-based CRC and polar decoding.

Fast List Decoding

As shown in FIG. 12, the procedure 1200 may begin with a LLR calculation of LLR values corresponding to received channel symbols at 1202. For example, the calculated LLR values may be inputs for list decoding, such as fast list-based decoding. The fast list-basted decoding at 1204 may be performed as described above. A result of the list decoding is L lists of decoded sequences and corresponding L metric values. In certain representative embodiments, the L metric values may be sorted at 1206 by ascending order (e.g., the first sorted list has the lowest path metric). The lowest path metric may correspond to the most reliable list as the output of list decoding.

CRC Check

After the lists are generated, a CRC check at 1210 is performed on any list to identify at 1212 whether the decoded sequence of the respective list may have an error or not. The CRC check may be repeatedly performed at 1208, 1210, 1212, 1214, 1216 until the last list (l=L) is checked at 1210. For example, the CRC check may begin with the list having a lowest path metric at 1208 (e.g., l=1 when the lists have been sorted in ascending order). On condition that a list passes the CRC check, the decoded sequence corresponding to the respective list which passed the CRC check may then be re-encoded at 1218 to in order to obtain final information bits (e.g., estimated information bits input to the decoder). In certain representative embodiments, the re-encoding operation may only need to be performed once using the first CRC passed list (e.g., the first list to pass the CRC check) as opposed to performing a CRC check of every candidate list as in conventional fast decoders, such as fast CA-SCL decoding.

Re-Encoding

To obtain the final information bits, the output code bits (e.g., code bits which have passed the CRC check) which may correspond $x_1$ to $x_8$ in FIG. 8 and as $x_1$ to $x_{16}$ in FIG. 9) are re-encoded (e.g., encoded again) at 1218. Parts of the output code bits which have the same index as the frozen bits may be set to a fixed value (e.g., zero) before encoding. For example, by re-encoding, the original information bits can be generated which may correspond to $u_4, u_6, u_7, u_8$ in FIG. 8, $u_8, u_{12}, u_{13}, u_{14}, u_{15}, u_{16}$ in FIG. 9, $u_{12}, u_{14}, u_{15}, u_{16}$ in FIG. 10, or $u_8, u_{12}, u_{13}, u_{14}, u_{15}, u_{16}$ in FIG. 9.

Decoding Failure

As shown in FIG. 12, there may be conditions where the CRC check is not passed for all of the L lists of decoded sequences (e.g., l=L) at 1214. For example, on condition that the final (e.g., last) list is reached and no list has been found which passes the CRC check, the decoding may be considered to be a decoding failure at 1220. The decoding failure may be announced (e.g., signaled) as a decoding error. In certain representative embodiments, the receiver (e.g., WTRU) may execute a hybrid automatic repeat request (HARQ) process with respect to the decoded information at 1222. The WTRU may send a NACK signal to the transmitter for the remaining HARQ process. In certain representative embodiments, a HARQ process may not be performed and/or a best effort decoding may be performed. A list which has the lowest path metric may be selected as the final decoded sequence and re-encoding may be performed on the sequence of the list having the lowest path metric to obtain the final information bits (e.g., estimated original information bits). For example, best effort decoding at 1222 may be used for any application and/or service in which partial errors in decoded information bits can be tolerated (e.g., allowed).

In polar decoders that use intermediate nodes in the decoding process, such as fast CA-SCL decoding, some component codes (e.g., rate-1 nodes in FIGS. 8 and 9) may not be decoded until the level or stage of the input bits (e.g., left-most nodes in FIG. 6) and a CRC check may only be performed after an additional re-encoding process. With respect to the representative polar encoders described above, a corresponding fast decoder may perform decoding until reaching the level of nodes $v_7, v_8$ in FIG. 8 or reaching nodes $v_{13,2}, v_{14,2}, v_{15,2}, v_{16,2}$ in FIG. 9, for example. In other words, a CRC check cannot be employed at these levels if CRC values were to be calculated at the encoder-side as $u_4 = u_6 \oplus u_7 \oplus u_8$ in FIG. 8 and/or $u_8 = u_{12} \oplus v_{13,2} \oplus v_{14,2} \oplus v_{15,2} \oplus v_{16,2}$ in FIG. 9. As can be seen in FIG. 8, for example, the CRC check may be performed before starting the additional re-encoding process since the CRC bit $u_4$ is calculated as $u_4 = u_6 \oplus u_7 \oplus u_8$ (in FIG. 8, $v_8 = u_8$). For example, the CRC check may be performed once the decoder reaches the level of $v_7, v_8$ in FIG. 8 (or $v_{13,2}, v_{14,2}, v_{15,2}, v_{16,2}$ in FIG. 9). After identifying a (e.g., first) list satisfying the CRC check with a best (e.g., lowest) path metric, the re-encoding process may be performed only once which can provide substantial improvement to the latency of the decoding the information bits.

Distributed CRC Operation by Multiple CRCs for Systematic Polar Coding

In certain representative embodiments, methods, apparatus and systems may be implemented for output code bits of a first encoder to be encoded by a second encoder to generate a polar code. For example, output code bits of a first non-systematic encoder may be encoded by a second non-systematic encoder to generate a systematic polar code. The output code bits of the first encoder which correspond to indices of information bits provided to the input stage of the second (e.g., same) encoder may be divided into segments and/or partitions. For example, multiple CRC codes, which may be independent CRC codes, may be generated for each respective segment or partition. As another example, multiple CRC codes, which may be independent CRC codes, may be generated for various (e.g., any) combination of segments and/or partitions. In certain representative embodiments, a first C output code bits of the first encoder (e.g., input bits to the second encoder) may be replaced with a union of any (e.g., all) generated CRC bits.

Figure 13:
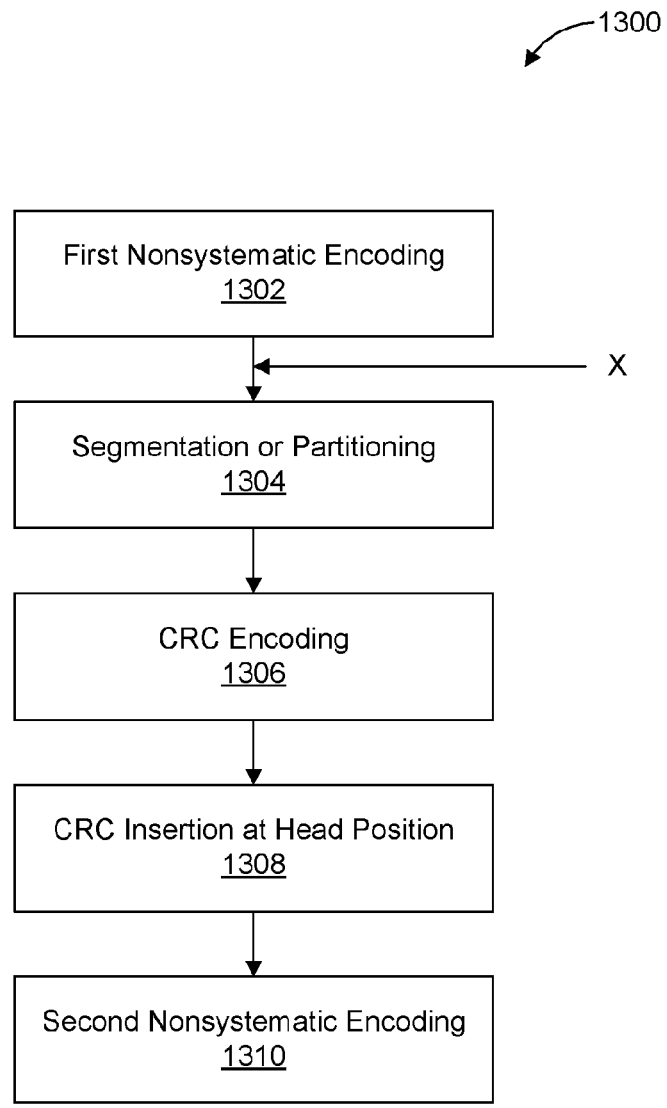
FIG. 13 is a diagram illustrating a representative procedure for distributed CRC operation and systematic polar encoding.

FIG. 13 is a diagram illustrating a representative procedure 1300 for distributed CRC operation and systematic polar encoding. The procedure shown in FIG. 13 includes two polar encoding operations.

First Polar Encoding

The first polar encoding may be performed as a non-systematic polar encoding operation at 1302. For purposes of explanation it may be assumed that a number of unfrozen bits including (e.g., all) CRC bits is K and that C is the (e.g., total) number of CRC bits. The first C unfrozen bits may be reserved for the upcoming steps and the remaining K–C unfrozen bits may be allocated for information bits. As the input bits of the first polar encoder, the first C unfrozen bits may be treated as frozen bits (e.g., set to a fixed value such as 0). The first non-systematic polar encoding operation may be performed as polar encoding without CRC bits.

Segmentation-Partitioning

As shown in FIG. 13, the output code bits of the first polar encoder may be modified and used as input bits to the second polar encoder. The second polar encoder may be a non-systematic encoder. The output code bits of the first polar encoder may be divided at 1304 based on segments (e.g., segment-based division) or partitions (e.g., partition-based division) as described herein. A number of segments and/or partitions is P and K p is a number of unfrozen bits per respective segment or partition $S_p$, then $K-C=\Sigma_{p=0}^{P-1} K_p$ and $S_p$ may not include the indices of the reserved C unfrozen bits. In certain representative embodiments, $K_p$ for p=0, . . . , P–1 may be equal and/or unequal.

For example, unfrozen bits in $S_p$ may have smaller bit indices than the unfrozen bit indices in $S_q$ for p<q, where $S_q$ is a $q^{th}$ segment. Here, unfrozen bits in $S_p$ may be decoded earlier than unfrozen bits in $S_q$ for p<q when SC based decoding is assumed. As another example, when P=1, no segmentation or partitioning may be performed, and no distributed operation is assumed.

CRC Encoding

For each segment or partition, the information bits can be encoded (e.g., independently encoded) by a CRC encoder and then CRC bits may be generated at 1306. For purposes of explanation, $C_p$ may be the CRC length for a respective segment and/or partition $S_p$, and $C=\Sigma_{p=0}^{P-1} C_p$. On condition that a uniform CRC length for all segments and/or partitions is assumed, then $C_p$ may be calculated as $C_p=C/P$. On condition that CRC p denotes a p-th set of CRC bits, $CRC_p$ may be generated by (e.g., independent) CRC encoding of the segment and/or partition $S_p$. The total CRC bits may correspond to a union (e.g., set) of all the CRC bits for the segments and/or partitions. An order of each CRC bit may follow an order of the segment and/or partition indexing.

In certain representative embodiments, CRC encoding for a respective segment or partition may be a (e.g., independent) CRC encoding for that segment or partition. For an independent CRC encoding, CRC encoding may be employed for a corresponding segment or partition only. For example, a respective segment and/or partition may be subject to an independent CRC encoding based on the procedures shown in FIGS. 7-11

In certain representative embodiments, CRC encoding for a respective segment or partition may be dependent on any previous (e.g., earlier) segments and/or partitions as other options. When there is dependency among segments (or partitions) in CRC generation, $CRC_p$ or $C_p$ may not denote the CRC bits or the number of CRC bits of the specific segment or partition. Instead, $CRC_q$(q=0, 1, . . . , Q–1) may denote the CRC bits or the number of CRC bits of the specific segment or partition which may be generated by dependent CRC encoding. $C_q$ can be basically assumed to be same as $C_p$ but may have different values than p. For example, $CRC_q$ can be generated by CRC encoding of any (e.g., all) previous segments and/or partitions $S_q$ (q=0,1, . . . , p). As another example, $CRC_0$ may be generated after adding other CRC bits to the segment or partition $S_0$ before CRC encoding. A CRC check for the errors in the other CRC bits may also be detected by $CRC_0$.

CRC Insertion

After CRC encoding, the generated CRC bits may be inserted at 1308 into reserved unfrozen bit positions. For example, all CRC bits of all segments and/or partitions may be collected and all of the collected bits may be placed to the first C unfrozen input bit positions of the second non-systematic encoder. These unfrozen input bit positions may correspond to the output code bits of the first non-systematic encoder with the same indices as the first unfrozen bits. Selection of the first unfrozen bit positions are selected as the CRC bit positions (e.g., the first C unfrozen bit positions) has the benefit that the CRC bits do not influence the coding of other code bits during the polar encoding process as can be seen, for example, in FIG. 2. Information bits which are allocated to bit indices before the CRC bits may alter the systematic property of the encoding, and hence the output code bits of the second non-systematic polar encoder may not be systematic.

Second Polar Encoding

After the CRC bits are inserted to the reserved CRC bit positions (e.g., the first C unfrozen bit positions), the CRC bits and the bits output from the first polar encoder having indices (e.g., positions) which correspond to the unfrozen bit positions of a second non-systematic polar encoder can be encoded at 1310. For example, the CRC bits and unfrozen bits of the second non-systematic polar encoder may be arranged as follows.

Segmented-Partitioned Polar Encoding Examples

Figure 14:
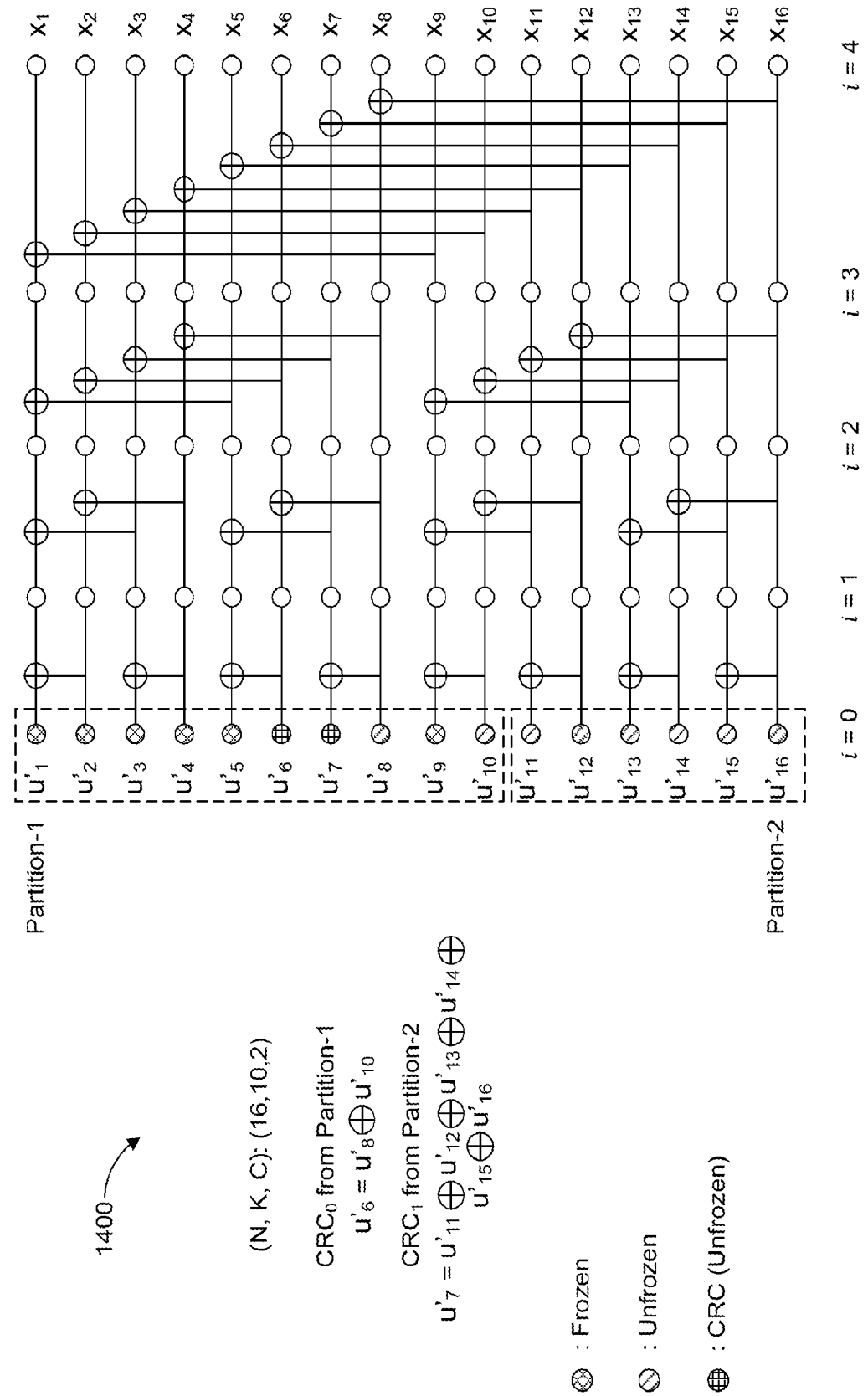
FIG. 14 is a diagram illustrating a representative polar encoder for (N, K, C):(16, 10, 2) and with CRC partitioning.
Figure 15:
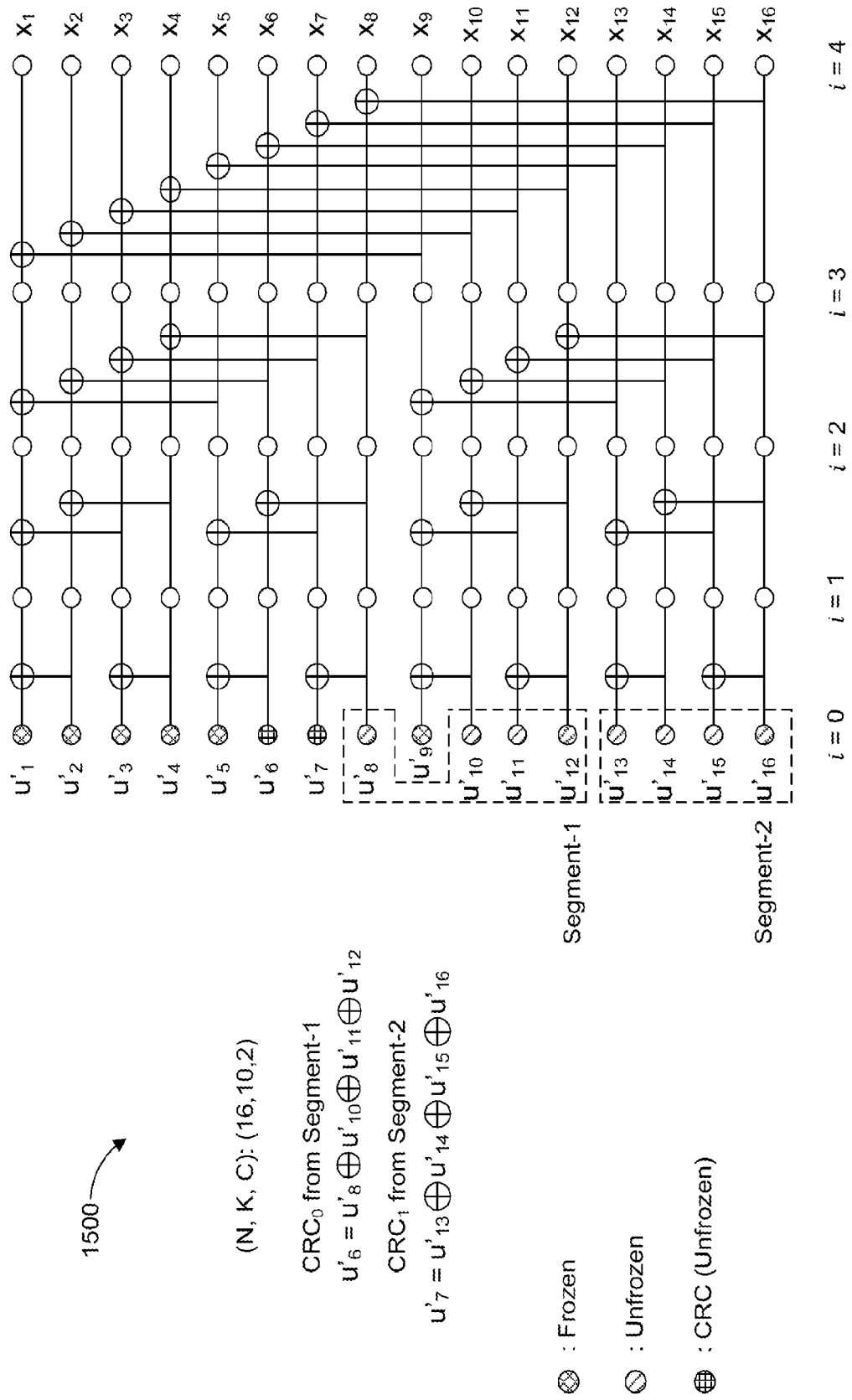
FIG. 15 is a diagram illustrating a representative polar encoder for (N, K, C):(16, 10, 2) and with CRC segmentation.
Figure 16:
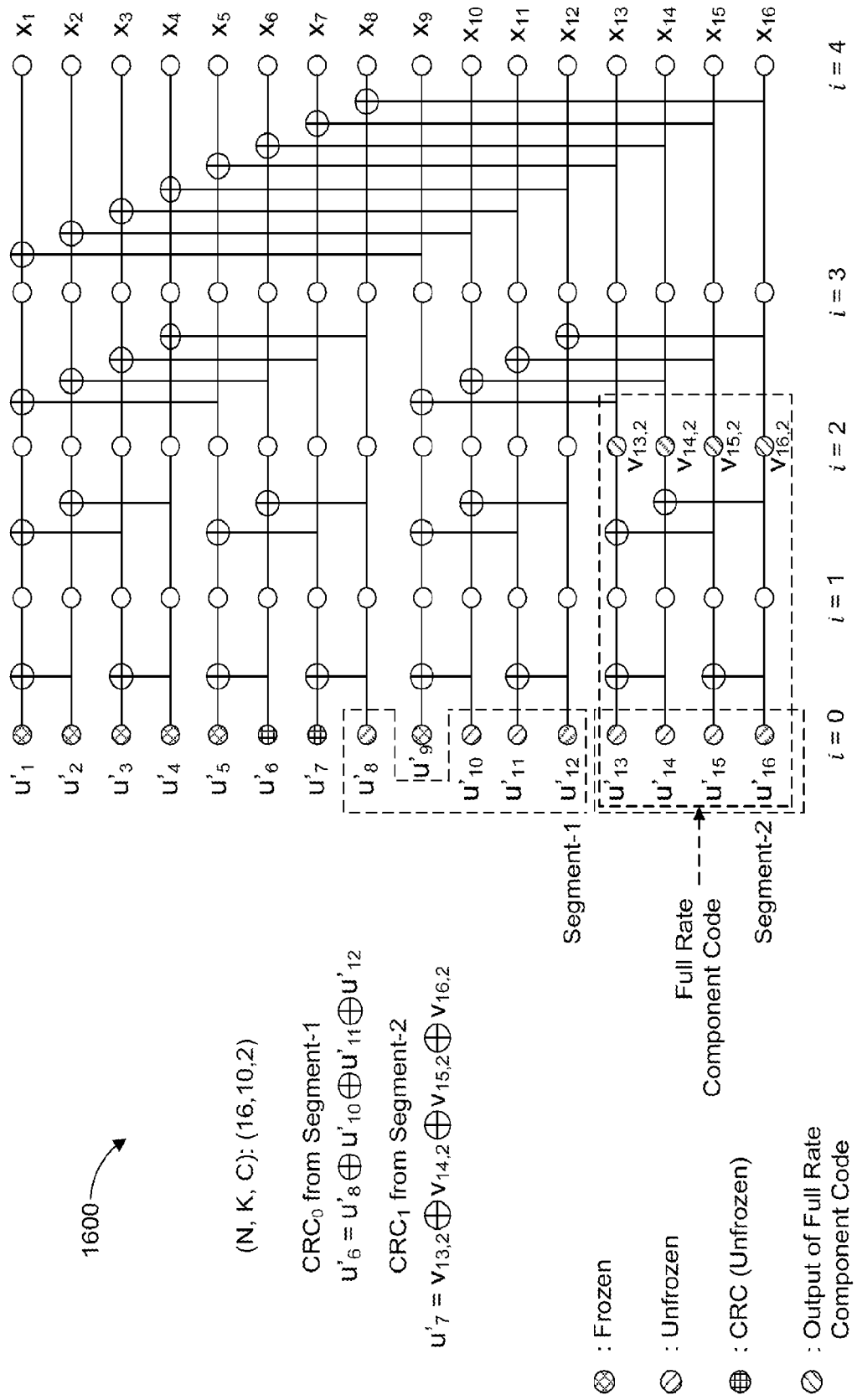
FIG. 16 is a diagram illustrating a representative polar encoder for (N, K, C):(16, 10, 2) and with component code-based CRC operation and segmentation.

FIG. 14 is a diagram illustrating a representative polar encoder 1400 for (N, K, C):(16, 10, 2) and with CRC partitioning. FIG. 15 is a diagram illustrating a representative polar encoder 1500 for (N, K, C):(16, 10, 2) and with CRC segmentation. FIG. 16 is a diagram illustrating a representative polar encoder 1600 for (N, K, C):(16, 10, 2) and with component code-based CRC operation and segmentation.

In certain representative embodiments, the representative polar encoders of any of FIGS. 14, 15 and/or 16 may be implemented as the second polar encoder in a systematic polar encoding procedure (e.g., FIG. 13). In other representative embodiments, the representative polar encoders of any of FIGS. 14, 15 and/or 16 may be implemented in a non-systematic polar encoding procedure (e.g., FIG. 7).

For example, the representative (16, 10, 2) polar encoder (e.g., N=16, K=10, C=2) of FIG. 14 may be implemented as a second polar encoder in the procedure of FIG. 13. The unfrozen bit positions of the first (e.g., non-systematic) polar encoder may be referred to as A={$u_6, u_7, u_8, u_{10}, u_{11}, u_{12}, u_{13}, u_{14}, u_{15}, u_{16}$}. Upon condition that a same CRC length is assumed, $C_0=C_1=1$ and $CRC_0=\{u_6\}$, $CRC_1=\{u_7\}$ for the first polar encoder. Unfrozen bit positions for CRC bits are reserved among the unfrozen bit positions. For example, before the first non-systematic encoding the CRC bits may be set as $u_6=0$, $u_7=0$. After the first (e.g., non-systematic) encoding, $c_1, c_2, \ldots, c_{16}$ may correspond to the output code bits of the first encoder. As shown in FIG. 14, $u_1', u_2', \ldots, u_{16}'$ may refer to the input bits to the second (e.g., non-systematic) encoder. The frozen bits input to the second encoder may be set as $u_1'=0, u_2'=0, u_3'=0, u_4'=0, u_5'=0, u_9'=0$. The unfrozen information bits may be set such that $u_6'=c_6, u_7'=c_7, u_8'=c_8, u_{10}'=c_{10}, u_{11}'=c_{11}, u_{12}'=c_{12}, u_{13}'=c_{13}, u_{14}'=c_{14}, u_{15}'=c_{15}, u_{16}'=c_{16}$, with respect to the output bits of the first encoder. Each of $u_6'$ and $u_7'$ may not need to be set as (e.g., substituted by) $c_6$ and $c_7$ because they will be set as according to the CRC calculations which is to be performed. The CRC encoding and insertion to head position may be performed such that $CRC_0=\{u_6'\}$, $CRC_1=\{u_7'\}$ for the second polar encoder.

For example, on condition that partitioning with unequal length is assumed, $S_0=\{u_8', u_{10}'\}$ and $S_1=\{u_{11}', u_{12}', u_{13}', u_{14}', u_{15}', u_{16}'\}$ as shown in FIG. 14. For a one-bit CRC encoding operation, the CRC bit values may be calculated as: $u_6'=u_8'\oplus u_{10}'$, $u_7'=u_{11}'\oplus u_{12}'\oplus u_{13}'\oplus u_{14}'\oplus u_{15}'\oplus u_{16}'$.

As another example, on condition that segmentation with the same segment length is assumed, $S_0=\{u_8', u_{10}', u_{11}', u_{12}'\}$ and $S_1=\{u'_{13}, u'_{14}, u'_{15}u'_{16}\}$ as shown in FIG. 15. For a one-bit CRC encoding operation, the CRC bit values may be calculated as: $u_6'=u_8'\oplus u_{10}'\oplus u_{11}'\oplus u_{12}'$, $u_7'=u_{13}'\oplus u_{14}'\oplus u_{15}'\oplus u_{16}'$.

After calculating the CRC bit values, the calculated CRC bit values may be inserted to the reserved CRC positions (e.g., $CRC_0=\{u_6'\}$, $CRC_1=\{u_7'\}$ for the second polar encoder). A second (e.g., non-systematic) polar encoding may then be performed based on the input bits $u_1', u_2', \ldots, u_{16}'$ as shown in FIGS. 14 and 15.

As shown in FIG. 16, $u_1', u_2', \ldots, u_{16}'$ may refer to the input bits to the second (e.g., non-systematic) encoder. The unfrozen bit positions of the first (e.g., non-systematic) polar encoder may be referred to as A={$u_6, u_7, u_9, u_{10}, u_{11}, u_{12}, u_{13}, u_{14}, u_{15}, u_{16}$}. Upon condition that a same CRC length is assumed, $C_0=C_1=1$ and $CRC_0=\{u_6\}$, $CRC_1=\{u_7\}$ for the first polar encoder. Unfrozen bit positions for CRC bits are reserved among the unfrozen bit positions. For example, before the first non-systematic encoding the CRC bits may be set as $u_6=0$, $u_7=0$. After the first (e.g., non-systematic) encoding, $c_1, c_2, \ldots, c_{16}$ may correspond to the output code bits of the first encoder. The unfrozen information bits may be set such that $u_6'=c_6, u_7'=c_7, u_8'=c_8, u_{10}'=c_{10}, u_{11}'=c_{11}, u_{12}'=c_{12}, u_{13}'=c_{13}, u_{14}'=c_{14}, u_{15}'=c_{15}, u_{16}'=c_{16}$ with respect to the output bits of the first encoder. Each of $u_6'$ and $u_7'$ may not need to be set as (e.g., substituted by) $c_6$ and $c_7$ because they will be set as according to the CRC calculations which is to be performed. The CRC encoding and insertion to head position may be performed such that $CRC_0=\{u_6'\}$, $CRC_1=\{u_7'\}$ for the second polar encoder.

For example, on condition that segmentation with the same segment length is assumed, $S_0=\{u_8', u_{10}', u_{11}', u_{12}'\}$ and $S_1=\{u_{13}', u_{14}', u_{15}', u_{16}'\}$as shown in FIG. 16. In FIG. 16, component code-based CRC may be calculated for any of the segments (e.g., separately). For a one-bit CRC encoding operation in which a full-rate component code-based CRC calculation is used for $S_1$, the CRC bit values may be calculated as:$u_6'=u_8'\oplus u_{10}'\oplus u_{11}'\oplus u_{12}'$, and $u_7'=v_{13,2}\oplus v_{14,2}\oplus v_{15,2}\oplus v_{16,2}$. For brevity, FIG. 16 shows that the CRC calculation for Segment-2 (e.g., for $S_1$) is based on (e.g., selection of) a full-rate component code but those skilled in the art should understand that other component code types as described herein may be used in the CRC calculation for input to the second polar encoder, such as the SPC and repetition code types shown and described with respect to FIGS. 10 and 11.

While the foregoing description has been made of the representative procedure shown in FIG. 13 in which systematic polar encoding is performed using a configuration in which two non-systematic polar encoders are cascaded, there are other systematic polar encoding structures to generate systematic polar codes which are known in the art, such as those described in "Efficient algorithms for systematic polar encoding," IEEE Comm. Let., vol. 20, no. 1, January 2016. In certain representative embodiments, a procedure which dovetails from X in FIG. 13 may perform a calculated distributed CRC operation according to the description above using these other systematic polar encoding structures, which may characterize the input (e.g., output bits from X in FIG. 13) to the second systematic polar encoder, such as by using these other systematic polar encoding structures and/or algorithms. The segmentation and/or partitioning step of FIG. 13 may be preceded by using these other systematic polar encoding structures and/or algorithms rather than a first polar encoder which is cascaded with a (e.g., same) second polar encoder.

Distributed CRC Polar Decoding Procedure

Once the SC based decoding procedure is finished for each segment and/or partition (e.g., list and path metric generation and/or sorting thereof), a corresponding CRC check for the segment and/or partition can be performed. In representative embodiments where CRC bits are encoded for a combination of segments and/or partitions, the CRC check can be performed once a SC-based decoding procedure for all elements (e.g., segments and/or partitions) within a respective combination are finished.

In certain representative embodiments, any (e.g., all) CRC bits may be decoded and/or prepared in the decoding process of the first segment and/or first partition when any (e.g., all) CRC bits were inserted into head position during encoding. The head position may be included in the first segment or first partition. These decoded CRC bits can be used for CRC checking for remaining segments or partitions. CRC check can be done in a distributive manner for finalization of decoding each segment or partition after the first one.

Figure 17:
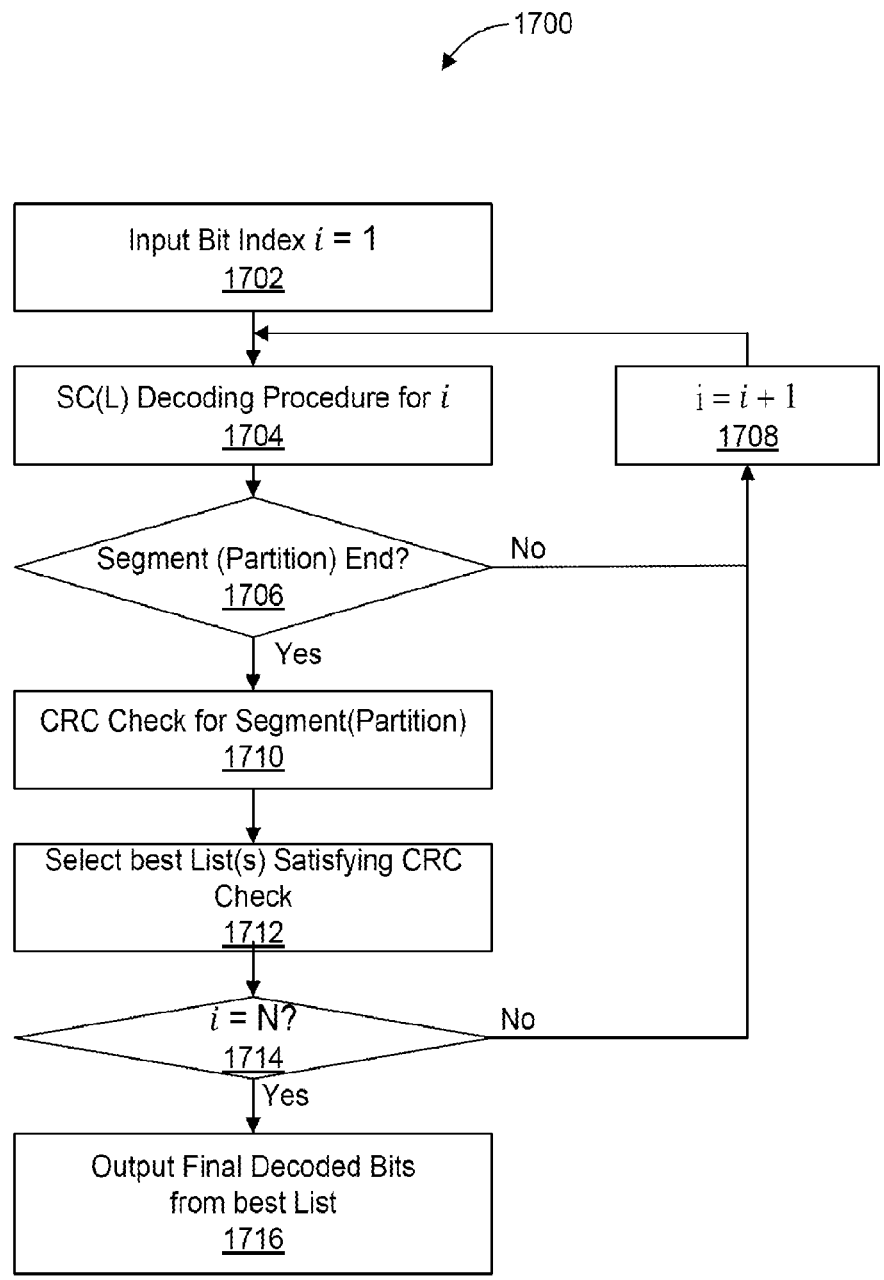
FIG. 17 is a diagram illustrating a representative procedure for distributed CRC operation in fast CRC Aided-Successive Cancellation List (CA-SCL) decoding.

FIG. 17 is a diagram illustrating a representative procedure for distributed CRC operation in fast CRC Aided-Successive Cancellation List (CA-SCL) decoding. FIG. 17 shows a SC or SCL decoding method for distributed CRC. In certain representative embodiments, the procedure begins with the input bit index i=1 at 1702, SC or SCL decoding is performed at 1704 for each i until the end of the segment and/or partition is reached at 1706 and 1708. After, a CRC check is performed for the segment or partition at 1710. Selection of the best (e.g., lowest path metric) one or more lists satisfying the CRC check is performed for the segment and/or partition at 1712. For example, after multiple lists (or paths) satisfying CRC check, the lists (or paths) with smaller (e.g., smallest) path metric are selected. Selection of the best (e.g., lowest path metric) one or more lists satisfying the CRC check may cause path pruning after the CRC check. On condition that a number of selected lists (or paths) is less than the list size L, the complexity and latency reduction by distributed CRC operation can be maximized by selecting just one path. For example, the one or more selected lists may be initial lists in the decoding procedure of a next segment and/or partition. After the input bit index i=N at 1714, final decoded bits may be output from the best list among the one or more selected lists at 1716.

In certain other representative embodiments, any of the best paths (e.g., any of the smallest path metric lists) may be selected without performing CRC check. If any of the selected lists (or paths) pass the CRC check, the final decoded bits may be output from any of the selected best lists (or paths). If there are no selected lists (or paths) pass the CRC check, the decoding procedure may be stopped early (e.g., failed). For example, a HARQ message (e.g., NACK) may be signalled when (e.g., after) the decoding procedure has been stopped.

As described above, the SC or SCL decoding procedure may be performed based on units of single bits as denoted by the index i. In certain representative embodiments, the decoding procedure may be modified to be based on units of component code blocks using fast CA-SCL decoding as described above with respect to FIGS. 4 to 6, for example.

Numerical Results

Figure 18:
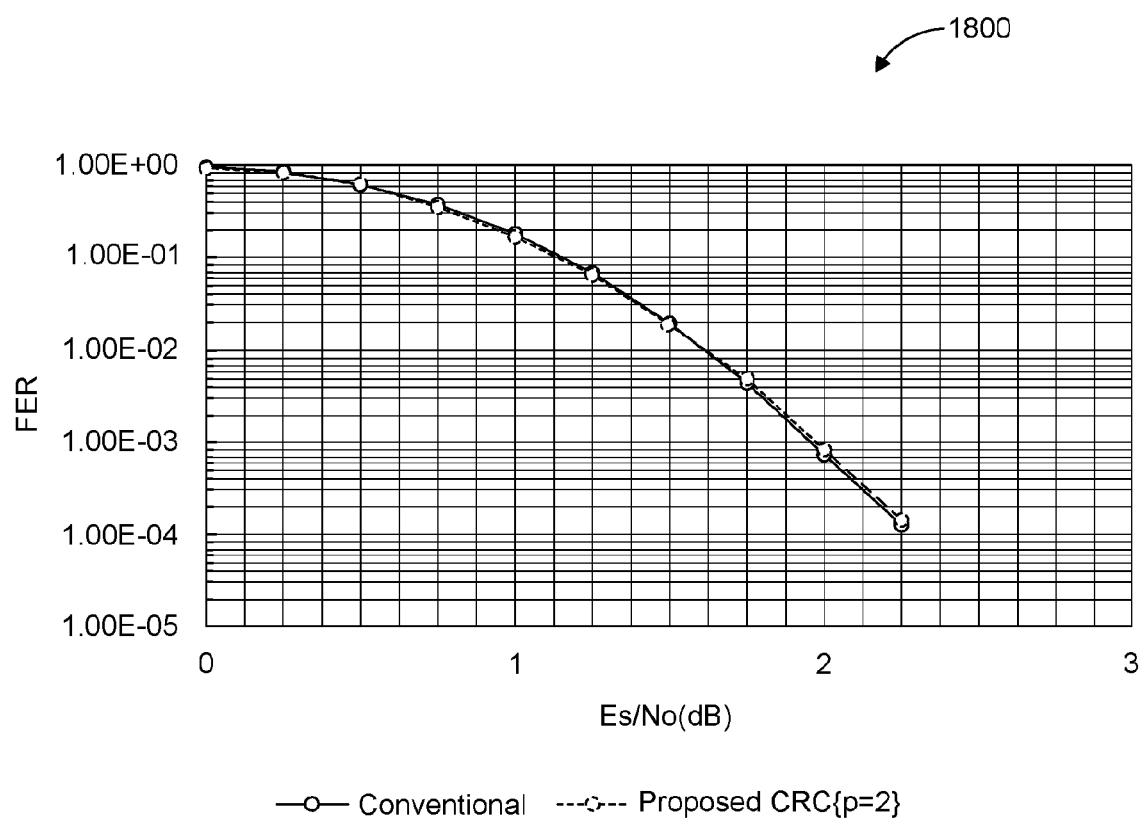
FIG. 18 is a diagram illustrating a representative comparison of error performance between a conventional CRC attachment method and a distributed CRC operation.

FIG. 18 is a diagram illustrating a representative comparison 1800 of error performance between a conventional CRC operation and a distributed CRC operation. Simulation conditions are shown in Table 1 below. FIG. 18 shows a frame error rate (FER) performance comparison between a conventional CRC attachment method and a distributed CRC operation by multiple CRCs as described herein. In the conventional CRC attachment method, CRC bits are generated by single CRC encoder and are attached to the tail of the information bits. As can be seen in FIG. 18, there is no or negligible FER performance degradation observed for the distributed CRC operation by multiple CRCs at a FER of $10^{-4}$.

TABLE 1

| Simulation conditions | |
|---|---|
| N | 1024 |
| K | 512 including CRC |
| code type | systematic |
| code construction | NR sequence |
| Distribution method | Partitioning |
| P for partitioning | 2 |
| CRC | 16 bits for conventional |
| | 8 bits for each partition |
| channel | AWGN |
| modulation | Gray mapping QPSK |
| minimum error count | 100 |
| decoding method | CASCL (L = 8) |
| Selection of list | Only one best list selected by CRC check |

A memory requirement for fast CA-SCL decoding by the distributed CRC operation may be derived by the following equation.

$$M_{req} = \left( \sum_{k=1}^{P-1} \frac{N}{2^k} + \left( \frac{N}{2^{P-1}} - 1 \right) L \right) Q_\alpha + L Q_{PM} + \sum_{k=1}^{P-2} \frac{N}{2^k} + \left( \frac{N}{2^{P-2}} - 1 \right) L$$

The memory requirement for fast CA-SCL decoding by the distributed CRC operation may be reduced to about half in case of P=2 as shown, for example, in "Decoder Partitioning: Towards Practical List Decoding of Polar Codes," IEEE Trans. Commun., vol. 66, no. 9, pp. 3749-3759, September 2018. In the foregoing equation, $M_{req}$ denotes a memory requirement and $Q_a$ and $Q_{PM}$ denote the quantization level (in bits) of LLR values and path metrics, and L denotes a list length (e.g., size).

In the following FIGS. 19-28, the representative procedures may be implemented by any of a base station, such as a gNB 180, and/or a WTRU 102.

Figure 19:
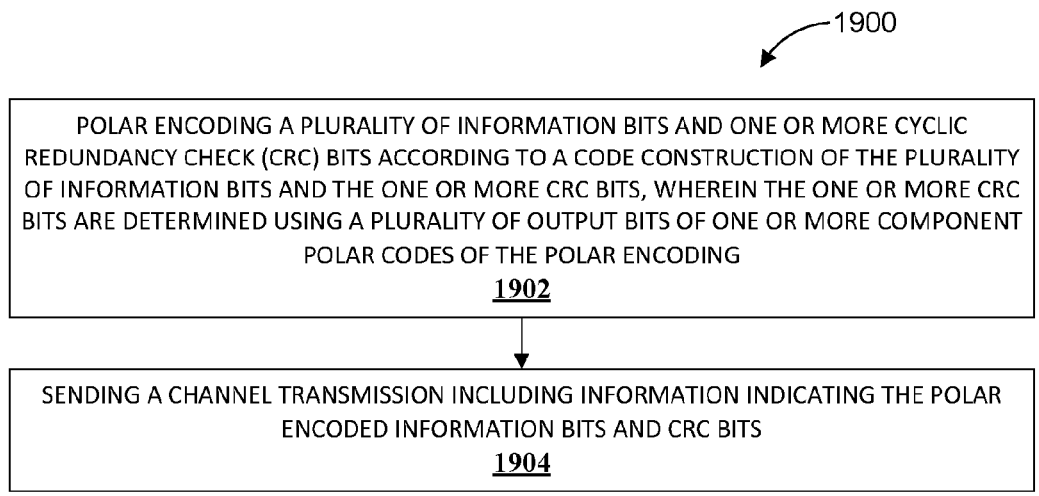
FIG. 19 is a diagram illustrating a representative procedure for polar encoding of information bits and one or more CRC bits determined from one or more component codes.

FIG. 19 is a diagram illustrating a representative procedure 1900 for polar encoding of information bits and one or more CRC bits determined from one or more component codes. At 1902, a WTRU 102 may perform polar encoding of a plurality of information bits and one or more cyclic redundancy check (CRC) bits according to a code construction of the plurality of information bits and the one or more CRC bits. For example, the one or more CRC bits may be determined using a plurality of output bits of one or more component polar codes of the polar encoding as described herein. After 1904, the WTRU 102 may proceed to send (e.g., to a base station or another WTRU 102) a channel transmission including information indicating the polar encoded information bits and CRC bits.

In certain representative embodiments, the WTRU may determine the code construction from among a plurality of code constructions using any of any of a modulation and coding scheme (MCS), a code rate, a decoding method, and/or a target latency associated with the channel transmission. For example, the WTRU may receive information indicating the MCS, code rate, decoding method, and/or target latency via RRC, MAC CE, and/or DCI.

In certain representative embodiments, the WTRU 102 may receive information indicating the code construction and/or determine the code construction. For example, the code construction may include a plurality of frozen bits and a plurality of unfrozen bits which correspond to input bit positions for the polar encoding. For example, the plurality of unfrozen bits may include the plurality of information bits and the one or more CRC bits.

In certain representative embodiments, the plurality of output bits of the one or more component polar codes may be associated with the polar encoding of one or more of the plurality of information bits and/or one or more of the frozen bits as described herein. As an example, the one or more component polar codes may be (e.g., determined to be) associated with any of a modulation and coding scheme (MCS), a code rate, a decoding method, and/or a target latency associated with the channel transmission.

In certain representative embodiments, the one or more component polar codes may include any of a full-rate component polar code, a zero-rate component polar code, a repetition component polar code, and/or a single parity check component polar code. For example, a code rate of a full-rate component polar code may be one as described herein. For example, a code rate of a zero-rate component polar code may be zero as described herein. For example, a repetition component polar code may include a single information bit, a code rate of the repetition component polar code may be $1/N_v$, and $N_v$ is a length (e.g., number of bits)

of the repetition component polar code. For example, a single parity check component polar code may include a single parity check bit, a code rate of the single parity check component polar code may be $(N_v-1)/N_v$, and $N_v$ is a length of the repetition component polar code.

In certain representative embodiments, the code rate of a component polar code may be a ratio of (1) a number of the information bits or unfrozen bits of the one of the component polar codes to (2) a number of frozen bits of the component polar code.

In certain representative embodiments, the WTRU 102 may determine one or more groups of the plurality of output bits of the component polar codes based on a timing index of the plurality of output bits. The WTRU 102 may determine the one or more CRC bits from the determined one or more groups. For example, at least one of the CRC bits may be determined from two or more of the output bits which are associated with different timing indices of the polar encoding.

In certain representative embodiments, a first one of the CRC bits may be determined from a first set of the output bits of the one or more component polar codes having a first code rate. A second one of the CRC bits may be determined from a second set of the output bits of the one or more component polar codes having a second code rate. For example, code rates of component codes may different. The first code rate may differ from the second code rate.

In certain representative embodiments, the one or more CRC bits are inputs for polar encoding at head (e.g., lowest input bit index) unfrozen bit positions of the code construction equal to a number of the CRC bits. For example, the head unfrozen bits may not influence the other code bits during the polar encoding of the information bits.

In certain representative embodiments, the WTRU 102 may send another channel transmission including information indicating characteristics of the polar encoding. For example, the other channel transmission may include information indicating the code construction, such as, but not limited to, bit positions and timing indices of the output bits of the component polar codes used to determine the one or more CRC bits.

In certain representative embodiments, the WTRU 102 may include information indicating characteristics of the polar encoding in the channel transmission at 1904. For example, the WTRU 102 may include information indicating the code construction, such as bit positions and timing indices of the output bits of the component polar codes used to determine the one or more CRC bits.

Figure 20:
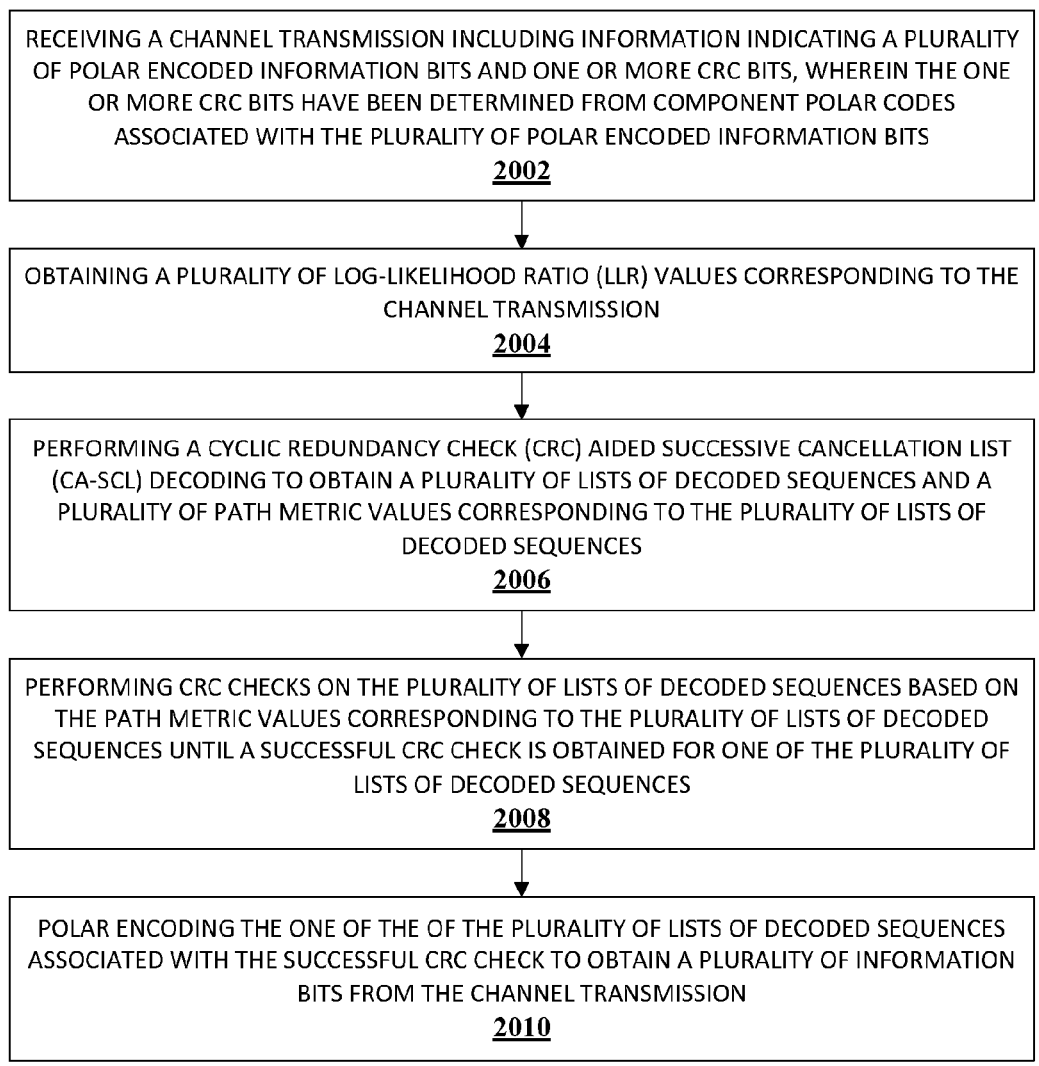
FIG. 20 is a diagram illustrating a representative procedure for decoding of polar encoded information bits using one or more CRC bits determined from one or more component codes.

FIG. 20 is a diagram illustrating a representative procedure 2000 for decoding of polar encoded information bits using one or more CRC bits determined from one or more component codes. At 2002, a WTRU 102 may receive (e.g., from a base station or another WTRU 102) a channel transmission including information indicating a plurality of polar encoded information bits and one or more CRC bits. The one or more CRC bits may be (e.g., presumed to have been) determined from component polar codes associated with the plurality of polar encoded information bits. At 2004, the WTRU 102 may obtain a plurality of log-likelihood ratio (LLR) values corresponding to the channel transmission (e.g., symbols associated with the channel transmission). After 2004, the WTRU 102 may perform a cyclic redundancy check (CRC) aided successive cancellation list (CA-SCL) decoding at 2006 to obtain a plurality of lists of decoded sequences and a plurality of path metric values corresponding to the plurality of lists of decoded sequences. For example, CRC bit checking may be performed as described herein. At 2008, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences. At 2010, the WTRU 102 may polar encode the one of the of the plurality of lists of decoded sequences associated with the successful CRC check to obtain a plurality of information bits from the channel transmission.

In certain representative embodiments, no successful CRC check may be obtained at 2008. For example, the WTRU may proceed to send information indicating a negative acknowledgment (NACK) for a HARQ process associated with the information bits and/or channel transmission. As another example, the WTRU 102 may perform a best effort decoding using the decoded sequence corresponding to one of the lists having a lowest path metric value.

In certain representative embodiments, the WTRU may determine the code construction from among a plurality of code constructions using any of any of a modulation and coding scheme (MCS), a code rate, a decoding method, and/or a target latency associated with the channel transmission. For example, the WTRU may receive information indicating the MCS, code rate, decoding method, and/or target latency via RRC, MAC CE, and/or DCI.

In certain representative embodiments, the plurality of output bits of the one or more component polar codes may be associated with the polar encoding of one or more of the plurality of information bits and/or one or more of the frozen bits as described herein. As an example, the one or more component polar codes may be (e.g., determined to be) associated with any of a modulation and coding scheme (MCS), a code rate, a decoding method, and/or a target latency associated with the channel transmission.

In certain representative embodiments, the one or more component polar codes may include any of a full-rate component polar code, a zero-rate component polar code, a repetition component polar code, and/or a single parity check component polar code. For example, a code rate of a full-rate component polar code may be one as described herein. For example, a code rate of a zero-rate component polar code may be zero as described herein. For example, a repetition component polar code may include a single information bit, a code rate of the repetition component polar code may be $1/N_v$, and $N_v$ is a length (e.g., number of bits) of the repetition component polar code. For example, a single parity check component polar code may include a single parity check bit, a code rate of the single parity check component polar code may be $(N_v-1)/N_v$, and $N_v$ is a length of the repetition component polar code.

In certain representative embodiments, the code rate of a component polar code may be a ratio of (1) a number of the information bits or unfrozen bits of the one of the component polar codes to (2) a number of frozen bits of the component polar code.

In certain representative embodiments, a first one of the CRC bits may be determined from a first set of the output bits of the one or more component polar codes having a first code rate. A second one of the CRC bits may be determined from a second set of the output bits of the one or more component polar codes having a second code rate. For example, code rates of component codes may different. The first code rate may differ from the second code rate.

In certain representative embodiments, the one or more CRC bits are inputs for polar encoding at head (e.g., lowest input bit index) unfrozen bit positions of the code construction equal to a number of the CRC bits. For example, the head unfrozen bits may not influence the other code bits during the polar encoding of the information bits.

In certain representative embodiments, the WTRU 102 may receive another channel transmission (e.g., from a base station or another WTRU) including information indicating characteristics of the polar encoding. For example, the other channel transmission may include information indicating bit positions and timing indices of the output bits of the component polar codes used to determine the one or more CRC bits.

In certain representative embodiments, the WTRU 102 may receive information indicating characteristics of the polar encoding in the channel transmission at 2002. For example, the WTRU 102 may receive information indicating the code construction, such as, but not limited to, bit positions and timing indices of the output bits of the component polar codes used to determine the one or more CRC bits.

Figure 21:
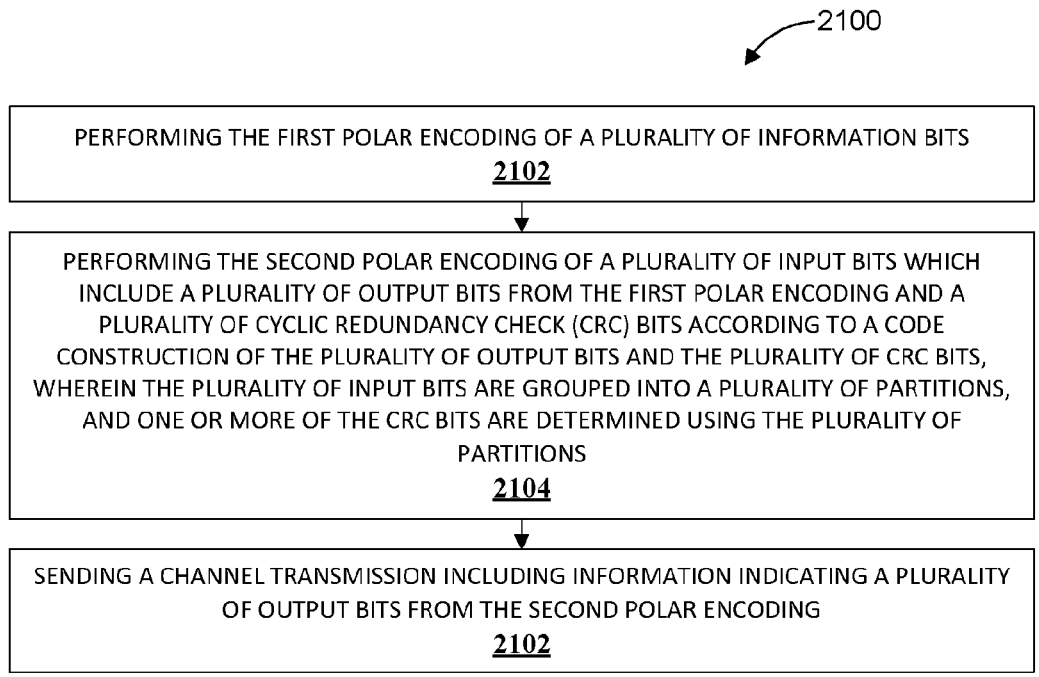
FIG. 21 is a diagram illustrating a representative procedure for systematic polar encoding of information bits and one or more CRC bits using partitioning.

FIG. 21 is a diagram illustrating a representative procedure 2100 for systematic polar encoding of information bits and one or more CRC bits using partitioning. At 2102, a WTRU 102 may perform a first polar encoding of a plurality of information bits. For example, the first polar encoding at 2102 may be performed using a non-systematic polar encoder such as those described herein and/or known to those skilled in the art. At 2104, the WTRU 102 may proceed to perform a second polar encoding of a plurality of input bits. For example, the second polar encoding at 2104 may be performed using a non-systematic polar encoder such as those described herein. The input bits for the second polar encoding may include a plurality of output bits from the first polar encoding (e.g., at 2102) and a plurality of cyclic redundancy check (CRC) bits according to a code construction of the plurality of output bits and the plurality of CRC bits. The plurality of input bits may be grouped into a plurality of partitions. One or more of the CRC bits may be determined using the plurality of partitions. FIG. 14 shows an example where the input bits for the second polar encoder are grouped into two partitions (e.g., groups of input bits of different bit lengths). At 2106, the WTRU 102 may send (e.g., to a base station or another WTRU 102) a channel transmission including information indicating a plurality of output bits from the second polar encoding of 2104.

In certain representative embodiments, the WTRU 102 may determine the code construction from among a plurality of code constructions using any of any of a modulation and coding scheme (MCS), a code rate, a decoding method, and/or a target latency associated with the channel transmission. For example, the WTRU may receive information indicating the MCS, code rate, decoding method, and/or target latency via RRC, MAC CE, and/or DCI.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, a first partition may include a first plurality of frozen and unfrozen bits which correspond to the input bit positions for the second polar encoding and/or a second partition may include a second plurality of unfrozen bits which correspond to the input bit positions for the second polar encoding. For example, any of the first partition and/or the second partition may include one or more of the CRC bits. As another example, a CRC bit in one partition may be calculated from bits of another partition. An example of which is shown in FIG. 14.

Figure 22:
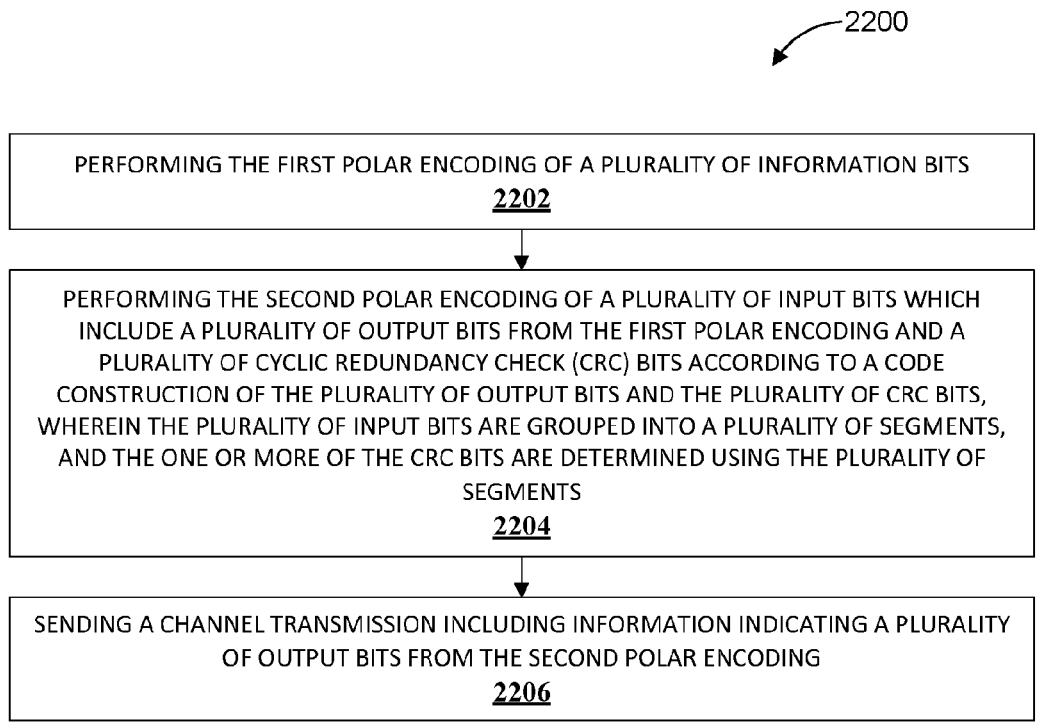
FIG. 22 is a diagram illustrating a representative procedure for systematic polar encoding of information bits and one or more CRC bits using segmentation.

FIG. 22 is a diagram illustrating a representative procedure 2200 for systematic polar encoding of information bits and one or more CRC bits using segmentation. At 2202, a WTRU 102 may perform a first polar encoding of a plurality of information bits. For example, the first polar encoding at 2102 may be performed using a non-systematic polar encoder such as those described herein and/or known to those skilled in the art. At 2204, the WTRU 102 may proceed to perform a second polar encoding of a plurality of input bits which include a plurality of output bits from the first polar encoding and a plurality of cyclic redundancy check (CRC) bits according to a code construction of the plurality of output bits and the plurality of CRC bits. The plurality of input bits may be grouped into a plurality of segments. One or more CRC bits may be determined using the plurality of segments. FIG. 15 shows an example where the input bits for the second polar encoder are segmented into two segments (e.g., groups of input bits of different bit lengths). At 2206, the WTRU 102 may send (e.g., to a base station or another WTRU 102) a channel transmission including information indicating a plurality of output bits from the second polar encoding of 2204.

In certain representative embodiments, the WTRU 102 may determine the code construction from among a plurality of code constructions using any of any of a modulation and coding scheme (MCS), a code rate, a decoding method, and/or a target latency associated with the channel transmission. For example, the WTRU may receive information indicating the MCS, code rate, decoding method, and/or target latency via RRC, MAC CE, and/or DCI.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, a first segment may include a first plurality of unfrozen bits which correspond to the input bit positions for the second polar encoding and/or a second partition may include a second plurality of unfrozen bits which correspond to the input (e.g., unfrozen) bit positions for the second polar encoding which are different than the bit positions of the first and/or second segments. For example, the CRC bits may be placed at head unfrozen bit positions for the second polar encoding. As another example, a CRC bit may be calculated from one or multiple segments. An example of which is shown in FIG. 15.

In certain representative embodiments, a first CRC bit may be determined from a first segment of the input bits of the second polar encoding, and a second CRC bit may be determined from a second segment of the input bits of the second polar encoding.

In certain representative embodiments, the segments may include equal numbers of input bits. In certain other representative embodiments, the segments may include different numbers of input bits.

Figure 23:
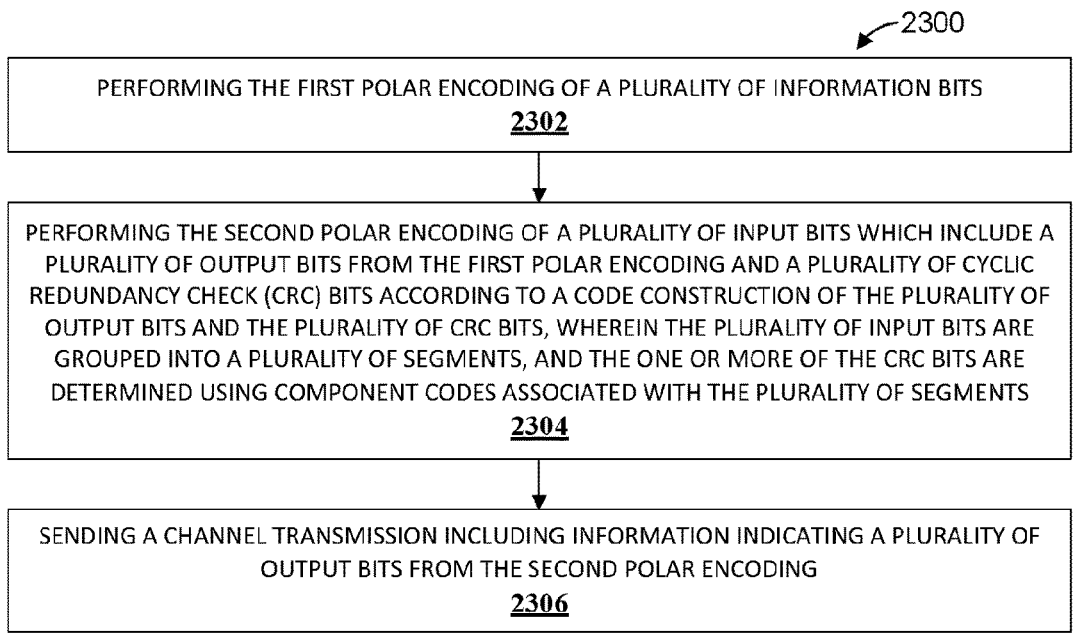
FIG. 23 is a diagram illustrating a representative procedure for systematic polar encoding of information bits and one or more CRC bits using segmentation and component codes.

FIG. 23 is a diagram illustrating a representative procedure 2300 for systematic polar encoding of information bits and one or more CRC bits using segmentation and component codes. At 2302, a WTRU 102 may perform a first polar encoding of a plurality of information bits. For example, the first polar encoding at 2302 may be performed using a non-systematic polar encoder such as those described herein and/or known to those skilled in the art. At 2304, the WTRU 102 may proceed to perform a second polar encoding of a plurality of input bits which include a plurality of output bits from the first polar encoding and a plurality of cyclic redundancy check (CRC) bits according to a code construction of the plurality of output bits and the plurality of CRC bits. For example, the plurality of input bits may be grouped into a plurality of segments. One or more of the CRC bits may be determined using component codes associated with the plurality of segments. At 2306, the WTRU 102 may send (e.g., to a base station or another WTRU 102) a channel transmission including information indicating a plurality of output bits from the second polar encoding of 2304.

In certain representative embodiments, In certain representative embodiments, the WTRU 102 may determine the code construction from among a plurality of code constructions using any of any of a modulation and coding scheme (MCS), a code rate, a decoding method, and/or a target latency associated with the channel transmission. For example, the WTRU may receive information indicating the MCS, code rate, decoding method, and/or target latency via RRC, MAC CE, and/or DCI.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, a first segment may include a first plurality of unfrozen bits which correspond to the input bit positions for the second polar encoding and/or a second partition may include a second plurality of unfrozen bits which correspond to the input (e.g., unfrozen) bit positions for the second polar encoding which are different than the bit positions of the first and/or second segments. For example, the CRC bits may be placed at head unfrozen bit positions for the second polar encoding. As another example, a CRC bit may be calculated from one or multiple segments. An example of which is shown in FIG. 16.

In certain representative embodiments, a first CRC bit may be determined from a first segment of the input bits of the second polar encoding, and a second CRC bit may be determined from a second segment of the input bits of the second polar encoding.

In certain representative embodiments, at least one of the CRC bits may be determined using a plurality of output bits of one or more component polar codes of the second polar encoding. For example, the one or more component polar codes may be associated with any of the MCS, code rate, decoding method, and/or target latency associated with the channel transmission.

In certain representative embodiments, the one or more component polar codes may include any of a full-rate component polar code, a zero-rate component polar code, a repetition component polar code, and/or a single parity check component polar code. For example, a code rate of a full-rate component polar code may be one as described herein. For example, a code rate of a zero-rate component polar code may be zero as described herein. For example, a repetition component polar code may include a single information bit, a code rate of the repetition component polar code may be $1/N_v$, and $N_v$ is a length (e.g., number of bits) of the repetition component polar code. For example, a single parity check component polar code may include a single parity check bit, a code rate of the single parity check component polar code may be $(N_v-1)/N_v$, and $N_v$ is a length of the repetition component polar code.

In certain representative embodiments, the code rate of a component polar code may be a ratio of (1) a number of the information bits or unfrozen bits of the one of the component polar codes to (2) a number of frozen bits of the component polar code.

In certain representative embodiments, the WTRU 102 may determine one or more groups of the plurality of output bits of the component polar codes based on a timing index of the plurality of output bits. The WTRU 102 may determine the one or more CRC bits from the determined one or more groups. For example, at least one of the CRC bits may be determined from two or more of the output bits which are associated with different timing indices of the polar encoding.

In certain representative embodiments, a first CRC bit may be determined from a first segment of the input bits of the second polar encoding, and a second CRC bit may be determined from a second segment of the input bits of the second polar encoding.

In certain representative embodiments, at least one of the CRC bits may be determined from component polar codes of multiple segments.

In certain representative embodiments, the segments may include equal numbers of input bits. In certain other representative embodiments, the segments may include different numbers of input bits.

Figure 24:
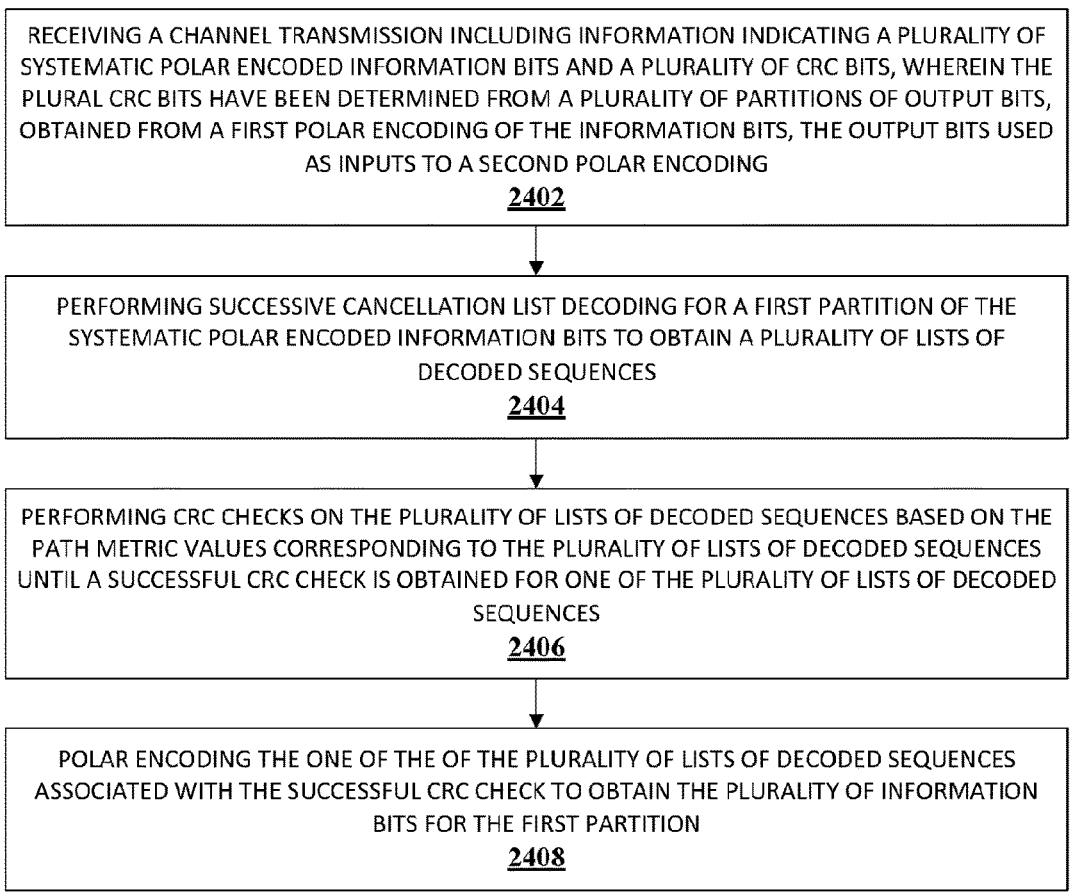
FIG. 24 is a diagram illustrating a representative procedure for decoding of systematic polar encoded information bits using partitioning and a plurality of CRC bits.

FIG. 24 is a diagram illustrating a representative procedure 2400 for decoding of systematic polar encoded information bits using partitioning and a plurality of CRC bits. At 2402, a WTRU 102 may receive (e.g., from a base station or another WTRU 102) a channel transmission including information indicating a plurality of systematic polar encoded information bits and a plurality of CRC bits. For example, the plural CRC bits may (e.g., be presumed to) have been determined from a plurality of partitions of output bits. The output bits may have been obtained from a first polar encoding of the information bits and the output bits used as inputs to a second polar encoding to generate the systematic polar encoded bits (e.g., information bits and CRC bits). At 2404, the WTRU 102 may perform successive cancellation list decoding for any (e.g., a first) partition of the systematic polar encoded information bits to obtain a plurality of lists of decoded sequences (e.g., for the partition). At 2406, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences. At 2408, the WTRU 102 may polar encode the one of the of the plurality of lists of decoded sequences associated with the successful CRC check to obtain the plurality of information bits for the first partition.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, the input bits to the second polar encoding may be configured as described herein. For example, a first partition may include a first plurality of frozen and unfrozen bits which correspond to the input bit positions for the second polar encoding and/or a second partition may include a second plurality of unfrozen bits which correspond to the input bit positions for the second polar encoding. For example, any of the first partition and/or the second partition may include one or more of the CRC bits. As another example, a CRC bit in one partition may be calculated from bits of another partition.

Figure 25:
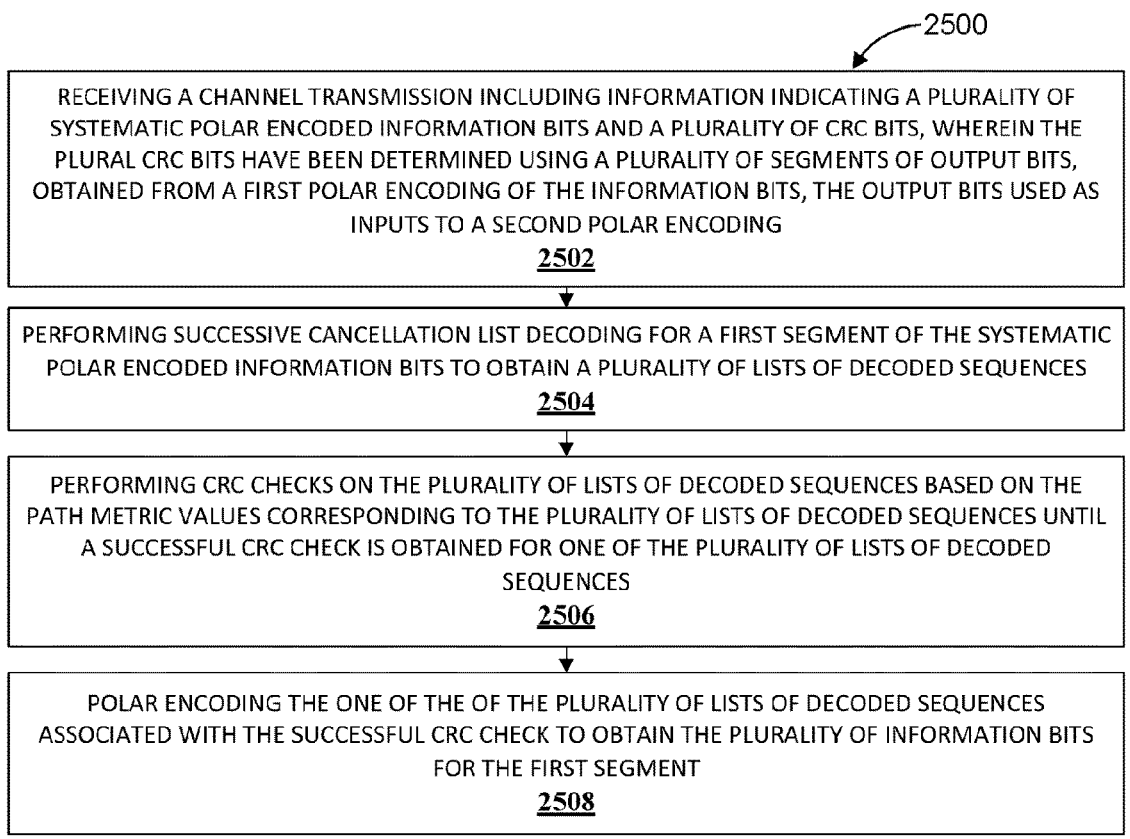
FIG. 25 is a diagram illustrating a representative procedure for decoding of systematic polar encoded information bits using segmentation and a plurality of CRC bits.

FIG. 25 is a diagram illustrating a representative procedure for decoding of systematic polar encoded information bits using segmentation and a plurality of CRC bits. At 2502, a WTRU 102 may receive (e.g., from a base station or another WTRU 102) a channel transmission including information indicating a plurality of systematic polar encoded information bits and a plurality of CRC bits. For example, the plural CRC bits may (e.g., presumed to) have been determined using a plurality of segments of output bits. The output bits may have been obtained from a first polar encoding of the information bits and the output bits used as inputs to a second polar encoding to generate the systematic polar encoded bits (e.g., information bits and CRC bits). At 2504, the WTRU 102 may perform successive cancellation list decoding for any (e.g., a first) segment of the systematic polar encoded information bits to obtain a plurality of lists of decoded sequences. At 2506, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences. At 2508, the WTRU may polar encode the one of the of the plurality of lists of decoded sequences associated with the successful CRC check to obtain the plurality of information bits for the first segment.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, the input bits to the second polar encoding may be configured as described herein. For example, a first segment may include a first plurality of unfrozen bits which correspond to the input bit positions for the second polar encoding and/or a second segment may include a second plurality of unfrozen bits which correspond to the input bit positions for the second polar encoding. For example, the CRC bits may input to the polar encoder at head unfrozen bit positions of the second polar encoder as described herein.

Figure 26:
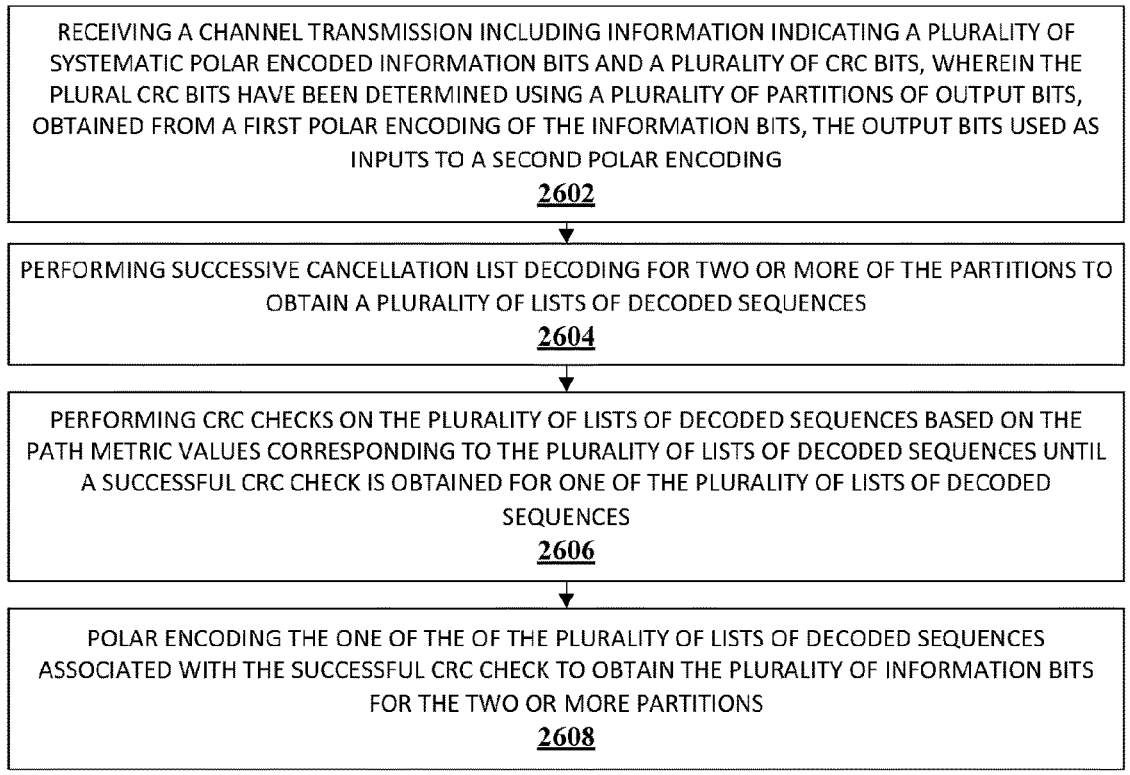
FIG. 26 is a diagram illustrating another representative procedure for decoding of systematic polar encoded information bits using partitioning and a plurality of CRC bits.

FIG. 26 is a diagram illustrating another representative procedure for decoding of systematic polar encoded information bits using partitioning and a plurality of CRC bits. At 2602, a WTRU 102 may receive (e.g., from a base station or another WTRU 102) a channel transmission including information indicating a plurality of systematic polar encoded information bits and a plurality of CRC bits. For example, the plural CRC bits may (e.g., be presumed to) have been determined from a plurality of partitions of output bits. The output bits may have been obtained from a first polar encoding of the information bits and the output bits used as inputs to a second polar encoding to generate the systematic polar encoded bits (e.g., information bits and CRC bits). At 2604, the WTRU 102 may perform successive cancellation list decoding for two or more of the partitions to obtain a plurality of lists of decoded sequences. At 2606, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences. At 2608, the WTRU 102 may perform polar encoding the one of the of the plurality of lists of decoded sequences associated with the successful CRC check to obtain the plurality of information bits for the two or more partitions.

In certain representative embodiments, the WTRU 102 may receive information indicating the code construction and/or determine the code construction. For example, the code construction may include a plurality of frozen bits and a plurality of unfrozen bits which correspond to input bit positions for the first and/or second polar encoding. For example, the plurality of unfrozen bits may include the plurality of information bits and the one or more CRC bits.

In certain representative embodiments, the input bits to the second polar encoding may be configured as described herein. For example, a first partition may include a first plurality of frozen and unfrozen bits which correspond to the input bit positions for the second polar encoding and/or a second partition may include a second plurality of unfrozen bits which correspond to the input bit positions for the second polar encoding. For example, any of the first partition and/or the second partition may include one or more of the CRC bits. As another example, a CRC bit in one partition may be calculated from bits of another partition.

Figure 27:
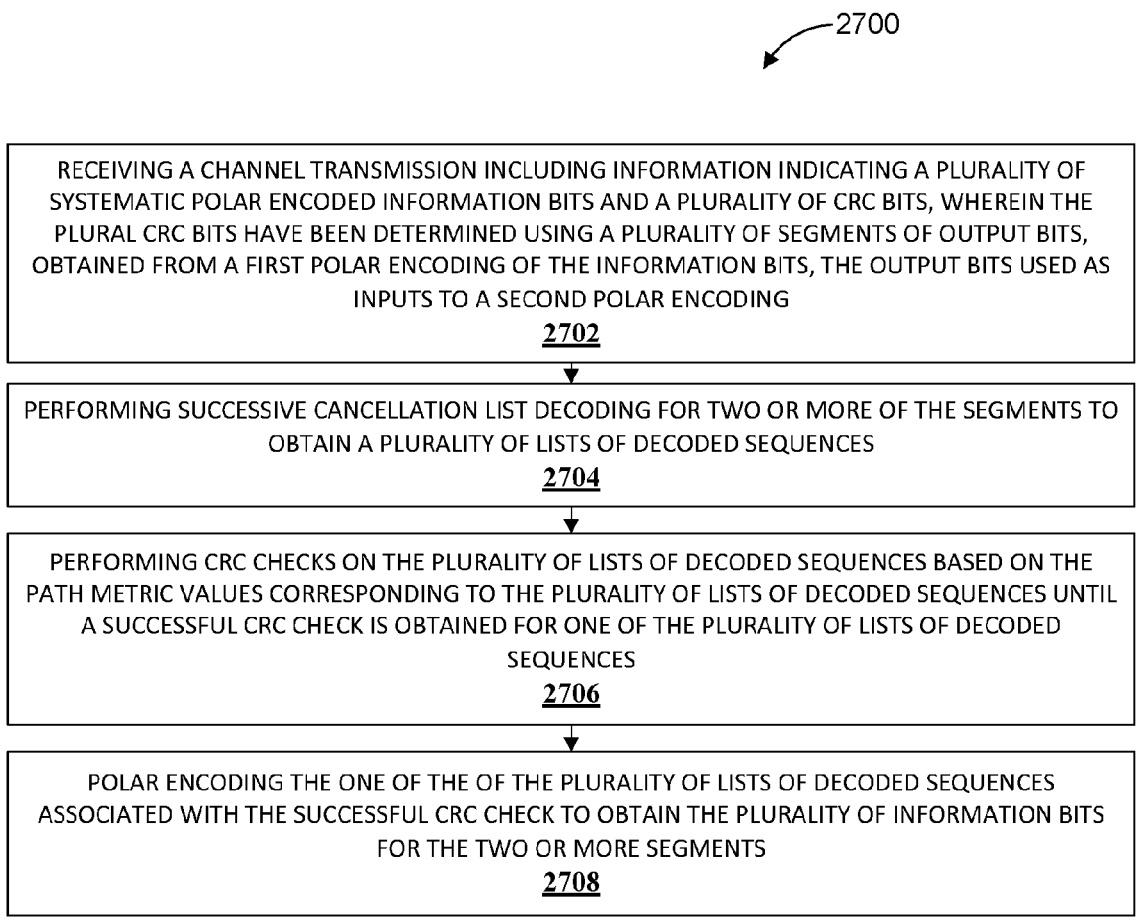
FIG. 27 is a diagram illustrating another representative procedure for decoding of systematic polar encoded information bits using segmentation and a plurality of CRC bits.

FIG. 27 is a diagram illustrating another representative procedure for decoding of systematic polar encoded information bits using segmentation and a plurality of CRC bits. At 2702, a WTRU 102 may receive (e.g., from a base station or another WTRU 102) a channel transmission including information indicating a plurality of systematic polar encoded information bits and a plurality of CRC bits. For example, the plural CRC bits may (e.g., be presumed to) have been determined using a plurality of segments of output bits. The output bits may have been obtained from a first polar encoding of the information bits and the output bits may have been used (e.g., at the encoder side) as inputs to a second polar encoding to generate the systematic polar encoded bits (e.g., information bits and CRC bits). At 2704, the WTRU 102 may perform successive cancellation list decoding for two or more of the segments to obtain a plurality of lists of decoded sequences. At 2706, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences (e.g., corresponding to the two or more segments). At 2708, the WTRU may polar encode the one of the of the plurality of lists of decoded sequences associated with the successful CRC check to obtain the plurality of information bits for the two or more segments.

Figure 28:
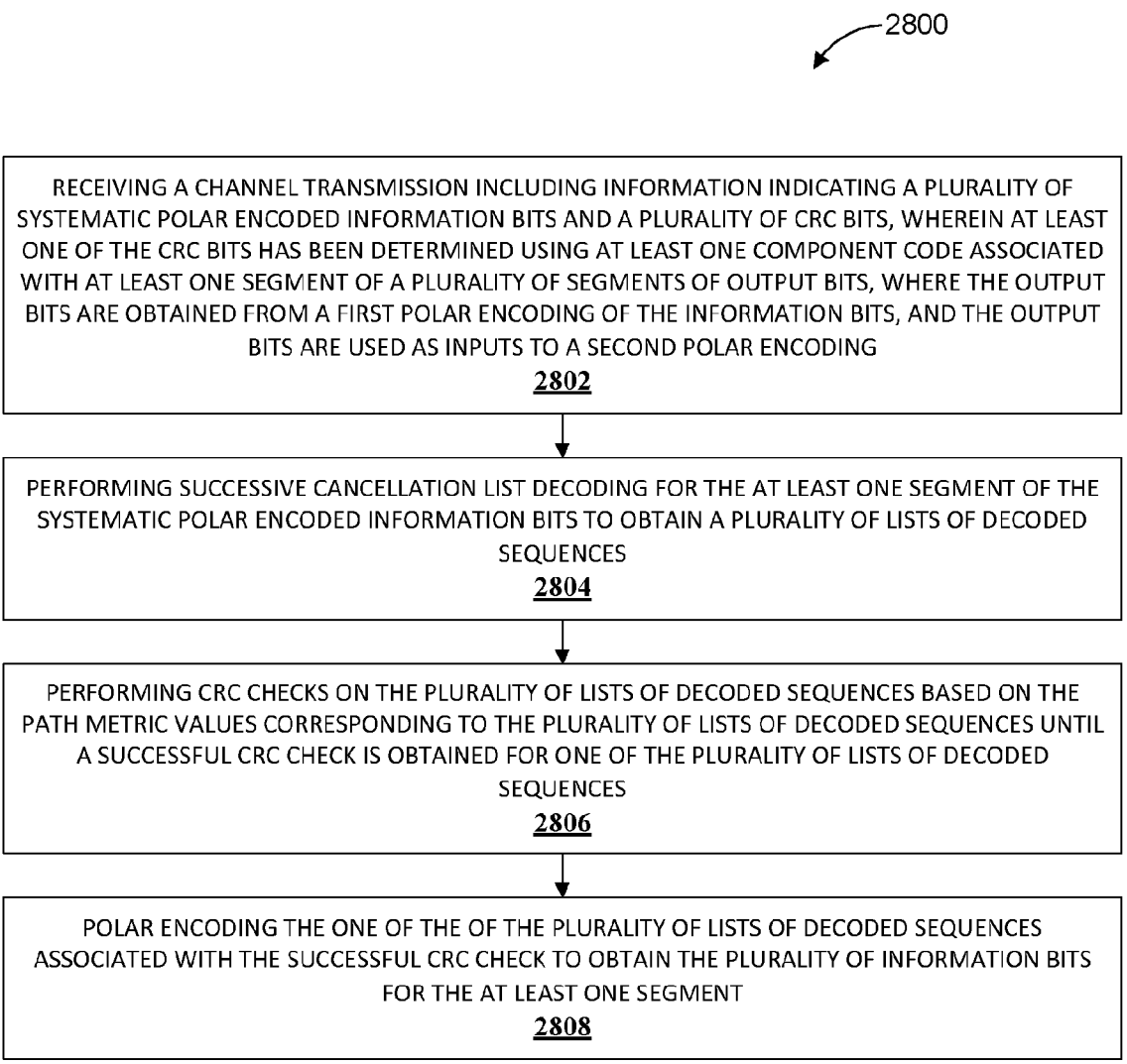
FIG. 28 is a diagram illustrating another representative procedure for decoding of systematic polar encoded information bits using segmentation and a plurality of CRC bits having at least one CRC bit determined from at least one component code.

In certain representative embodiments,

FIG. 28 is a diagram illustrating another representative procedure for decoding of systematic polar encoded information bits using segmentation and a plurality of CRC bits having at least one CRC bit determined from at least one component code. At 2802, a WTRU 102 may receive (e.g., from a base station or another WTRU 102) a channel transmission including information indicating a plurality of systematic polar encoded information bits and a plurality of CRC bits. For example, at least one of the plural CRC bits may (e.g., be presumed to) have been determined using at least once component polar code associated with at least one segment of a plurality of segments of output bits. The output bits may have been obtained from a first polar encoding of the information bits and the output bits may have been used (e.g., at the encoder side) as inputs to a second polar encoding to generate the systematic polar encoded bits (e.g., information bits and CRC bits). At 2804, the WTRU 102 may perform successive cancellation list decoding for the at least one segment of the systematic polar encoded information bits to obtain a plurality of lists of decoded sequences. At 2806, the WTRU 102 may perform CRC checks on the plurality of lists of decoded sequences based on (e.g., in increasing order of) the path metric values corresponding to the plurality of lists of decoded sequences until a successful CRC check is obtained for one of the plurality of lists of decoded sequences. At 2808, the WTRU may polar encode the one of the of the plurality of lists of decoded sequences associated with the successful CRC check to obtain the plurality of information bits for the at least one segment. In certain representative embodiments, a polar encoding method implemented by a WTRU may include determining a plurality of encoded bits which correspond to one or more component polar codes according to a plurality of input bits which are to be encoded. The WTRU may calculate one or more cyclic redundancy check (CRC) bits based on the plurality of encoded bits which correspond to the one or more component polar codes. After, the WTRU may perform polar encoding of the plurality of encoded bits and the one or more CRC bits.

For example, the WTRU may select the one or more component polar codes based on any of a modulation coding scheme (MCS) level, a component polar code type, a polar decoding method, an encoding depth of the component polar codes, and/or a decoding depth of a polar code generated by the polar encoding.

For example, the one or more component polar codes include any of a full-rate component polar code, a zero-rate component polar code, a repetition component polar code, a single parity check (SPC) component polar code, and/or an intermediate-rate component polar code.

For example, the WTRU may arrange the plurality of encoded bits which correspond to the one or more component polar codes into a plurality of groups based on respective encoding timing indices of the plurality of encoded bits. The WTRU may calculate the one or more CRC bits based on the plurality of groups of encoded bits which correspond to the one or more component polar codes.

For example, the polar encoding may be performed with the one or more CRC bits input at a header of a plurality of unfrozen bit positions and the plurality of encoded bits input at a remainder of the plurality of unfrozen bit positions.

For example, the WTRU may perform polar encoding of a plurality of information bits. The WTRU may determine the plurality of encoded bits which correspond to the one or more component polar codes according to the plurality of input bits which are to be encoded. The plurality of input bits correspond to an output of the polar encoding of the plurality of information bits.

For example, the polar encoding of the plurality of information bits may be a non-systematic polar encoding, and the polar encoding of the plurality of encoded bits and the one or more CRC bits may be a non-systematic polar encoding.

For example, an output of the polar encoding of the plurality of encoded bits and the one or more CRC bits may be a systematic polar code.

For example, an output of the polar encoding of the plurality of encoded bits and the one or more CRC bits may be a non-systematic polar code.

For example, the WTRU may divide the plurality of input bits which are to be encoded into a plurality of segments and/or partitions (e.g., groups). The determination of the plurality of encoded bits which correspond to one or more component polar codes may be according to the plurality of input bits which are to be encoded and belong to a respective one of the plurality of segments and/or partitions.

For example, the WTRU may receive information indicating a configuration of the one or more component polar codes.

For example, the WTRU may transmit and/or receive information indicating a configuration of the one or more component polar codes.

In certain representative embodiments, a polar decoding method may be implemented by a WTRU which includes receiving a transmission of a plurality of channel symbols and calculating a plurality of log-likelihood ratio (LLR) values from the plurality of received channel symbols. The WTRU may perform a fast list decoding based on the plurality of calculated LLR values to generate a plurality of lists of decoded sequences and a plurality of path metric values corresponding to the plurality of lists of decoded sequences. The WTRU may determine whether any one of the plurality of lists of decoded sequences satisfies a CRC check sequentially based on the plurality of path metric values corresponding to the plurality of lists of decoded sequences. On condition that a decoded sequence of one of the plurality of lists of decoded sequences satisfies the CRC check, the WTRU may output the decoded sequence.

For example, the WTRU may, upon condition that the decoded sequence of one of the lists of decoded sequences is the first decoded sequence which satisfies the CRC check, stop the determining of whether any one of the plurality of lists of decoded sequences satisfies the CRC check and output the decoded sequence.

For example, the WTRU may, upon condition that none of the lists of decoded sequences satisfies the CRC check, trigger a negative acknowledgment (NACK) for a HARQ process corresponding to the transmission.

For example, the WTRU may, upon condition that none of the lists of decoded sequences satisfies the CRC check, output a decoded sequence corresponding to one of the plurality of lists of decoded sequences which has a lowest one of the plurality of path metric values.

For example, the WTRU may perform polar encoding of the outputted decoded sequence corresponding to one of the plurality of lists of decoded sequences which has the lowest one of the plurality of path metric values. The output sequence of the polar encoding may correspond to decoded information of the transmission. For example, the WTRU may set parts of the outputted decoded sequence which correspond to frozen input bits to a fixed value before performing the polar decoding.

For example, the WTRU may polar encode the outputted decoded sequence of the one of the plurality of lists of decoded sequences which satisfies the CRC check. An output sequence of the polar encoding may correspond to decoded information of the transmission. For example, the WTRU may set parts of the outputted decoded sequence which correspond to frozen input bits to a fixed value before performing the polar decoding.

In certain representative embodiments, the WTRU may include a processor and a transceiver which are configured to perform the procedures described herein.

In certain representative embodiments, a NAP may include a processor and a transceiver which are configured to perform the procedures described herein.

In certain representative embodiments, a network element may be configured to perform the procedures described herein.

In certain representative embodiments, a non-transitory computer readable storage medium stores instructions that, when executed by a processing device, causes the processing device to perform at least part of the procedures described herein.

Systems and methods for processing data according to representative embodiments may be performed by one or more processors executing sequences of instructions contained in a memory device. Such instructions may be read into the memory device from other computer-readable mediums such as secondary data storage device(s). Execution of the sequences of instructions contained in the memory device causes the processor to operate, for example, as described above. In alternative embodiments, hard-wire circuitry may be used in place of or in combination with software instructions to implement the present invention. Such software may run on a processor which is housed within a vehicle and/or another mobile device remotely. In the later a case, data may be transferred via wireline or wirelessly between the vehicles or other mobile device.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed."

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits. It should be understood that the representative embodiments are not limited to the above-mentioned platforms or CPUs and that other platforms and CPUs may support the provided methods.

The data bits may also be maintained on a computer readable medium including magnetic disks, optical disks, and any other volatile (e.g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods. It should be understood that the representative embodiments are not limited to the above-mentioned platforms or CPUs and that other platforms and CPUs may support the provided methods.

In an illustrative embodiment, any of the operations, processes, etc. described herein may be implemented as computer-readable instructions stored on a computer-readable medium. The computer-readable instructions may be executed by a processor of a mobile unit, a network element, and/or any other computing device.

There is little distinction left between hardware and software implementations of aspects of systems. The use of hardware or software is generally (but not always, in that in certain contexts the choice between hardware and software may become significant) a design choice representing cost vs. efficiency tradeoffs. There may be various vehicles by which processes and/or systems and/or other technologies described herein may be affected (e.g., hardware, software, and/or firmware), and the preferred vehicle may vary with the context in which the processes and/or systems and/or other technologies are deployed. For example, if an implementer determines that speed and accuracy are paramount, the implementer may opt for a mainly hardware and/or firmware vehicle. If flexibility is paramount, the implementer may opt for a mainly software implementation. Alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs); Field Programmable Gate Arrays (FPGAs) circuits, any other type of integrated circuit (IC), and/or a state machine.

Although features and elements are provided above in particular combinations, one of ordinary skill in the art will appreciate that each feature or element can be used alone or in any combination with the other features and elements.

The present disclosure is not to be limited in terms of the particular embodiments described in this application, which are intended as illustrations of various aspects. Many modifications and variations may be made without departing from its spirit and scope, as will be apparent to those skilled in the art. No element, act, or instruction used in the description of the present application should be construed as critical or essential to the invention unless explicitly provided as such. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or systems.

It is also to be understood that the terminology used herein is for the purpose of describing particular embodiments only, and is not intended to be limiting. As used herein, when referred to herein, the terms "station" and its abbreviation "STA", "user equipment" and its abbreviation "UE" may mean (i) a wireless transmit and/or receive unit (WTRU), such as described infra; (ii) any of a number of embodiments of a WTRU, such as described infra; (iii) a wireless-capable and/or wired-capable (e.g., tetherable) device configured with, inter alia, some or all structures and functionality of a WTRU, such as described infra; (iii) a wireless-capable and/or wired-capable device configured with less than all structures and functionality of a WTRU, such as described infra; or (iv) the like. Details of an example WTRU, which may be representative of any UE recited herein, are provided below with respect to FIGS. 1A-1D.

In certain representative embodiments, several portions of the subject matter described herein may be implemented via Application Specific Integrated Circuits (ASICs), Field Programmable Gate Arrays (FPGAs), digital signal processors (DSPs), and/or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein may be distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc., and a transmission type medium such as a digital and/or an analog communication medium (e.g., a fiber optic cable, a waveguide, a wired communications link, a wireless communication link, etc.).

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality may be achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, where only one item is intended, the term "single" or similar language may be used. As an aid to understanding, the following appended claims and/or the descriptions herein may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"). The same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items. Moreover, as used herein, the term "set" or "group" is intended to include any number of items, including zero. Additionally, as used herein, the term "number" is intended to include any number, including zero.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like includes the number recited and refers to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Moreover, the claims should not be read as limited to the provided order or elements unless stated to that effect. In addition, use of the terms "means for" in any claim is intended to invoke 35 U.S.C. § 112, ¶ 6 or means-plus-function claim format, and any claim without the terms "means for" is not so intended.

A processor in association with software may be used to implement a radio frequency transceiver for use in a wireless transmit receive unit (WTRU), user equipment (UE), terminal, base station, Mobility Management Entity (MME) or Evolved Packet Core (EPC), or any host computer. The WTRU may be used m conjunction with modules, implemented in hardware and/or software including a Software Defined Radio (SDR), and other components such as a camera, a video camera module, a videophone, a speakerphone, a vibration device, a speaker, a microphone, a television transceiver, a hands free headset, a keyboard, a Bluetooth® module, a frequency modulated (FM) radio unit, a Near Field Communication (NFC) Module, a liquid crystal display (LCD) display unit, an organic light-emitting diode (OLED) display unit, a digital music player, a media player, a video game player module, an Internet browser, and/or any Wireless Local Area Network (WLAN) or Ultra Wide Band (UWB) module.

Throughout the disclosure, one of skill understands that certain representative embodiments may be used in the alternative or in combination with other representative embodiments.

In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method implemented by a wireless transmit/receive unit (WTRU), the method comprising:
    polar encoding a plurality of information bits and one or more cyclic redundancy check (CRC) bits, wherein the polar encoding is performed according to a code construction of the plurality of information bits and the one or more CRC bits, and wherein the one or more CRC bits are determined using a plurality of output bits of one or more component polar codes of the polar encoding; and
    sending a transmission including information indicating the polar encoded information bits and the polar encoded one or more CRC bits.

2. The method of claim 1, further comprising:
    determining the code construction from among a plurality of code constructions using any of any of a modulation and coding scheme (MCS), a code rate, a decoding method, and/or a target latency associated with the transmission.

3. The method of claim 1, wherein the code construction includes a plurality of frozen bits and a plurality of unfrozen bits which correspond to input bit positions for the polar encoding, and wherein the plurality of unfrozen bits include the plurality of information bits and the one or more CRC bits.

4. The method of claim 3, wherein the plurality of output bits of the one or more component polar codes are associated with the polar encoding of one or more of the plurality of information bits and/or one or more of the frozen bits.

5. The method of claim 1, wherein the one or more component polar codes include any of a full-rate component polar code, a zero-rate component polar code, a repetition component polar code, and/or a single parity check component polar code.

6. The method of claim 5, wherein the repetition component polar code includes a single information bit, a code rate of the repetition component polar code is $$\frac{1}{N_v},$$

and $N_v$ is a length of the repetition component polar code.

7. The method of claim 5, wherein the single parity check component polar code includes a single parity check bit, a code rate of the single parity check component polar code is $$\frac{N_v - 1}{N_v},$$

and $N_v$ is a length of the repetition component polar code.

8. The method of claim 1, further comprising:
determining one or more groups of the plurality of output bits of the component polar codes based on a timing index of the plurality of output bits; and
determining the one or more CRC bits from the determined one or more groups.

9. The method of claim 1, wherein at least one of the CRC bits is determined from two or more of the output bits which are associated with different timing indices of the polar encoding.

10. The method of claim 1, wherein a first one of the CRC bits is determined from a first set of the output bits of the one or more component polar codes having a first code rate, and a second one of the CRC bits is determined from a second set of the output bits of the one or more component polar codes having a second code rate different than the first code rate.

11. A wireless transmit/receive unit (WTRU) comprising:
a processor, a memory, and a transceiver which are configured to:
polar encode a plurality of information bits and one or more cyclic redundancy check (CRC) bits, wherein the polar encoding is performed according to a code construction of the plurality of information bits and the one or more CRC bits, wherein the one or more CRC bits are determined using a plurality of output bits of one or more component polar codes of the polar encoding, and
send a transmission including information indicating the polar encoded information bits and the polar encoded one or more CRC bits.

12. The WTRU of claim 11, wherein the processor, the memory, and the transceiver are configured to:
determine the code construction from among a plurality of code constructions using any of any of a modulation and coding scheme (MCS), a code rate, a decoding method, and/or a target latency associated with the transmission.

13. The WTRU of claim 11, wherein the code construction includes a plurality of frozen bits and a plurality of unfrozen bits which correspond to input bit positions for the polar encoding, and wherein the plurality of unfrozen bits include the plurality of information bits and the one or more CRC bits.

14. The WTRU of claim 13, wherein the plurality of output bits of the one or more component polar codes are associated with the polar encoding of one or more of the plurality of information bits and/or one or more of the frozen bits.

15. The WTRU of claim 11, wherein the one or more component polar codes include any of a full-rate component polar code, a zero-rate component polar code, a repetition component polar code, and/or a single parity check component polar code.

16. The WTRU of claim 15, wherein the repetition component polar code includes a single information bit, a code rate of the repetition component polar code is $$\frac{1}{N_v},$$

and $N_v$ is a length of the repetition component polar code.

17. The WTRU of claim 15, wherein the single parity check component polar code includes a single parity check bit, a code rate of the single parity check component polar code is $$\frac{N_v - 1}{N_v},$$

and $N_v$ is a length of the repetition component polar code.

18. The WTRU of claim 11, wherein the processor, the memory, and the transceiver are configured to:
determine one or more groups of the plurality of output bits of the component polar codes based on a timing index of the plurality of output bits, and
determine the one or more CRC bits from the one or more determined groups.

19. The WTRU of claim 11, wherein at least one of the CRC bits is determined from two or more of the output bits which are associated with different timing indices of the polar encoding.

20. The WTRU of claim 11, wherein a first one of the CRC bits is determined from a first set of the output bits of the one or more component polar codes having a first code rate, and a second one of the CRC bits is determined from a second set of the output bits of the one or more component polar codes having a second code rate different than the second code rate.

* * * * *